United States Patent
Graves

(10) Patent No.: US 9,983,403 B2
(45) Date of Patent: May 29, 2018

(54) DEVICE AND METHOD FOR MICRO-ELECTRO-MECHANICAL-SYSTEM PHOTONIC SWITCH

(71) Applicant: Huawei Technologies Co., Ltd., Shenzhen (CN)

(72) Inventor: Alan Frank Graves, Kanata (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 436 days.

(21) Appl. No.: 14/506,413

(22) Filed: Oct. 3, 2014

(65) Prior Publication Data

US 2016/0097927 A1    Apr. 7, 2016

(51) Int. Cl.

| G02B 26/00 | (2006.01) |
| G02B 26/08 | (2006.01) |
| B81B 7/00 | (2006.01) |
| B81B 7/02 | (2006.01) |
| G01D 5/30 | (2006.01) |

(52) U.S. Cl.
CPC .......... *G02B 26/0841* (2013.01); *B81B 7/008* (2013.01); *B81B 7/02* (2013.01); *G01D 5/30* (2013.01); *B81B 2201/045* (2013.01)

(58) Field of Classification Search
CPC .................................................. G02B 26/0841
USPC ......................................................... 359/295
See application file for complete search history.

(56) References Cited

U.S. PATENT DOCUMENTS

| 6,643,425 B1 * | 11/2003 | Bowers .................. G02B 6/359 |
| | | 359/223.1 |
| 2003/0086147 A1 | 5/2003 | Bruns |
| 2005/0031251 A1 | 2/2005 | Schroeder |
| 2005/0220394 A1 | 10/2005 | Yamamoto et al. |
| 2006/0066931 A1 | 3/2006 | Ogikubo et al. |
| 2015/0041629 A1 | 2/2015 | Graves et al. |
| 2015/0138623 A1 | 5/2015 | Graves et al. |
| 2015/0139585 A1 | 5/2015 | Graves et al. |

FOREIGN PATENT DOCUMENTS

| CN | 1677158 A | 10/2005 |
| CN | 1769945 A | 5/2006 |
| JP | 2003202418 A | 7/2003 |

OTHER PUBLICATIONS

International Search Report for Application No. PCT/CN2015/090785, dated Dec. 23, 2015, 17 pages.
"Damping," Wikipedia page, dowloaded Sep. 16, 2013, 7 pgs.

\* cited by examiner

*Primary Examiner* — James Jones
(74) *Attorney, Agent, or Firm* — Slater Matsil, LLP

(57) ABSTRACT

In one embodiment, a method of controlling a micro-electro-mechanical-system (MEMS) photonic switch includes applying a voltage to an electrode of an initial mirror of a first mirror array of the MEMS photonic switch and illuminating a control beam. The method also includes reflecting the control beam off the initial mirror to form a control beam spot on a second mirror array of the MEMS photonic switch and detecting an initial location of the control beam spot to produce an initial optical response. Additionally, the method includes adjusting the voltage in accordance with the initial optical response while the control beam spot has a nonzero velocity.

29 Claims, 53 Drawing Sheets

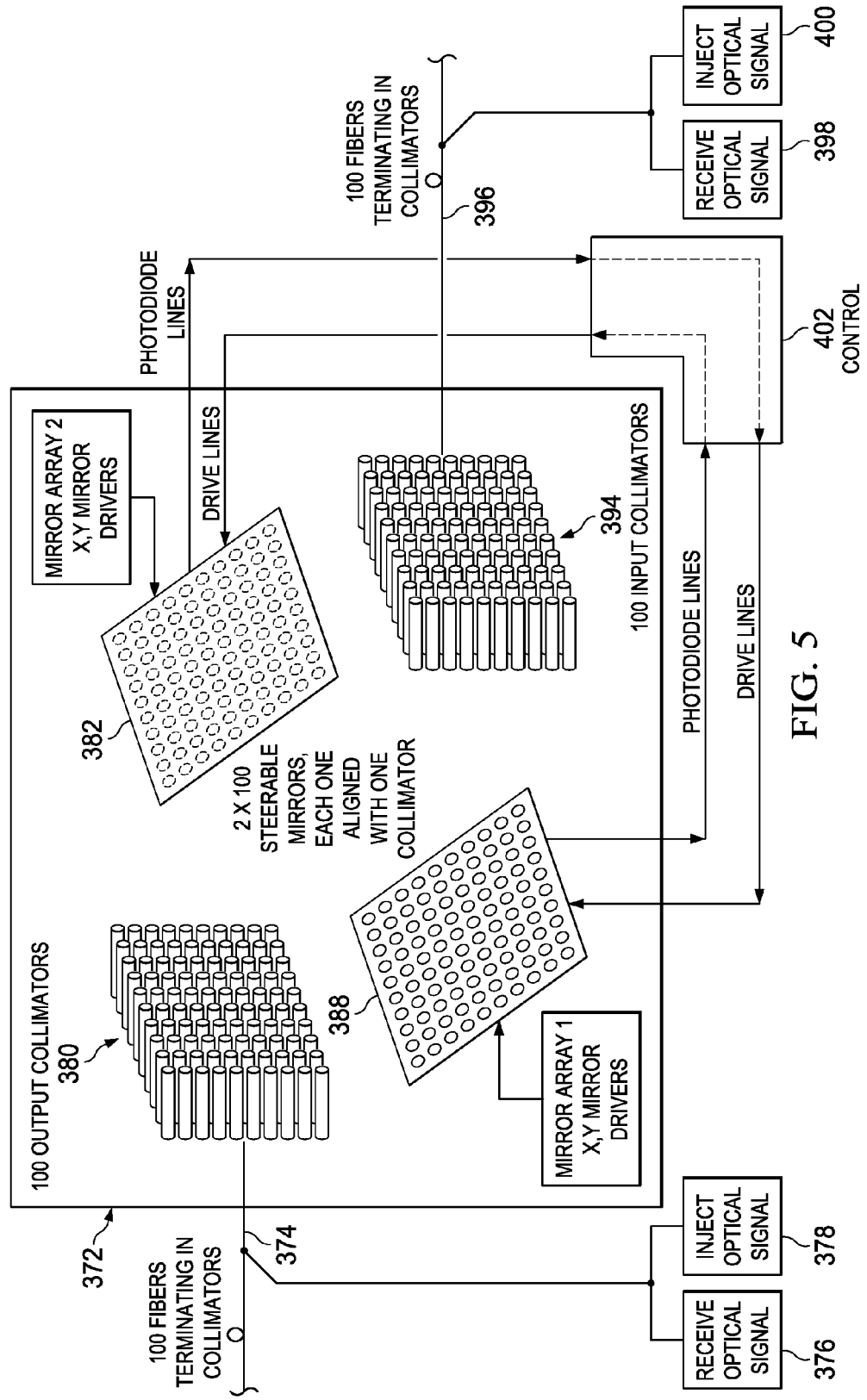

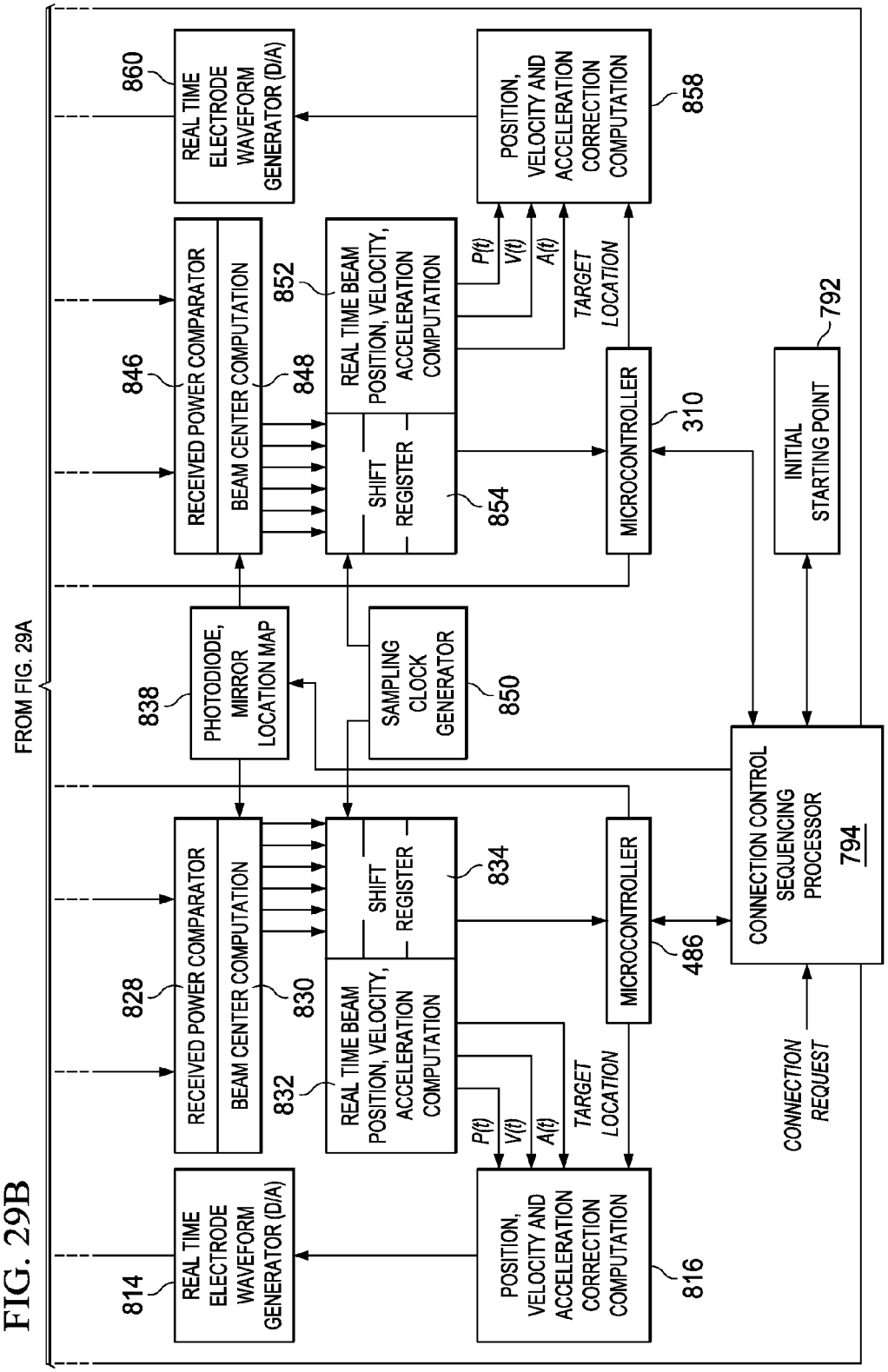

DEVICE AND METHOD FOR MICRO-ELECTRO-MECHANICAL-SYSTEM PHOTONIC SWITCH

TECHNICAL FIELD

The present invention relates to photonics, and, in particular, to a device and method for a micro-electro-mechanical-system (MEMS) photonic switch.

BACKGROUND

A type of photonic switch is a three dimensional (3D) micro-electro-mechanical-system (MEMS) photonic switch. MEMS photonic switches have excellent properties, such as the ability to achieve a high port count. Also, MEMS photonic switches have excellent optical properties, such as low loss, low polarization dependence, high linearity, and low noise. Additionally, MEMS photonic switches have excellent off-state properties, such as high isolation and low crosstalk.

However, MEMS photonic switches have some issues that limit their widespread use, such as slow switching speeds, driven by complex methods of control. This is especially problematic when MEMS photonic switches are used in a cascade configuration, such as in a three stage CLOS switch, or to set up a path transiting multiple nodes across a photonic switched network. Also, control methods may leave residual modulation introduced by the switch, which can interfere with the cascading of the switch.

SUMMARY

An embodiment method of controlling a micro-electro-mechanical-system (MEMS) photonic switch includes applying a voltage to one or more deflection electrodes of an initial mirror of a first mirror array of the MEMS photonic switch and illuminating a control beam. The method also includes reflecting the control beam off the initial mirror to form a control beam spot on a second mirror array of the MEMS photonic switch and detecting an initial location of the control beam spot to produce an initial optical response. Additionally, the method includes adjusting the voltage in accordance with the initial optical response while the control beam spot has a nonzero velocity.

An embodiment control system for a micro-electro-mechanical-system (MEMS) photonic switch includes a first processor and a first computer readable storage medium storing programming for execution by the processor. The programming includes instructions to receive a first plurality of responses from a first plurality of photodiodes on a surface of a first mirror array of the MEMS photonic switch and determine a present center of a first control beam spot on the first mirror array in accordance with the first plurality of responses. The programming also includes instructions to determine a present velocity of the first control beam spot in accordance with the present center of the first control beam spot and a previous center of the first control beam spot and determine a present acceleration of the first control beam spot in accordance with the present center of the first control beam spot and the previous center of the first control beam spot. Additionally, the programming also includes instructions to determine a first correction to a first mirror of a second mirror array of the MEMS photonic switch in accordance with the present center of the first control beam spot, the present velocity of the first control beam spot, and the present acceleration of the first control beam spot and adjust the first mirror in accordance with the first correction. The system also includes a first shift register configured to store the present center of the first control beam spot and the previous center of the first control beam spot.

Another embodiment method of controlling a micro-electro-mechanical-system (MEMS) photonic switch includes applying an acceleration voltage to an acceleration electrode of a mirror of a mirror array of the MEMS photonic switch and removing the acceleration voltage. The method also includes applying a deceleration voltage to a deceleration electrode of the mirror of the mirror array of the MEMS photonic switch after removing the acceleration voltage, where the deceleration electrode is opposite the acceleration electrode.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 5 illustrates an embodiment system with a MEMS mirror array with interstitial photodiodes;

FIGS. 29A-29B illustrate an embodiment control system for closed loop control of a MEMS mirror;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
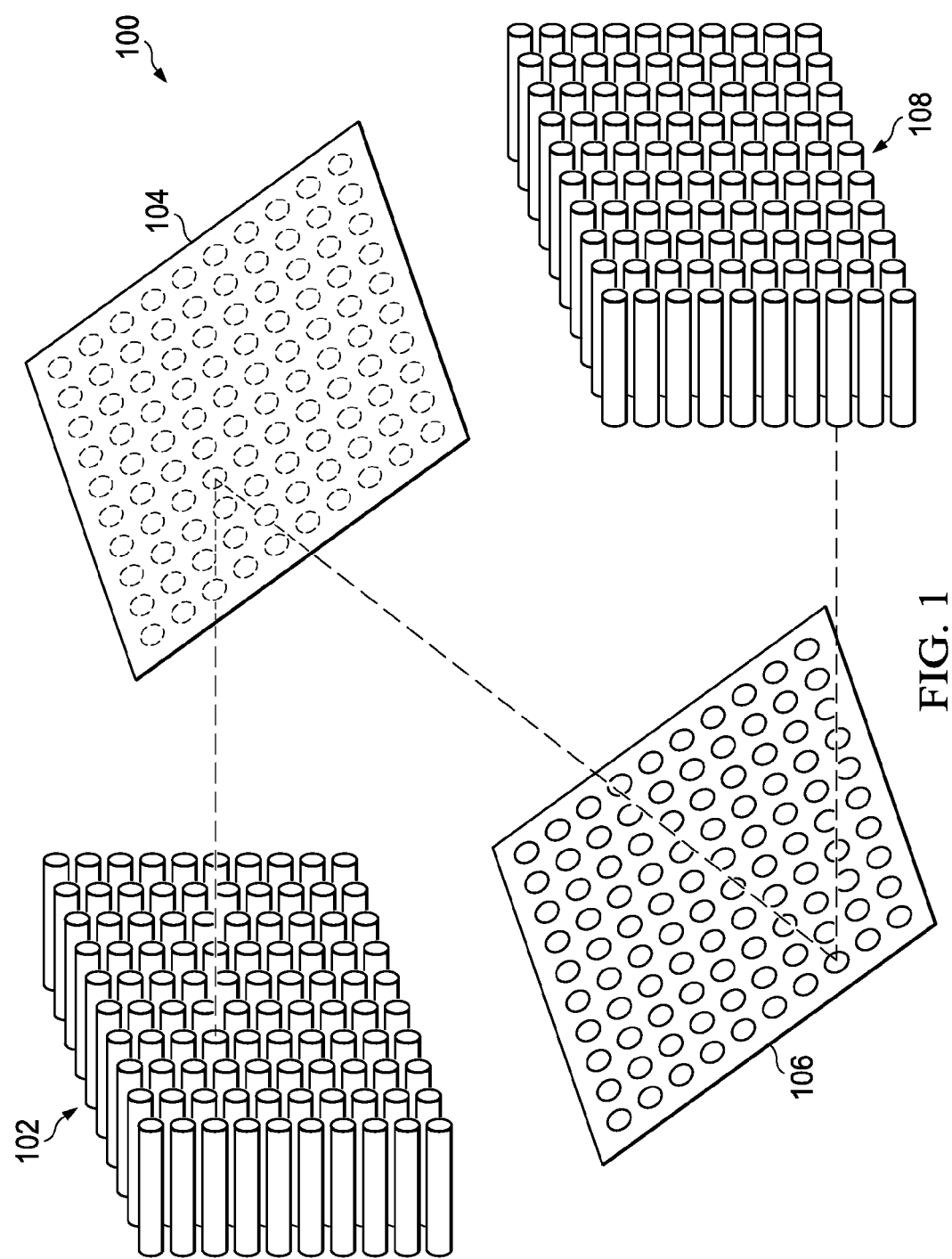
FIG. 1 illustrates an embodiment micro-electro-mechanical-system (MEMS) photonic switch.

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

In a MEMS photonic switch, mirrors have to be moved to configure an optical path. The MEMS mirrors, while small, have a finite mass, and are suspended on a gimbal arrangement which acts both as pivots and springs. In fact, the spring function stabilizes the MEMS mirrors by balancing the attractive force of the electrostatic drive. Excess kinetic energy in the interaction between the springs and the mirror mass results in the activation of mechanical resonances. Mirror drive voltages may be ramped slowly to avoid triggering these resonances, which significantly extends the set up time. Additionally, a spring-suspended mass, such as a MEMS mirror, is prone to mechanical excitation by vibration inputs, making the optical path through the switch prone to perturbation by vibration.

In an embodiment, the real time position, velocity, and acceleration of a MEMS mirror are deduced from the outputs of photodiodes integrated on a MEMS mirror array. Based on these measurements, real-time mirror control is implemented. The mirror position, velocity, and acceleration are continuously calculated from the changes in the photodiode signals. Correction drives are continuously and dynamically computed based on the actual real-time mirror responses, so the mirror is brought to a stationary state at the desired operating point. When there is a vibration induced perturbation that moves the mirror, the start of the movement is detected, and correction drive voltages are computed, to bring the mirror back to the correct angle with zero residual velocity, and hence no kinetic energy to excite the mechanical resonance. The correction drive voltages are dynamically adjusted by continuously tracking the mirror position through the reflected beam position and re-computing the residual correction required.

An embodiment facilitates a fast connection set up time. Additionally, vibration effects may be substantially suppressed, and the effects of the mechanical mirror mass-torsion spring mechanical resonance can be largely eliminated, resulting in a vibration-tolerant structure.

A three-dimensional (3D) MEMS photonic switch may use one or two arrays of steerable mirrors to form switchable optical paths between collimator arrays. When one mirror array is used, the mirror array is arranged opposite a static planar or near planar retro-reflective mirror. In this example, the control wavelength propagates in both directions through the photonic switch, illuminating only the photodiodes around the second steerable mirror encountered on each control carrier's path.

FIG. 1 illustrates MEMS photonic switch 100, a three dimensional (3D) MEMS photonic switch with two arrays of steerable mirrors. MEMS photonic switch 100 contains mirror arrays 104 and 106. Light enters via collimator array 102, for example from optical fibers, and impinges on mirrors of mirror array 104. Mirrors of mirror array 104 are adjusted in angle in two planes to cause the light to impinge on the appropriate mirrors of mirror array 106. The mirrors of mirror array 106 are associated with particular output ports of collimator array 108. Also, mirrors of mirror array 106 are adjusted in angle in two planes to cause coupling to the appropriate output port. The light then exits in a collimator of collimator array 108, for example coupling to optical fibers. Similarly, light enters collimator array 108, reflects off mirrors of mirror array 106, reflects off mirrors of mirror array 104, and exits through collimator array 102.

The mirror arrays have arrays of two-axis steerable 3D-MEMS mirrors (referred to here as MEMS mirrors) which reflect a beam projected onto them by an associated collimator. The reflected beam is then reflected on an opposing mirror on the opposing mirror array. Thus, an N×N MEMS photonic switching module contains N input mirrors, each of which can access any of N mirrors on the opposing mirror array, and vice versa. This enables the mirror count to grow linearly with the port count of the switch, utilizing 2N steerable mirrors for an N×N switch. For many other methods of building photonic switches, the mirror count or crosspoint count grows as the square of the port count. Thus, MEMS photonic switches are able to scale to a large port count, while some other approaches are limited by mirror count or crosspoint count. However, as the port count grows in a MEMS photonic switch, the suitable minimum optical path length between the mirrors and/or the suitable maximum mirror deflection angle increases.

Figure 2:
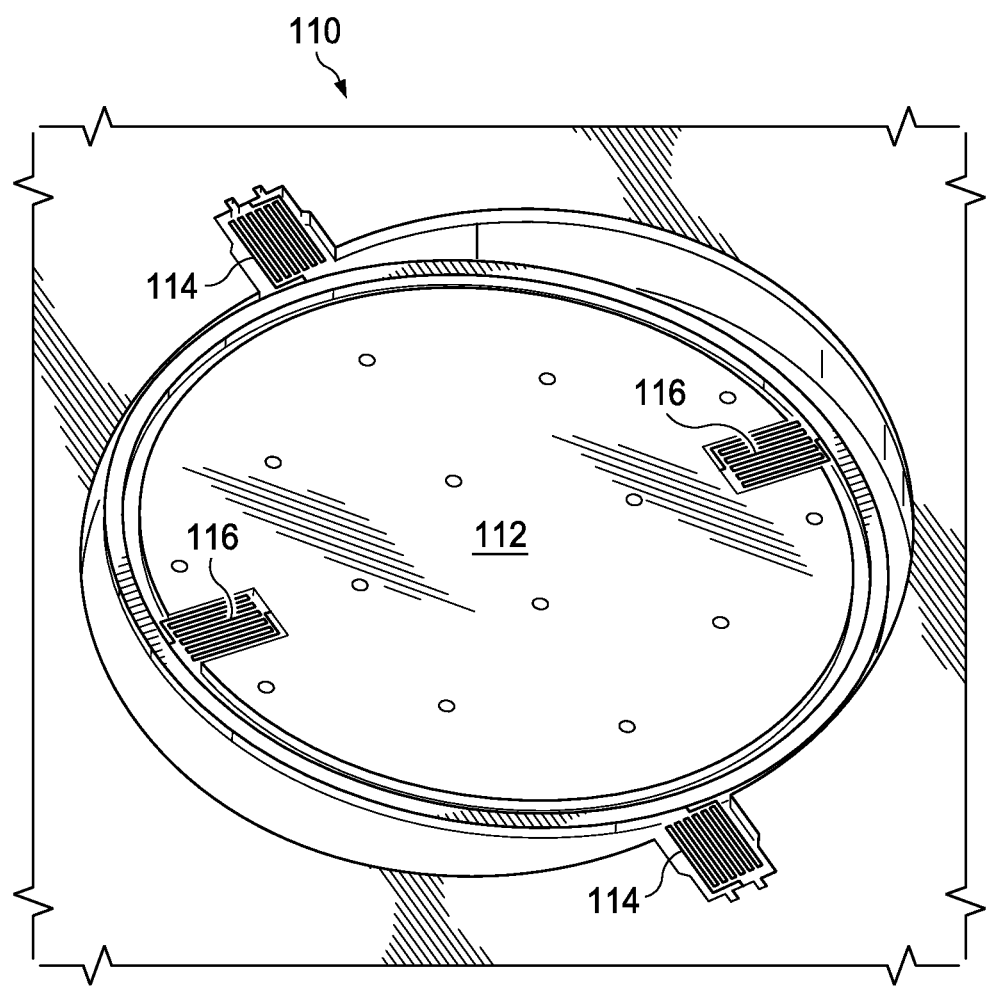
FIG. 2 illustrates an embodiment MEMS mirror structure.

The MEMS mirrors in MEMS photonic switch 100 are fabricated in a modified silicon wafer process. FIG. 2 illustrates an example MEMS mirror structure 110, which may have a diameter from about 550 µm to about 2.5 mm, for example around 1 mm. MEMS mirror structure 110 contains mirror 112 suspended on two axes of bearings 114 and 116 to allow it to tilt against the torsion spring actions of the bearings, which try to maintain mirror 112 in a particular position. Below mirror 112, from about 80 µm to 100 µm for a 1 mm mirror, are three or four segmented plate deflection electrodes. When four electrodes are used, each electrode may be associated with a mirror quadrant. When a voltage is applied to an electrode, mirror 112 is attracted towards that electrode by electrostatic attraction, and twists against the spring action of the silicon torsion springs. This deflection may be steered in both angular direction and magnitude by adjusting an applied drive voltage on one or more of the electrodes. Drive voltages may be up to a few hundred volts, with a maximum mirror deflection of five to seven degrees out-of-plane, for a maximum beam deviation of ten to fourteen degrees from the rest state, or a twenty to twenty eight degree peak to peak beam deviation.

Figure 3:
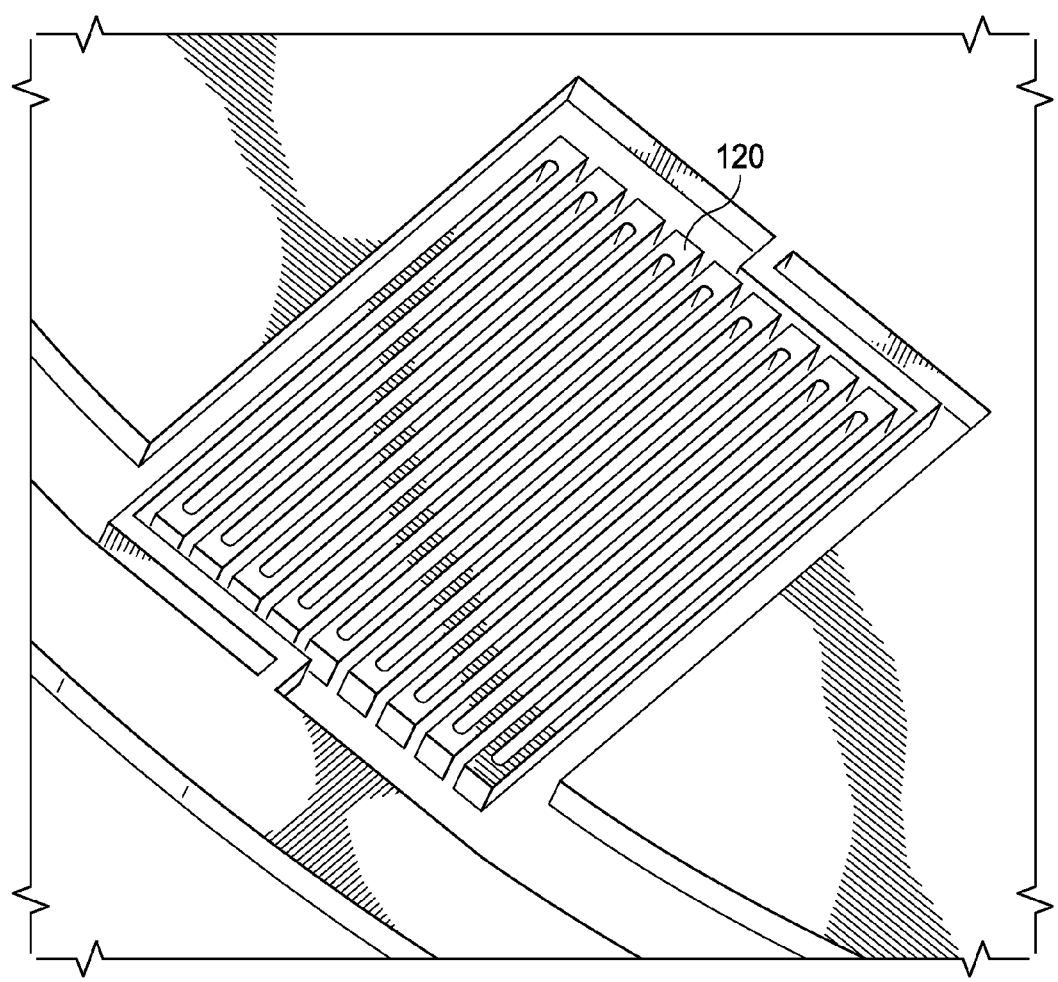
FIG. 3 illustrates an embodiment gimbal for MEMS mirrors.
Figure 4A:
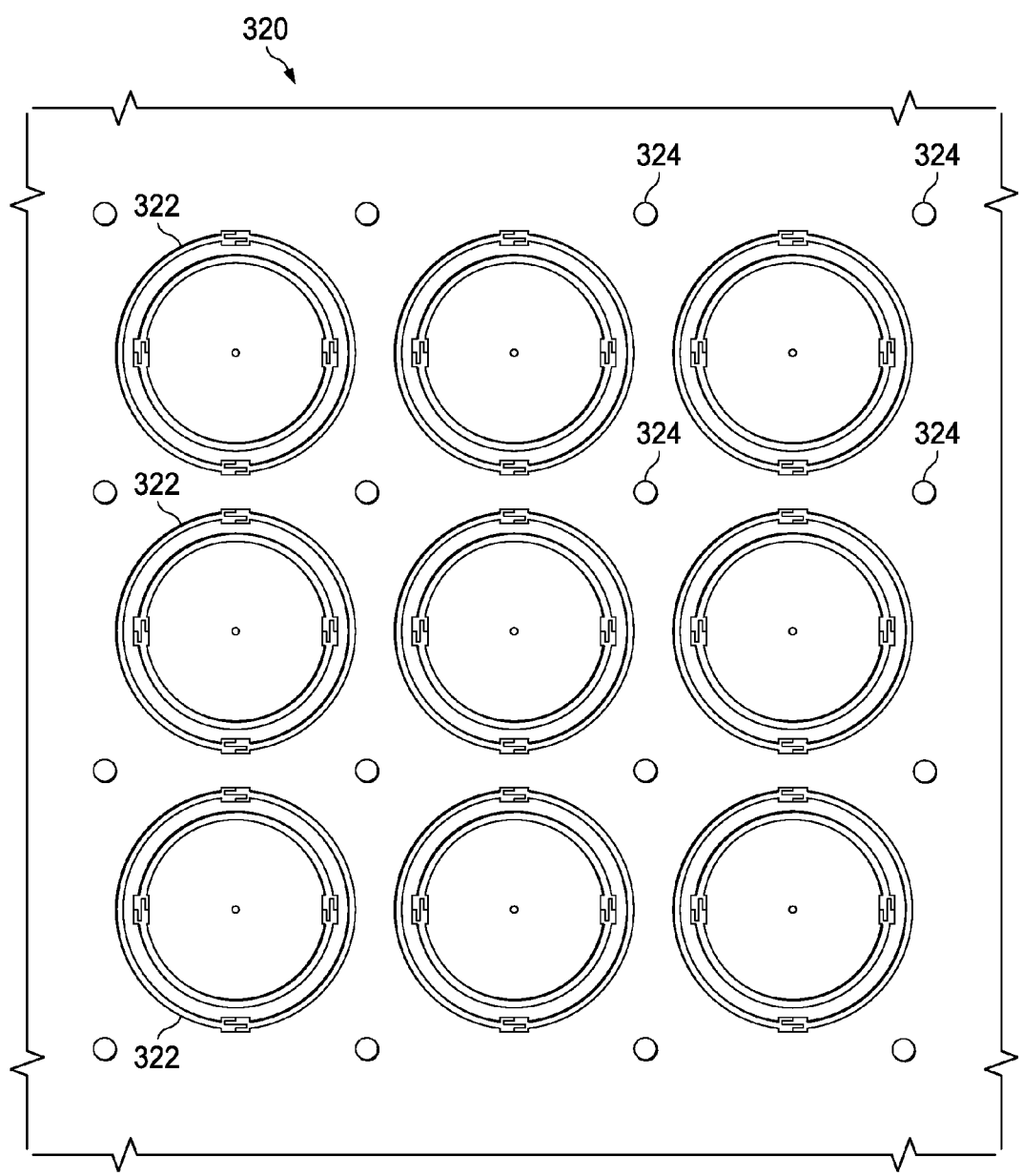
FIGS. 4A-4E illustrate embodiment MEMS mirror arrays with interstitial photodiodes.
Figure 4B:
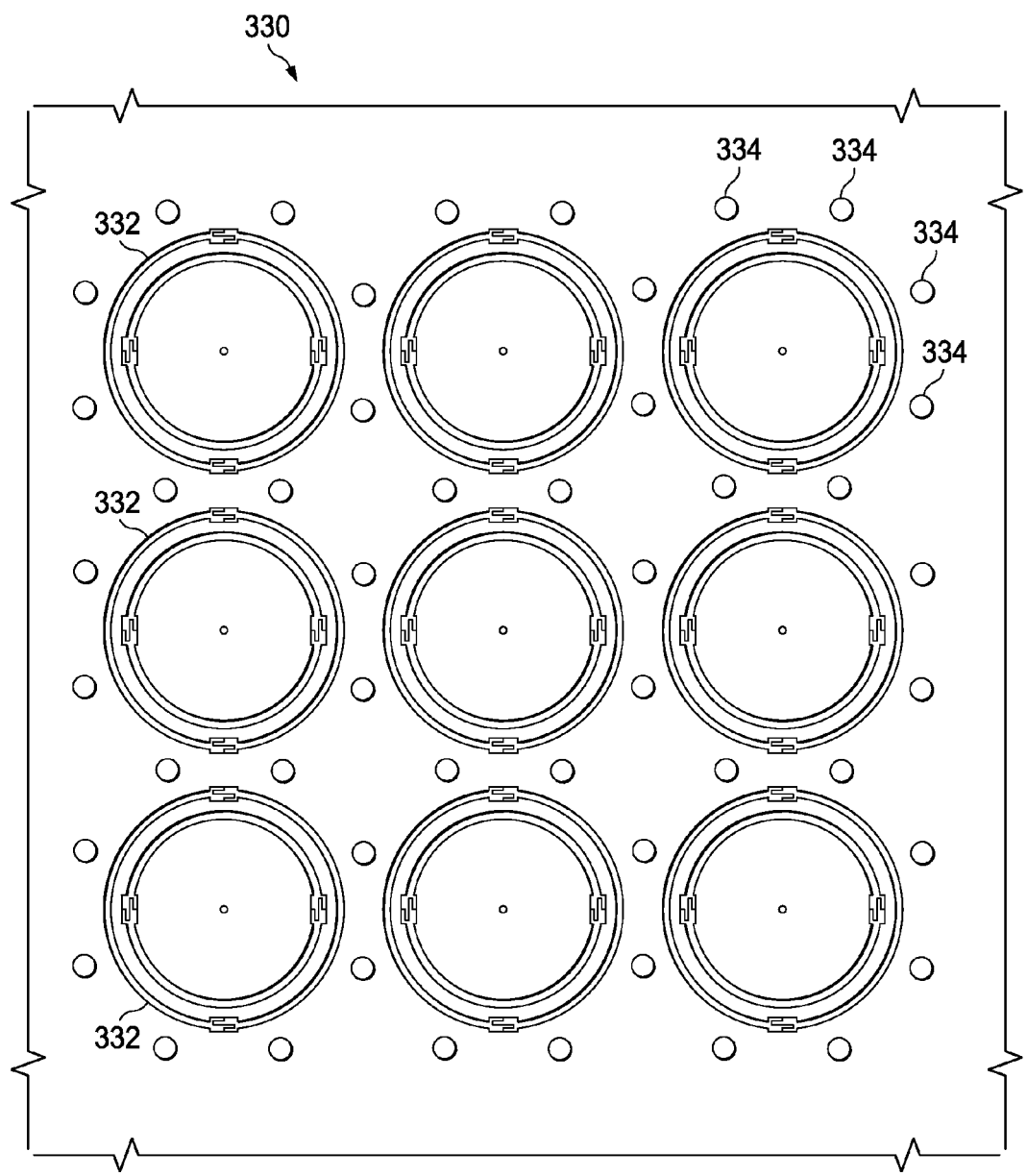
Figure 4C:
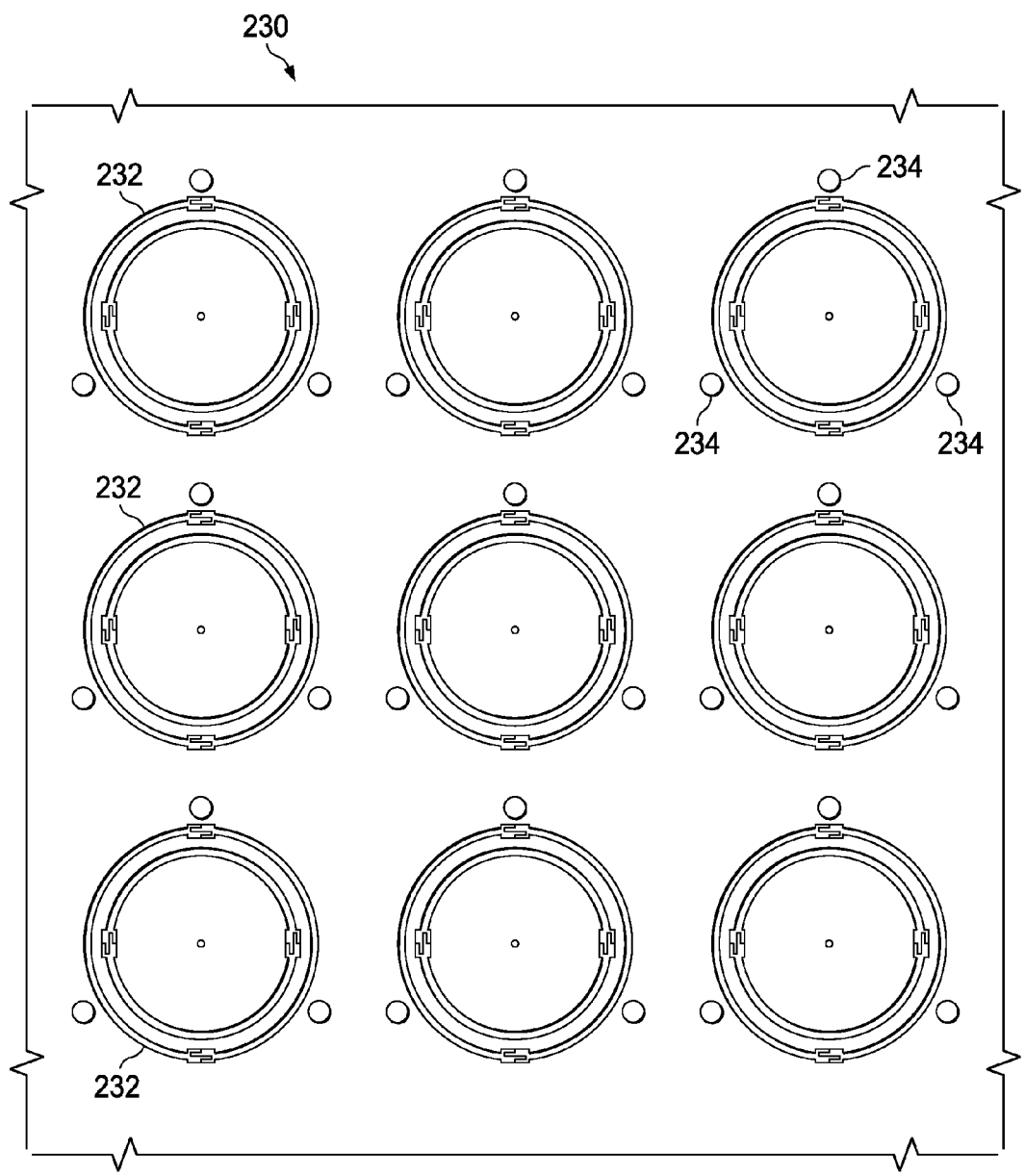
Figure 4D:
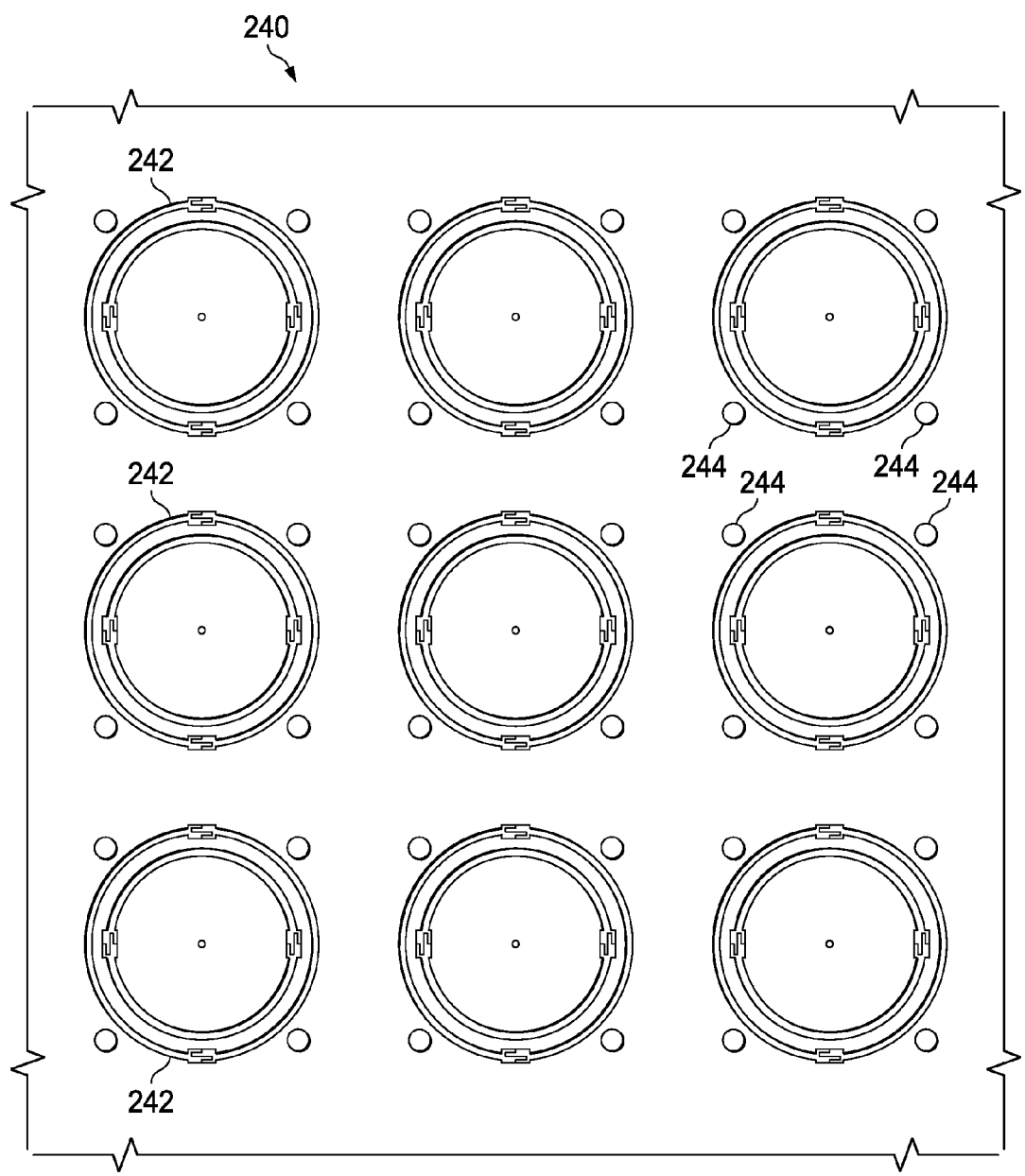
Figure 4E:
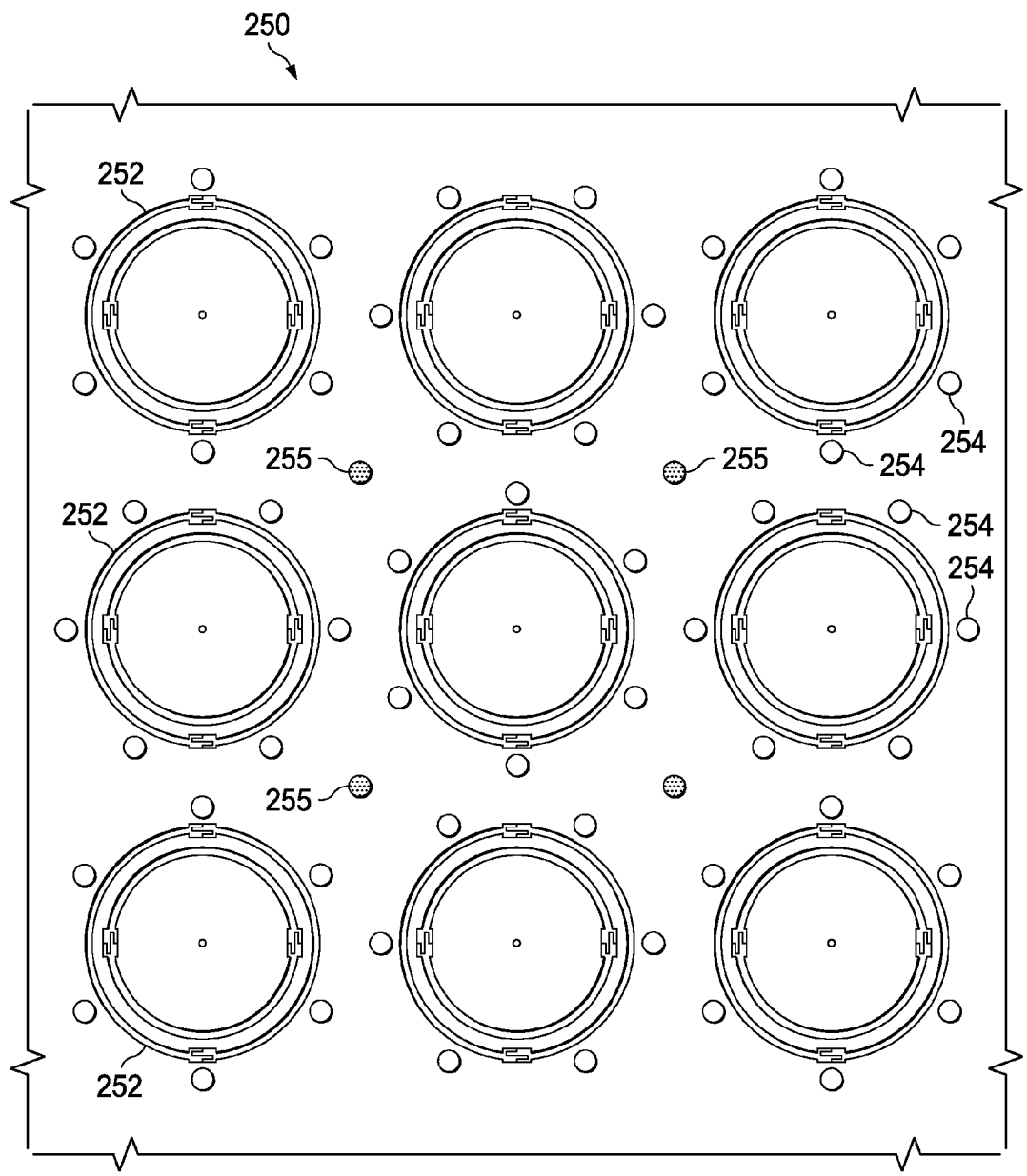

FIG. 3 illustrates gimbal 120, an example of a gimbal that may be used as bearings 114 or bearings 116. Gimbal 120 may be fabricated from silicon torsion springs, which try to return the mirror to its planar position. The attractive force of the drive voltage on one or more quadrant electrodes versus the increasing spring tension forces as the mirror is moved determines the final pointing angle of the mirror, at which point these two forces are balanced.

An array of photodiodes is placed as an interstitial array between the mirrors in the mirror array to provide a detection grid of optical detectors across the mirror array. In an example, the photodiodes are associated with a particular mirror. FIGS. 4A-E illustrate MEMS arrays 320, 330, 230, 240, and 250 respectively. In MEMS array 320, photodiodes 324 are arranged equidistant from four of mirrors 322, while in MEMS array 330, photodiodes 334 are arranged in a shared octagonal pattern around MEMS mirrors 332. Also, in MEMS array 230, photodiodes 234 are arranged in a triangular configuration around mirror assemblies 232 of MEMS array 230, and in MEMS array 240, photodiodes 244 are arranged in a square pattern around MEMS mirror assemblies 242. Additionally, in MEMS array 250, photodiodes 254 are arranged in alternating orientation hexagonal patterns around specific MEMS mirrors 252, and photodiodes 255 are between MEMS mirrors 252. Other photodiode arrangements are possible. For example, five, seven, eight, or more photodiodes may be arranged around and associated with a MEMS mirror. The mirror arrays have a series of rows and columns of MEMS two axis steerable micro-mirrors, for example 0.5 to 1.5 mm in diameter, and arranged on a row/column pitch of, for example, 1.5-4 times their diameter.

FIG. 5 illustrates a MEMS system containing MEMS module 372. The mirror arrays 382 and 388 may be MEMS array 320, 330, 230, 240, 250, or other structures. The traffic light on optical fibers 374 and 396 is overlaid with control light at an out-of-band wavelength in both directions through the mirror chamber by coupling control light into the fiber on both the inputs and outputs. In an example, optical fibers 374 and 396 are single mode fibers at both the control wavelength and the traffic wavelength. The input fiber connections are terminated on an array of input collimators 380 that produce parallel beams of light from the light in the fiber. The input fiber collimators act as lenses, creating expanded nominally parallel sided collimated beams of a diameter slightly smaller than the MEMS mirror diameter, for example, a beam diameter of 0.45-1.3 mm, at the traffic optical carrier wavelengths, which are projected on to mirrors the mirror array, for example mirror array 388. At the control wavelengths, these beams may also be either slightly divergent or slightly convergent. When the control beams are convergent, the focal point is early in the optical path. After the focal point, the control beam is divergent. The output collimator block 394 is similarly aligned to mirror array 382. When light is injected in the output collimator, the parallel collimated beam center aligns with the center of the respective mirror. The collimators project a nominally parallel beam at traffic wavelengths if a reverse path traffic signal is present, but may produce a convergent or divergent beam at the control optical carrier wavelength.

The mirror arrays and their respective collimator arrays are placed on either side of an empty optical cavity of sufficient size to enable each mirror on each mirror array to direct its reflected beam at any mirror on the opposing mirror array. Alternatively, the optical cavity has one or more large plane or curved mirror for folding long inter-mirror array optical paths into a smaller physical space, still facilitating that each mirror on each mirror array to direct its reflected beam via the folding mechanism to any mirror on the opposing mirror array.

The mirrors may be aimed or steered by applying a drive voltage to three or four segmented electrodes under the mirrors. The electrodes may be spaced about 80 to 100 microns from the mirrors. By applying different voltages to the segments, the mirrors may be pointed at an angle within their maximum deflection range. For example, the maximum deflection range may be about plus or minus five to seven degrees in both the x and y planes using the electrostatic forces from the applied electrode voltages to deflect the mirror against the spring tension of the gimbal mounts, which are trying to retain the mirror in its original plane. The drive lines to these electrodes are brought out of the mirror chamber.

The mirror arrays also contain photodiodes placed around the periphery of the MEMS mirrors. The photodiodes form a mesh of detectors across the face of the mirror array, facilitating the direct detection of an actual beam landing placement during the initial connection stages of switch connection establishment. The photodiodes act as mirror-associated optical control power sensors for the optimization and ongoing maintenance of an optimized link in service. The lines to these photodiodes are also tracked out. To avoid bringing out hundreds of low amplitude signals, the photodiode outputs may be amplified, digitized, and/or multiplexed in electronics physically associated with the mirror array. The on-array electronics may be on the front face of an extended mirror array substrate or on the reverse surface of the substrate, created by monolithic or hybridization techniques.

Controller 402 controls the pointing angle of the mirrors of the arrays via drive lines, the drive control being based on the outputs from the photodiodes from around mirrors on the opposing mirror array. When the appropriate mirrors are aligned to form an optical path, the traffic beam will only illuminate the target mirrors on the second array in each path and the output collimator face associated with that mirror, but the coaxial expanded control beams will be evenly illuminating the photodiodes associated with the target mirror of the second array in the optical path. The photodiodes around the first mirror in the optical path are not illuminated by that control beam, hence the need for a bidirectional control optical carrier feed to illuminate the first mirror. The measurement of the location of the beam spot provides the mirror pointing optimization detection during set up and ongoing maintenance.

Bidirectional control beams facilitate the simultaneous and independent initial alignment of opposing mirrors in the optical path, so the control beams are illuminating photodiodes around the opposing target mirror evenly. Thus, the mirror chamber module contains two banks of collimators which are precision aligned with the mirrors of their respective mirror arrays, such that light from the fibers of the collimator arrays form a beam with a central axis which passes through the center of their respective mirrors of the mirror arrays. These collimator arrays project collimated beams at traffic optical wavelengths and coaxial beams at the control optical wavelengths. The traffic beams may be parallel beams or very slightly wasted to compensate for Gaussian beam spread.

When a control beam from the input collimators is reflected by the first mirror it is projected on or near the target mirror on the second mirror array. The first mirror has a diameter sufficient to reflect the traffic beam and the control beam. The photodiodes around the target mirror or nearby mirrors within the zone of uncertainty determine the resultant beam spot placement. The zone of uncertainty is a zone around a target mirror where the beam may initially land, for instance as a result of an initial blind calculated mirror pointing. The photodiode response enables a control system to compute the landing positional error and a correction vector to better align the traffic beam. When the mirror is aligned, the target mirror's photodiodes are approximately equally illuminated by the control beam. A change in this uniform illumination may be rapidly compensated for by the control system to maintain alignment during operation.

Inject optical signal blocks 378 and 400 and receive optical signal blocks 376 and 398 are coupled to MEMS module 372. Receive optical signal blocks 376 and 398, which are optional, confirm that the cross switch optical loss is low. Also, receive optical signal blocks 376 and 398 are useful if the control optical channel is modulated at the input with an identity marker or identity word specific to a given input. The control optical receiver on the target output port can confirm the receipt of that identity marker or word validating the cross-switch connection mapping.

Inject optical signal blocks 378 and 400 are optical alignment sources which are injected from opposite sides of the system and counter-propagate across MEMS module 372. The optical alignment source is injected into the fibers, for example using an optical combiner. The optical alignment sources contain light from one or more lasers. A dedicated laser is not necessary, because the control power may be low relative to a laser's power output, facilitating one laser to drive multiple inputs via an optical splitter. Optical fibers 374 and 396 are single mode at both the control wavelength and the traffic wavelength. The control wavelength may be a shorter wavelength than the traffic wavelength. For example, the control wavelength may be in the 800-850 nm or 905-1040 nm bandwidth range when traffic is in the 1550 nm telecommunications band or the 1300 nm telecommunications band.

Figure 6:
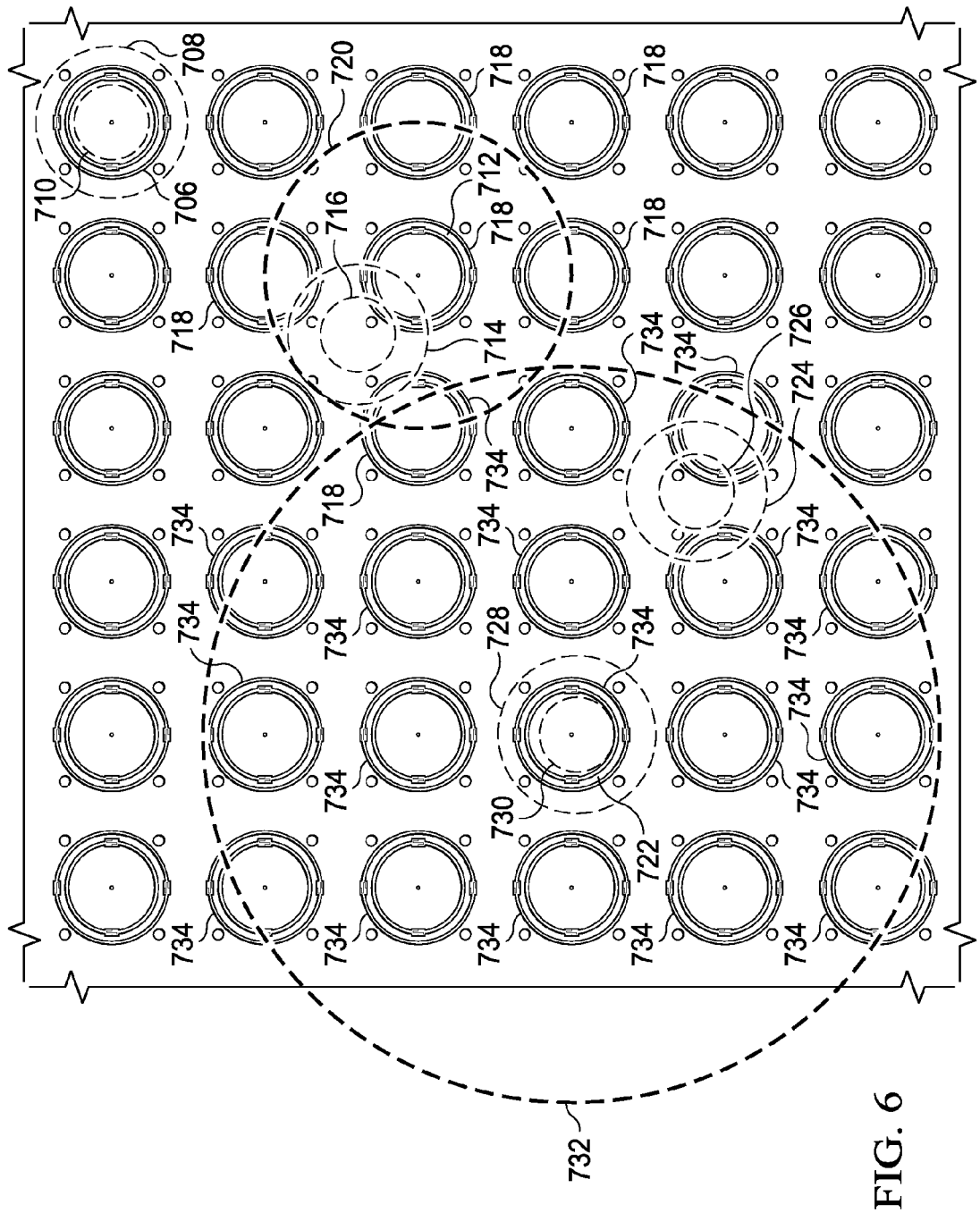
FIG. 6 illustrates beam spots on an embodiment MEMS array with interstitial photodiodes.

FIG. 6 illustrates a mirror array with interstitial photodiodes and some examples of beam landing spots. Traffic beam 710 and control beam 708 are properly aligned on mirror 706. This alignment is unlikely to occur from the initial calculation, due to its approximate nature, but represents the goal for after the acquisition and optimization process has been applied.

In one example, control beam 714 partially illuminates the target mirror, mirror 712. Traffic beam 716 is coaxial with control beam 714. The location of control beam 714, and hence traffic beam 716, can be determined by the light detected by photodiodes within zone of uncertainty 720. The mirrors on the opposing array that are in traffic and are illuminating mirrors 718 within zone of uncertainty 720 other than the opposing mirror being set up to target mirror 712 are locked to free their photodiodes to act as a detection grid. The photodiodes illuminated and the relative amount of power detected enables the calculation of a correction vector to be calculated in terms of distance and angle to center the beam on mirror 712. In this example, the beam primarily falls on photodiodes to the left of and above mirror 712, with the most power falling on the photodiode closest to the mirror. Three photodiodes are illuminated. The information from these photodiodes leads to the determination that the beam landing site should be moved to the right and down as a vector angle, and that it needs to be moved about a beam diameter to be better aligned with the target mirror. This calculation can be based on the photodiode that receives the most light, where the vector is approximately from that photodiode's location to the center of the target mirror. In another example, the power received by all three illuminated photodiodes is used to more accurately determine the center of the beam by triangulation. When multiple photodiodes are used, the alignment may be performed in a single cycle or iteratively, by repeating the process. Then, during operation, the optimization is maintained against mirror drift by monitoring the photodiodes around the mirror. When fewer than three photodiodes are illuminated, the beam is more accurately centered using the photodiodes associated with mirror 712 as an additional step.

In an example with a broader tolerance for the initial beam pointing, control beam 724 and traffic beam 726 initially land further away from mirror 722, within zone of uncertainty 732. The mirrors on the opposing array that are in traffic and are illuminating mirrors 734 within zone of uncertainty 732 are locked during the initial alignment. The photodiodes in the area where the beam landed respond to the received control illumination. The detected illumination values are used to calculate the center of the beam landing site, either approximately using the photodiode that receives the most light or, more accurately using three or more photodiodes to determine the actual location of the center of the beam. A correction vector may be calculated to achieve approximate or accurate alignment with the target mirror.

This should bring the beam close to being aligned. For example, traffic beam 730 and control beam 728 are close to being aligned with mirror 722. If an error remains that is detectable among the photodiodes around mirror 722, a second small correction vector may be calculated.

Additional details on a MEMS photonic switch with interstitial photodiodes are disclosed by the U.S. patent application Ser. No. 13/964,437 entitled "Device and Method for Micro-Electro-Mechanical-System Photonic Switch" filed on Aug. 12, 2013 which application is hereby incorporated herein by reference.

Figure 7:
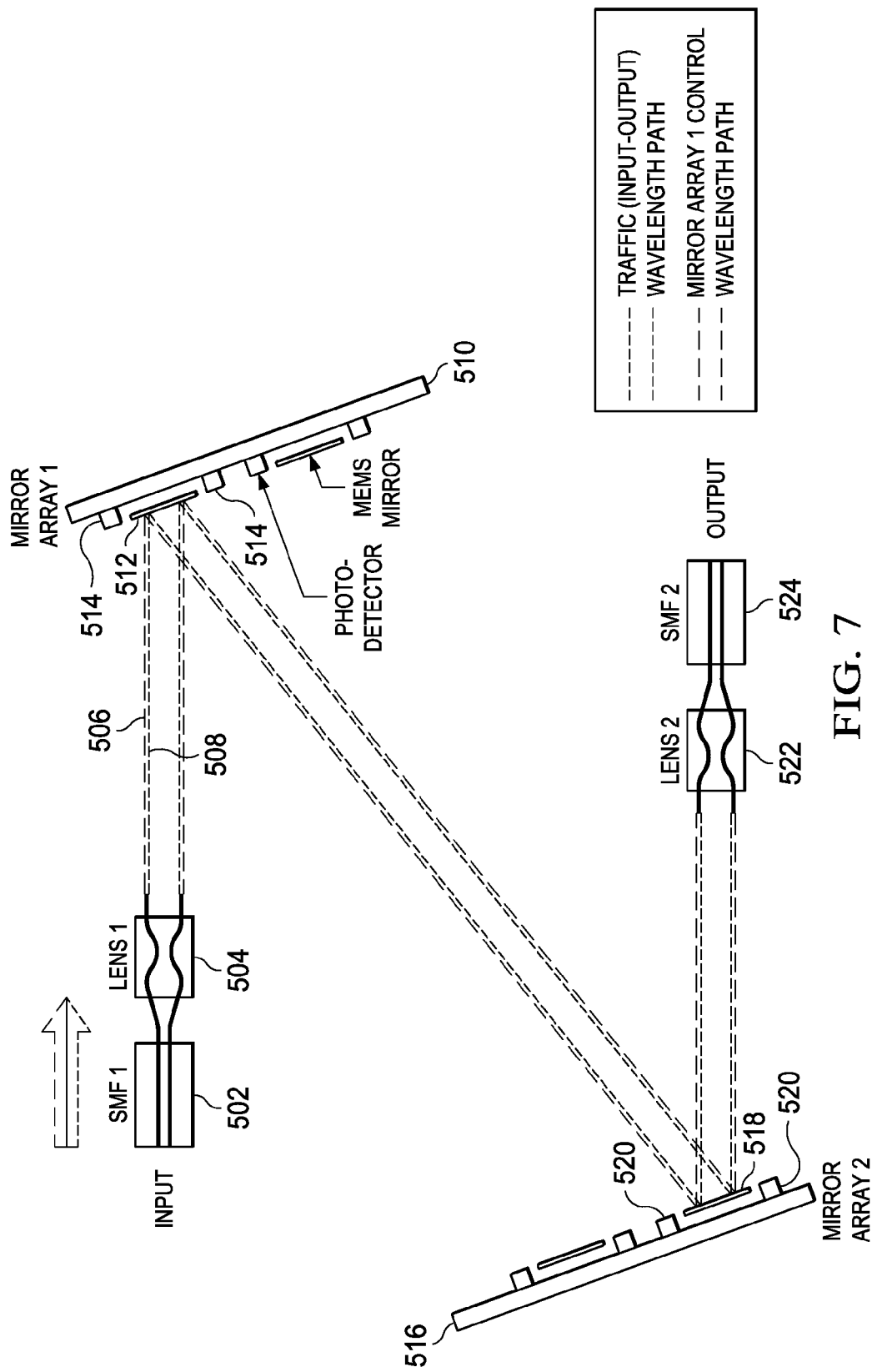
FIG. 7 illustrates an embodiment MEMS module with achromatic collimators.

FIG. 7 illustrates a traffic beam and a control beam projected as collimated beams across a MEMS switch. Control beam 506 and traffic beam 508 enter through single mode fiber 502 and lens 504 and are projected on mirror 512 of mirror array 510. Photodiodes 514 are around mirror 512. Control beam 506 and traffic beam 508 are reflected off mirror 512 to mirror 518 on mirror array 516, with photodiodes 520 surrounding mirror 518. The two beams exit through lens 522 to single mode fiber 524. Photodiodes 514 and 520 are not illuminated when control beam 506 and traffic beam 508 are centered on mirrors 512 and 518, respectively, because lens 504 and lens 522 are achromatic.

Figure 8:
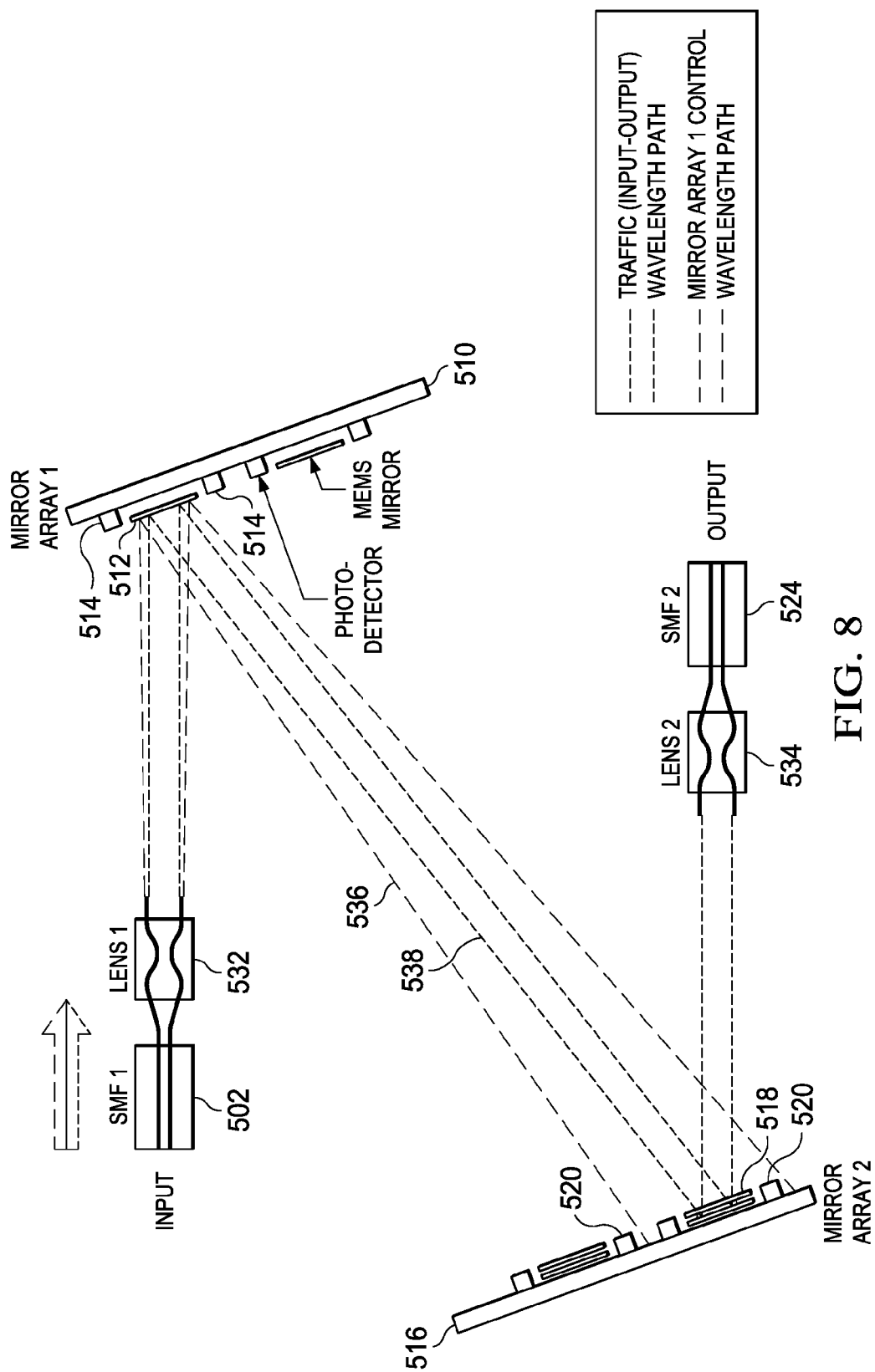
FIG. 8 illustrates an embodiment MEMS module with a longer effective focal length at a control wavelength than at a traffic wavelength.

FIG. 8 illustrates traffic beam 538 and control beam 536 where control beam 536 is slightly divergent. Control beam 536 and traffic beam 538 enter through single mode fiber 502 and lens 532. Lens 532 causes control beam 536 to diverge relative to traffic beam 538, while the beams remain coaxial. Control beam 536 and traffic beam 538 reflect off mirror 512 in mirror array 510 to mirror 518 on mirror array 516. Control beam 536 diverges to illuminate photodiodes 520 when control beam 536 and traffic beam 538 are centered on mirror 518, while traffic beam 538 does not illuminate photodiodes 520 when centered on mirror 518. Control beam 534 and traffic beam 538 then exit through lens 532 to single mode fiber 524. Because of the divergence of control beam 536 in the path to mirror 512, mirror 512 sufficiently large to accommodate the slight increase in spot size, which occurs between the lens 532 and the first mirror 512.

The difference in the illumination of photodiodes 520 generates a control vector to steer the beam by adjusting mirror 512 to minimize the differences in the control beam power received on photodiodes 520 associated with mirror 518. When traffic beam 538 and control beam 536 are centered on mirror 518, the power on the photodiodes is approximately equal, because the traffic beam is coaxial with the control beam. Because the beam spots are coaxial and centered, a similar amount of power is detected by photodiodes 520.

In an example, control beam 536 and traffic beam 538 offset from the center of mirror 518. More light is detected by the right photodiode than by the left photodiode. When three or more diodes are illuminated, the beam location in two axes may be determined by triangulation. Because the beams are coaxial, the traffic beam will be aligned when the control beam is aligned.

Because photodiodes 520 are illuminated when traffic beam 538 is centered on mirror 518, the signals generated from photodiodes 520 may control optimization during in-service operation as well as the initial alignment. The photodiodes associated with the target mirror are used for fine alignment, while other photodiodes within a zone of uncertainty are used for initial coarse alignment. Mirrors illuminating other mirrors within the zone of uncertainty may be locked during the initial alignment. The mirrors may be locked, for example for 5-10 ms, which is shorter than the time period for locking when precession is used for coarse alignment. Locking is achieved by maintaining the current X, Y drive voltages on the opposing mirrors, irrespective of control input from the target mirror photodiodes surrounding the mirrors within the zone of uncertainty. This frees up the mirror-associated photodiodes within the zone of uncertainty to be used as a detection grid for the new beam location.

Figure 9:
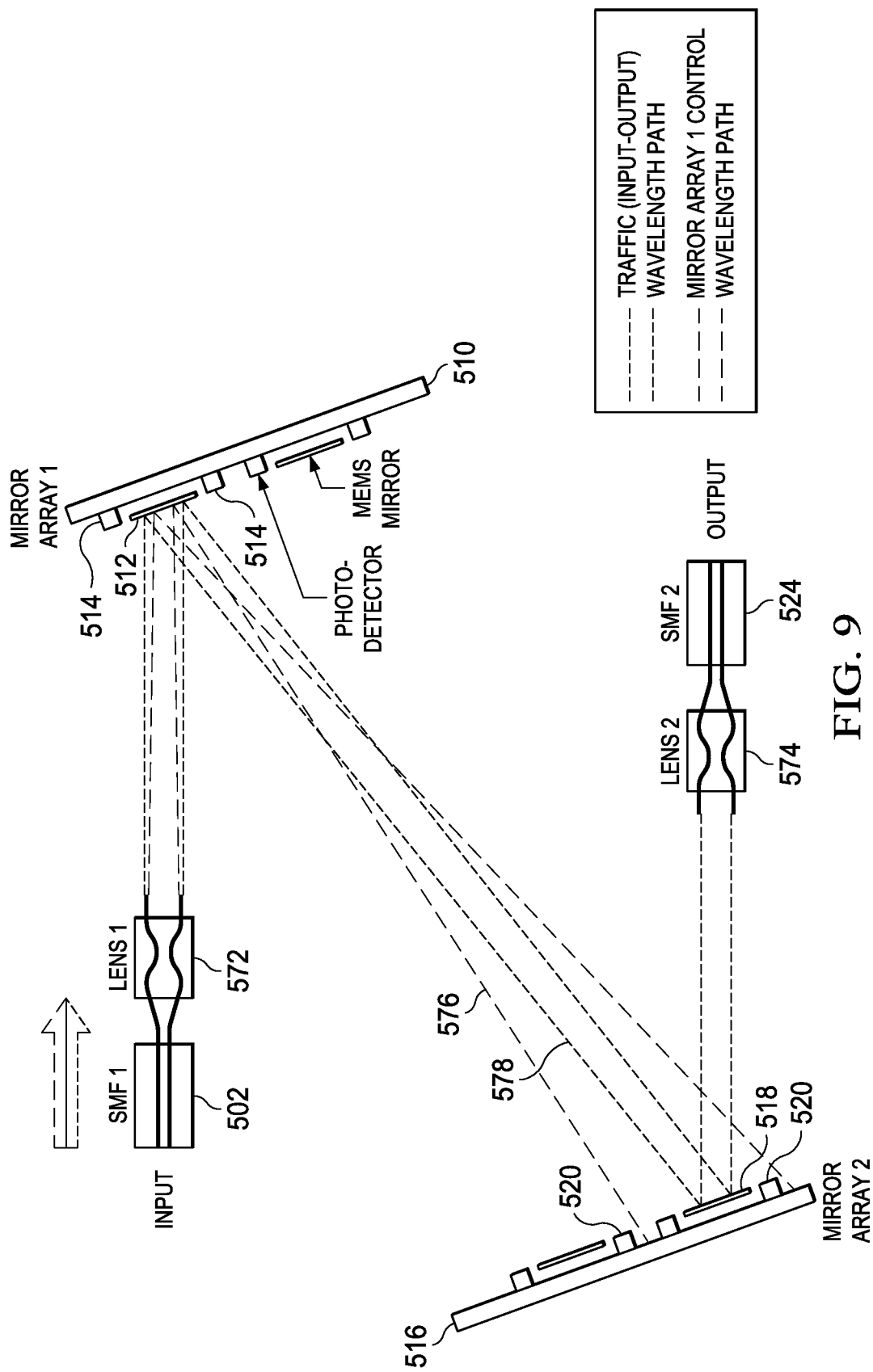
FIG. 9 illustrates an embodiment MEMS module with a shorter effective focal length at a control wavelength than at a traffic wavelength.

FIG. 9 illustrates an optical link where the control beam is slightly convergent and coaxial with the collimated traffic beam. When the focal point is well before the second mirror array, the control beam spreads out beyond the focal point and illuminates the photodiodes surrounding the second mirror. The difference in power detected by the photodiodes around the mirrors can generate a control vector to steer the beam by adjusting the first mirror to minimize the differences in control beam power received by the photodiodes. When the control power on the photodiodes associated with the mirror is equal, the control beam, and hence the traffic beam is centered. Because the traffic beam is coaxial with the control beam, they are both centered with the same alignment. In this example, the mirror diameter does not need to be slightly increased to handle the control beam, because control beam 576 is smaller than traffic beam 578 at mirror array 510.

Traffic beam 578 and control beam 576 enter through single mode fiber 502 and lens 572. Lens 572 converges control beam 576, while traffic beam 578 is collimated. The beams reflect off mirror 512 on mirror array 510 to mirror 518 on mirror array 516. The beams exit through lens 574 and single mode fiber 524.

Because photodiodes 520 are illuminated by control beam 576 when traffic beam 578 is centered on mirror 518, the signals generated from photodiodes 520 may control the optimization during in-service operation as well as the initial set up operation during fine alignment. Photodiodes associated with mirrors across the zone of uncertainty may be used to detect the initial beam placement. If necessary, the mirrors within the zone of uncertainty are locked in position.

In both the examples shown in FIGS. 8 and 9 a reverse direction control beam (not shown in the figures for clarity) may be used to control the pointing of mirrors 518 to center the reverse beam on mirrors 512. In that case, by the principle of reversibility of light paths, forward traffic beams from mirrors 512 would be accurately centered on output collimators 534, 574 respectively by the action of mirror 518, under control from processing the levels detected by photodiodes 514.

Additional details on collimators that have a different focal length at a control wavelength and a traffic wavelength are disclosed by the U.S. patent application Ser. No. 17/472,407 entitled "Device and Method for Micro-Electro-Mechanical-System Photonic Switch" filed on Nov. 21, 2013 which application is hereby incorporated herein by reference.

Figure 10:
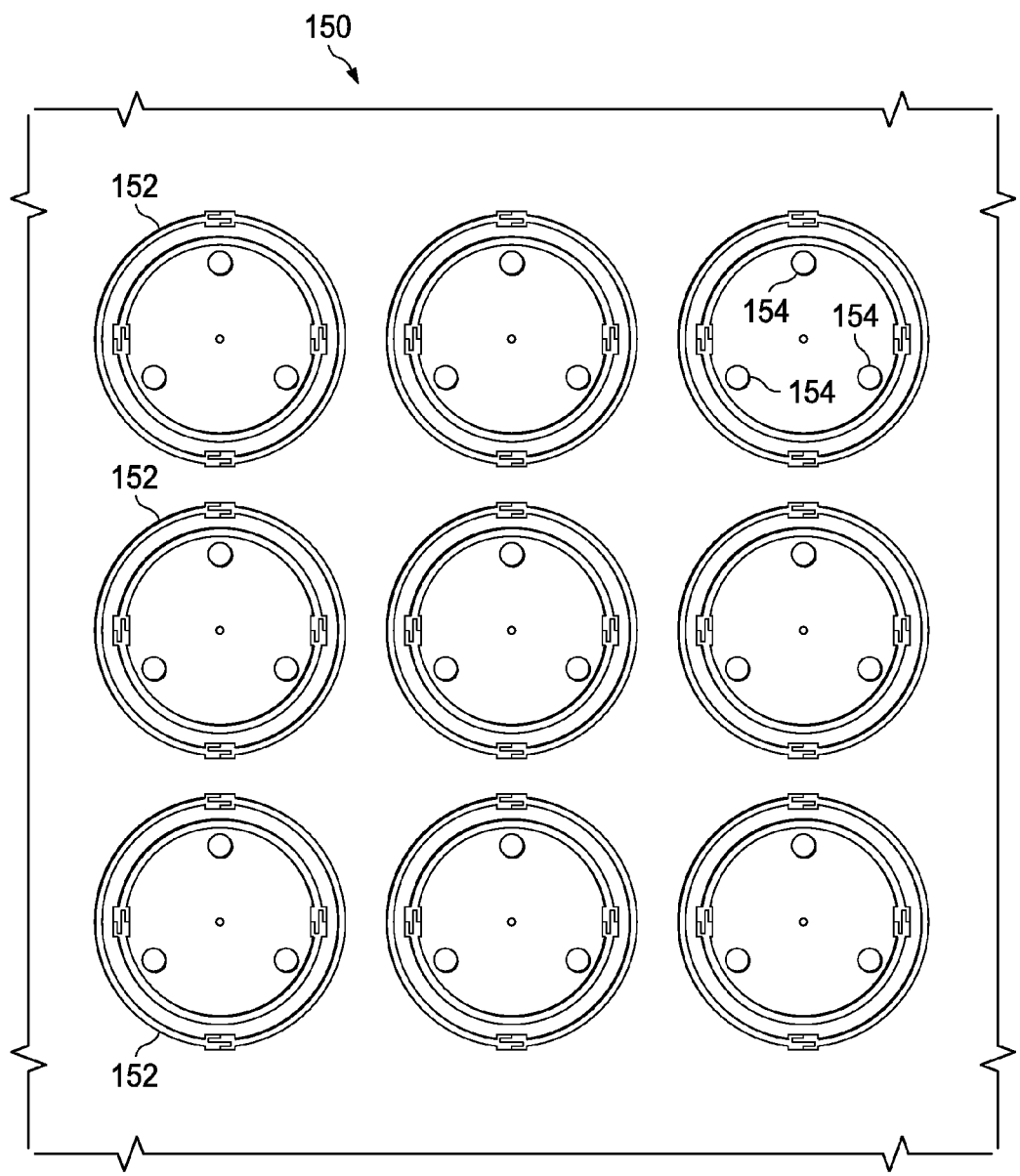
FIG. 10 illustrates an embodiment MEMS mirror array with photodiodes integrated on the mirrors.

In another example, photodiodes are integrated on the surface of the MEMS mirrors FIG. 10 illustrates MEMS mirror array 150 of MEMS mirrors with photodiodes integrated on the mirror surface. MEMS mirror array 150 contains MEMS mirrors 152, with photodiodes 154 integrated on the surface of the mirrors.

Figure 11A:
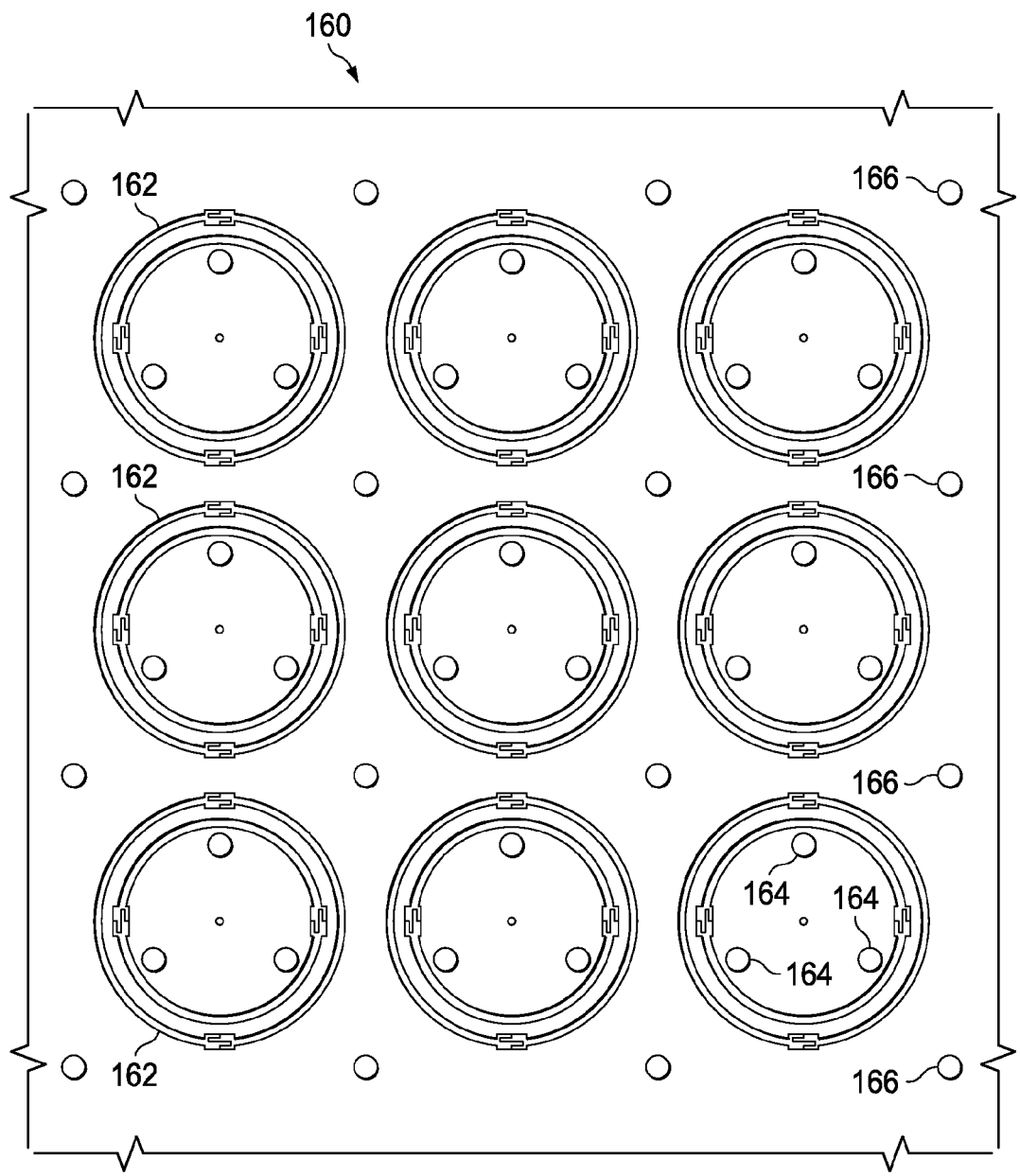
FIGS. 11A-11C illustrate embodiment MEMS mirror arrays with interstitial photodiodes and photodiodes integrated on the mirrors.
Figure 11B:
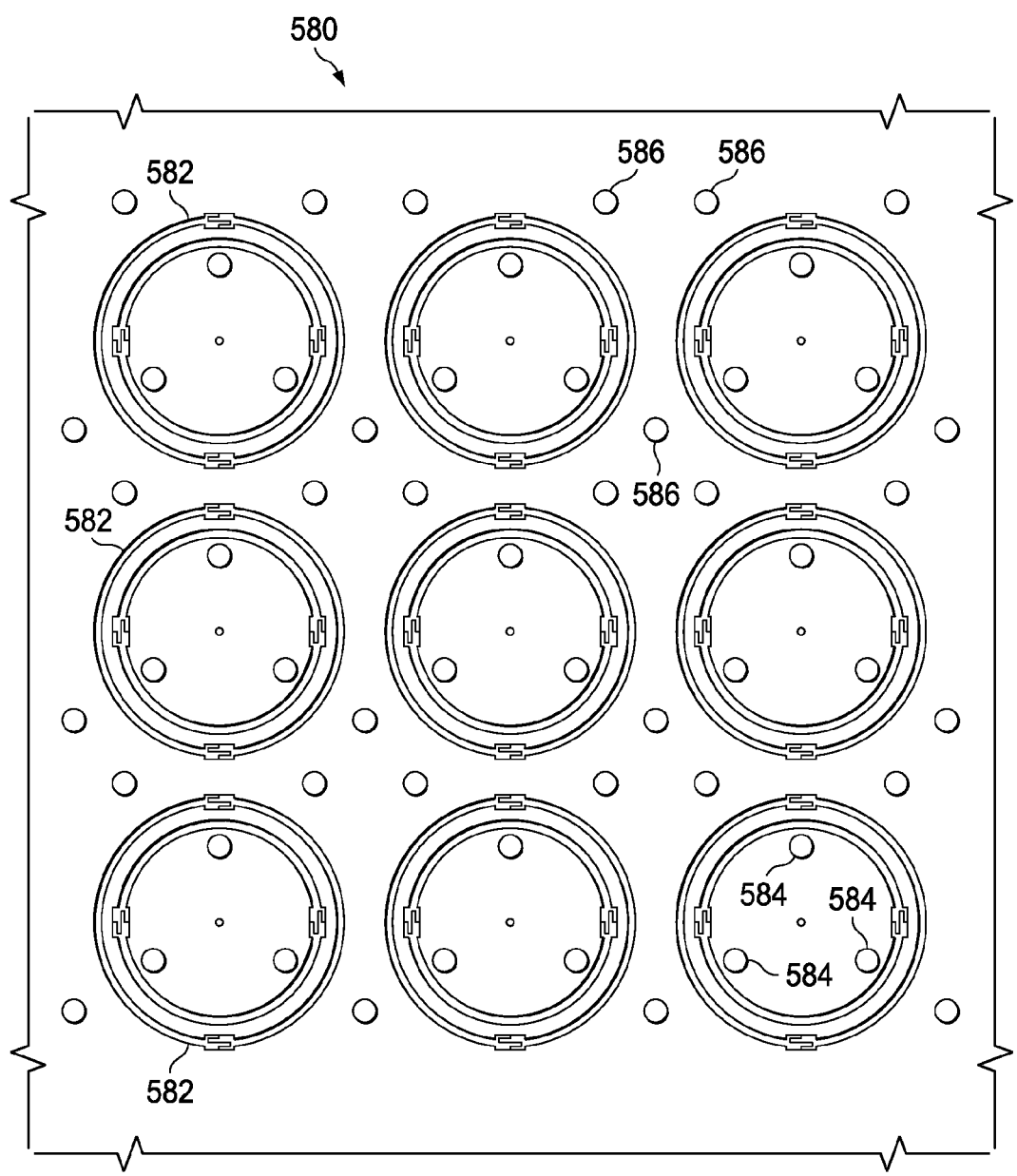
Figure 11C:
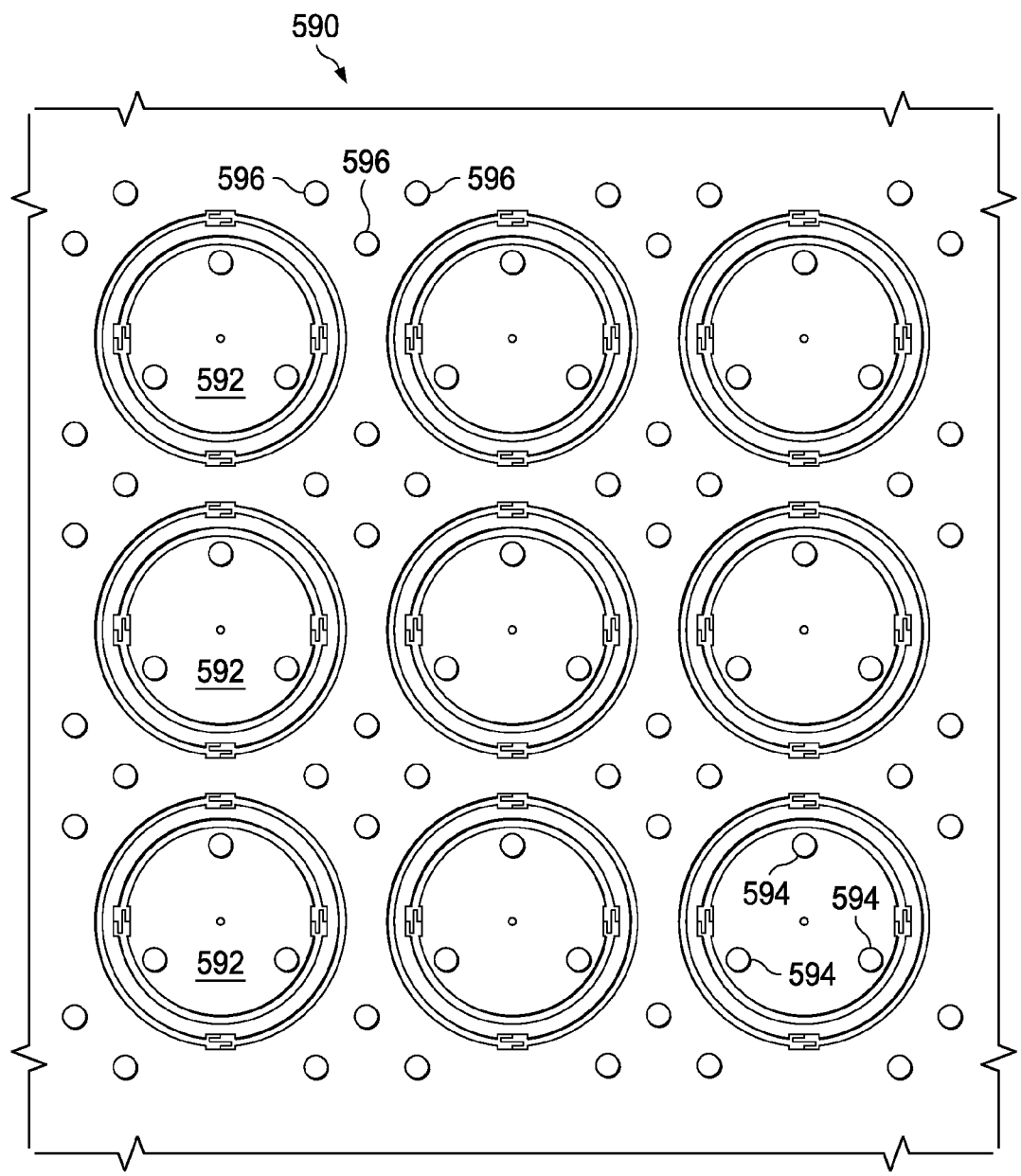

FIGS. 11A-C illustrate MEMS mirror arrays with photodiodes placed on the substrate between the mirrors in a mirror array as well as on the surface of the mirrors. Mirror array 160 in FIG. 11A shows mirrors 162 with photodiodes 164 placed on the surface of mirrors 162 and photodiodes 166 equally spaced between four surrounding mirrors. FIG. 11B shows mirror array 580 with mirrors 582, photodiodes 584 placed on the surface of mirrors 582, and photodiodes 586 placed in a triangular pattern centered equidistant from the centers of the four surrounding mirrors. Also, FIG. 11C shows mirror array 590 with mirrors 592, photodiodes 594 on the surface of mirrors 592, and photodiodes 596 in a diamond pattern centered equidistant from the centers of the four surrounding mirrors. Other photodiode patterns may also be used. For example, more interstitial photodiodes may be used. The photodiodes may be placed in the region between two mirrors rather than centered between four mirrors.

The interstitial photodiodes assist the mirror photodiodes in determining the center of the initial beam placement. This may be determined accurately with three or more photodiode responses and triangulation of the beam site center. When only one photodiode is illuminated by the initial beam landing, its location within the beam spot cannot be determined. While the photodiode distance from the target mirror may be calculated, the direction of the center of the beam spot from that photodiode cannot be calculated, resulting in a tolerance in the measured beam spot position. Hence, the photodiode location may be used as the beam location, which leads to a more approximate correction vector. Once light is received by any of the mirror photodiodes on the target mirror, the beam may be walked in to the mirror center.

Additional details on MEMS mirror arrays with photodiodes placed on the surface of the MEMS mirrors are disclosed by the U.S. patent application Ser. No. 17/472,176 entitled "Device and Method for Micro-Electro-Mechanical-System Photonic Switch" filed on Nov. 21, 2013, which application is hereby incorporated herein by reference.

In order to avoid long locking periods for mirrors feeding in-service mirrors in a zone of uncertainty and to facilitate multiple paths being set up within any zone of uncertainty, the control channel illumination is strobed at a moderately high frequency, creating control time slots. The control time slots are smaller than the time it takes MEMS mirrors to move a significant distance. For example, the motion for MEMS mirrors may be limited to ten times the mechanical resonance frequency, which may be 10-20 kHz. Strobing the control channel at frequencies substantially higher, for example at 50-100 kHz, enables the full spectrum range of motion derived mirror signal changes to be detected. By strobing the control illumination at more than two illuminations per cycle of the highest frequency the mirror position, above the Nyquist rate, the full frequency spectral information is retained. The strobing may be performed with multiple strobe phases such that for X % of the time the in-service channels are illuminated and for (100−X) % of the time the mirror control channels for the mirrors being set up are illuminated and the in-serviced control channel electronics are switched to be used for setup up beam detection. Because the switching occurs more rapidly than the motion in the mirrors, there may be a small reduction in the optical sensitivity of the control circuit. This small reduction may be compensated for by a slightly higher control optical power. Also, there is no effective loss in control bandwidth, which remains higher than the frequency of movement.

Creating a separation in time between the initial mirror set up and the in-service mirrors alignment maintenance prevents control crosstalk. The time slots may be further sub-divided so that each mirror being set up is illuminated once every m set up optical illumination cycles, illuminated for 1/p of the duration of a set up optical illumination cycle, or both. This enables m mirrors, p mirrors, or m*p mirrors to be set up simultaneously per zone of uncertainty. Because the frame repetition rate of the strobe control is much shorter than the time taken to move a mirror, the mirror set up time is not significantly slowed when p times the frame length is much shorter than the mirror set up time. For a 100 kHz frame rate, p is less than about twenty to fifty.

The different target mirrors have zones of uncertainty with the same diameter as the other zones of uncertainty but centered on itself, creating a repeating pattern of usable set up channel numbers or phases across the surface of the MEMS array based on the number of mirrors within a zone of uncertainty. When m*p>n, where n is the number of mirrors per zone of uncertainty, all mirrors in the array may be simultaneously set up.

The splitting of the set up control channel illumination strobes into multiple phases can reduce the set up control bandwidth, because the effective sampling rate of the mirror position is reduced by a factor of m, because the Nyquist sampling rate is reduced. The residual set up channel bandwidth is still sufficient for a rapid setup. For example, a 100 kHz strobing rate is used where m=25 and p=1, the individual mirror illuminated during set up is illuminated four times per millisecond, providing a Nyquist sampling rate into the control system consistent with up to a 2 kHz envelope. Hence, measurements may be made in a fraction of a millisecond, less than the time to move the mirror. In another example, with m=5 and p=5, the control bandwidth remains over 10 kHz with a zone of uncertainty as large as 25 mirrors.

Separating in-service control from set up control may be achieved by creating a repetitive high frequency control frame. The data collected by the photodiodes and their receivers, both for the set up phase and the in-service phase is, in effect, an analog signal representing where the mirrors are positioned. This is determined by comparing the analog signals from the photodiodes. An analog signal may be sampled unambiguously and without the loss of bandwidth as long as the highest analog frequency present is less than half of the sampling frequency, under the Nyquist Theorem.

Figure 12:
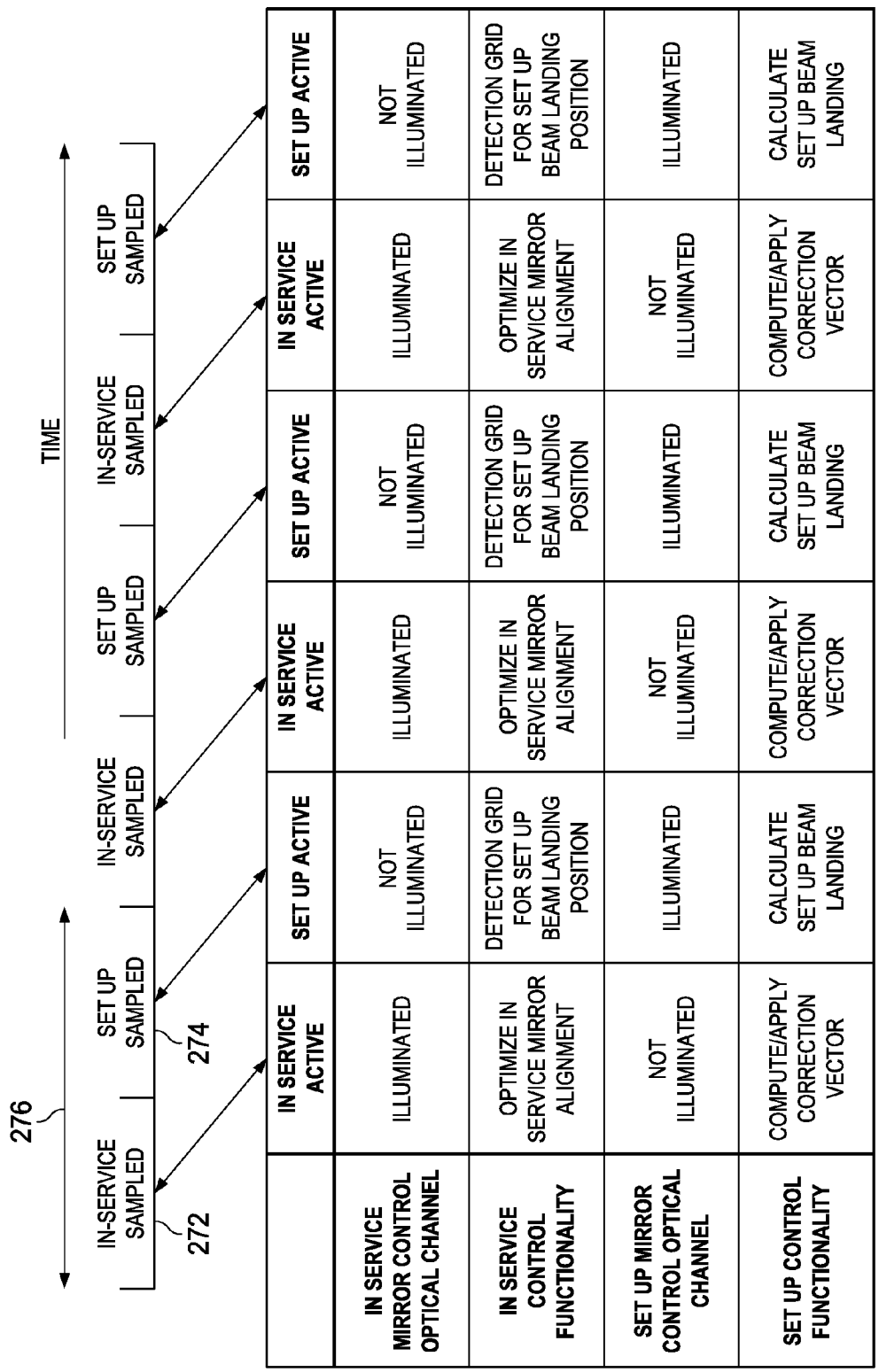
FIG. 12 illustrates an embodiment frame structure for aligning MEMS mirrors with integrated photodiodes.

In an example, a time period for setting up new connections is alternated with a time period for maintaining in-service connections. FIG. 12 illustrates in-service sampled time slot 272, followed by initial set up sampled timeslot 274. These two timeslots have a time 276, which may be 10-20 microseconds at a 50-100 kHz repetition rate. The in-service mirrors' control beams are illuminated in alternate periods to the control beams of mirrors being set up. When the in-service control light is present and the in-service control circuits are optimizing their associated mirrors, there is no control light present from the control optical carriers of the mirrors being set up, so no interference occurs. The in-service control circuits are active to control the in-service mirrors for the period when the in-service control beam is illuminated, but the mirrors are then locked for the next 5-10 microseconds, and their photodiodes and receivers are repurposed to act as a grid of set up beam landing site detectors. In the phase where the in-service control beams are not illuminated, the control beams of mirrors being initially set up are illuminated, and the mirror being set up will project that beam somewhere within the zone of uncertainty. The grid of repurposed controllers of the other mirrors in the zone of uncertainty coordinate the beam landing location, which are fed to the controller of the mirrors being setup up. During the following portion of the cycle, when the in-service mirrors are being illuminated, the controller of the mirror being set up will calculate the correction vector and will apply that correction voltage to the mirror. The mirror takes a significant time to move.

Then, the process is repeated, to determine whether the mirror is well enough aligned for local setup, when the initial setup process ends. Thus, the in-service mirrors and initial set up mirrors have continuous control.

Additional details on the use of different time slots are disclosed by the U.S. patent application Ser. No. 14/495,475, entitled "Device and Method for Micro-Electro-Mechanical-System Photonic Switch" filed on Sep. 24, 2014, which application is hereby incorporated herein by reference.

Figure 13:
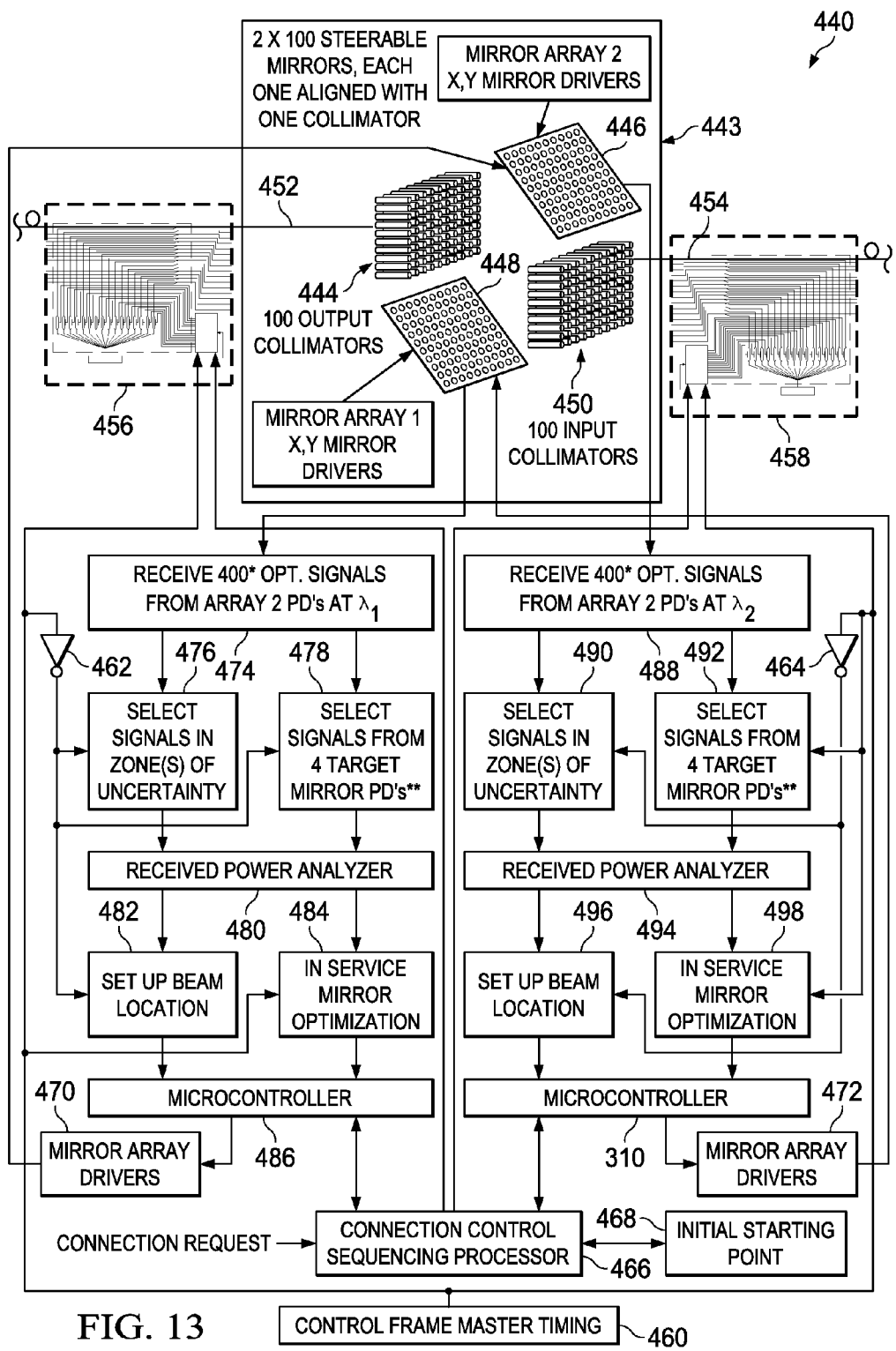
FIG. 13 illustrates an embodiment control structure for aligning MEMS mirrors with integrated photodiodes.

FIG. 13 illustrates control system 440 for a MEMS system with interstitial photodiodes on a MEMS mirror array and an expanded control beam. A similar control system may be used with MEMS mirror arrays with photodiodes on the surface of the MEMS mirrors MEMS mirror module 443 contains collimator array 444, mirror array 446, mirror array 448, and collimator array 450.

A connection request is received by connection control sequencing processor 466. Initial starting point block 468 provides the initial starting angle for the mirrors for connection. The initial angles may be based on a geometric representation of the MEMS array and the mirror chamber layout. For example, the mapping of input and output ports to a MEMS mirror row and column are used to determine the angles based on geometry. In another example, initial starting point block 468 may also contain a mapping of angular displacement versus the required x and y axis drive voltages, which may be derived from a table of generic average values or from a table specific to the associated array, based on the measurements of a few mirrors in the array. Alternatively, the mapping of angular displacement is a more complex function that translates the initial required mirror angles into the initial required drive voltages.

The initial calculated drive voltage values are passed to microcontrollers 486 and 310, which are associated with mirror array 446 and mirror array 448, respectively. While microcontrollers 486 and 310 are pictured as one microcontroller per mirror array for clarity, they may handle groups of mirrors or mirror arrays and communicate between themselves to better utilize their capacity. Microcontrollers 486 and 310 feed the drive values to mirror array drivers 470 and 472, respectively, which drive mirror arrays 446 and 448.

Meanwhile, connection control sequencing processor 466 communicates the port numbers being set up to control channel optical carrier generators 456 and 458, which are instructed to block the optical control channels being set up. This is so the control channel carrier does not splash across other mirrors' photodiodes on its path to its initial set up position inside the zone of uncertainty. The output light proceeds along fibers 452 and 454 respectively, to collimator arrays 444 and 450. After a period of time, for example about one millisecond, the initial pointing is established somewhere inside the zone of uncertainty, and control channel optical carrier generators 456 and 458 turn on the optical control channel.

Control frame master timing block 460 coordinates the timing by providing a signal indicating whether the system is in an initial set up mode or an in-service/maintenance mode. Gates 462 and 464 invert the signal.

The optical responses of the photodiodes are received by receive blocks 474 and 488.

When initial alignment is being performed, select signals in zones of uncertainty blocks 476 and 490 select the photodiodes in the zone of uncertainty and pass these signals to received power analyzers 480 and 494, respectively. However, when in service connection maintenance and optimization is being performed, select signals from target mirrors blocks 478 and 492 select the signals from the photodiodes associated with the mirrors the alignment of which is being maintained, and passes these values to received power analyzers 480 and 494.

When new beams are being set up, set up beam location blocks 482 and 496 are used. However, when in service mirrors are being maintained, in service mirror optimization blocks 484 and 498 are used.

An embodiment controls a MEMS photonic switch with photodiodes integrated on the mirror arrays. The photodiodes detect the beam landing sites of a light beam reflected of the first mirror array on the opposing substrate. Real time and high speed control is based on analysis of the photodiode signals using beam positional error, velocity, and acceleration analysis to provide beam trajectory prediction. This facilitates the use of control beam trajectory correction by controlling the mirror angular position dynamically to move the mirrors in a highly controlled manner at speeds which would otherwise trigger mirror resonances. The control beam initially proceeds to the zone of uncertainty based on the blind initial computation, where it is then illuminated, and its actual landing location is measured. Then, the beam is moved to approximately align with the target mirror, whereby the controlled mirror is continuously following a continuously more refined trajectory to bring the control beam to its destination target.

The mirror is induced to move very rapidly by applying a high drive voltage for a controllable short period of time. This is an impulse. This is followed by a controlled impulse on the opposite drive plates as the mirror approaches its destination angle to brake the mirror to zero velocity, and hence zero kinetic energy, at the correct final pointing angle. To minimize positional errors or residual velocities which may trigger mechanical resonances, real-time closed loop control may be applied in the final stages of the braking or deceleration process.

A photodiode based closed loop approach may detect the start of a mirror response to a vibration event by detecting the beginning of the resultant beam movement. Electrostatic drive feedback may be provided to dampen and compensate for impacts of vibrations that reach the mirrors by using active fast real time control to reduce or prevent mirror perturbations from their required optical position as a result of vibration inputs by applying opposing forces and resultant accelerations by electrostatic means.

3D-MEMS mirrors, such as MEMS mirror structure 110, are used as beam steering switches. As such, the mirrors may be pointed to a precision angle in two axes. Mirrors may consist of a mirror, steerable in two axes, mounted on a pivoting arrangement. For example, a two axis gimbal arrangement using folded silicon torsion bar springs, as shown in MEMS mirror structure 110, may be used. The mirrors may be pointed over a usually restricted range of angles by placing a set of quadrant electrodes under the mirror and applying voltages to these electrodes. The resultant electric field between the energized electrode plates and the mirror, which is at ground potential, creates an attractive force on the mirror. The different drives applied to the electrodes angularly displace the mirror against the spring torsion forces trying to retain it in the plane of the gimbals. Thus, the mirror, which has a small but finite non-zero mass, is a sprung mass system. The mirror and springs exhibit mechanical resonances, especially if the springs do not have a very high damping ratio. These mirrors are used in 3D MEMS switches by creating two two-dimensional arrays of mirrors, as in MEMS photonic switch 100.

The mirrors may be steered through angles of about plus or minus five degrees in each axis. This means that the beam, which is deflected by twice the mirror deflection angle, maybe steered through plus or minus ten degrees. Because the mirrors are placed in planar arrays and the row and column edge mirrors point beams towards all the mirrors on the opposing array, including the far edge mirrors of that array, the edge mirrors can only be usefully deflected through one half of the total range. This limits the size of the opposing array to one that may be illuminated by the zero to ten degrees or zero to negative ten degrees of beam deflection possible at the edge mirrors, with the other polarity of the edge mirror deflections pointing off into empty space. This means that the central mirrors, although they can be deflected through plus or minus five degrees, giving a plus or minus ten degree beam deflection, can only usefully be deflected through about plus or minus 2.5 degrees, giving a plus or minus five degree beam deflection, since larger deflections would point off the opposing array.

The number of mirror cells per array, which determines switch port count, is therefore determined by the cone of illumination from all of the mirrors in the opposing array. Its cross-sectional area increases with distance. Hence, larger mirror arrays with more MEMS mirrors can be used, but the mirror arrays should be placed further apart. For mirrors with a three millimeter diameter, a one millimeter spacing, and a maximum deflection of plus or minus five degrees, two 100 mirror arrays would be placed about 153 millimeters apart, whereas two 400 mirror arrays with the same mirror geometries would be placed about twice as far apart about 306 millimeters. Two 1000 mirror arrays would be placed more than three times as far apart, at around 435 millimeters.

Figure 14:
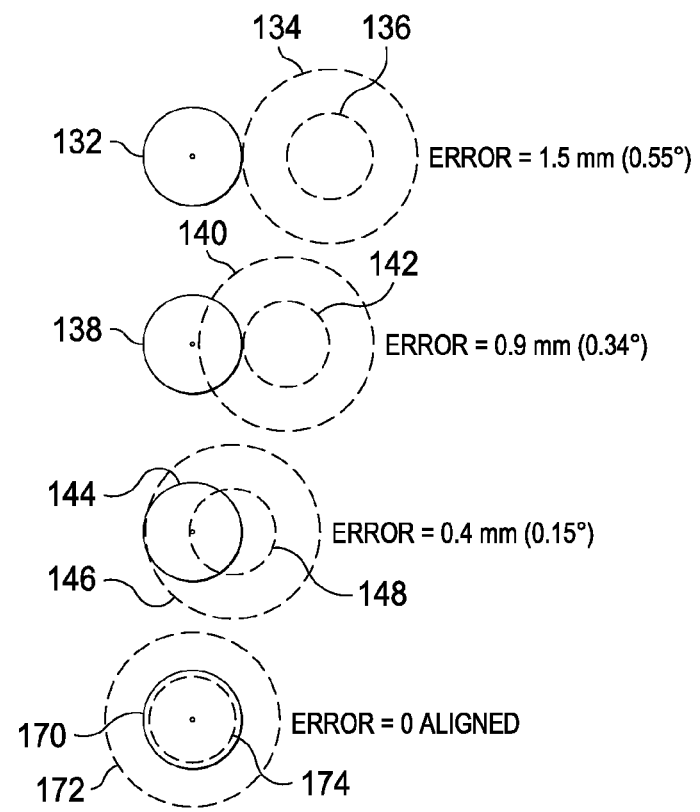
FIG. 14 illustrates beam spot errors.

For the switch to operate correctly, the beam from the appropriate mirror on one array should be fully aligned so it centrally illuminates the target mirror on the opposing mirror to achieve zero error. FIG. 14 illustrates the beam placement relative to the target mirror for various alignment errors for mirror arrays 153 mm apart. Control beam spot 134 and traffic beam spot 136 have an error of 1.5 mm from target mirror 132, which is a 0.55° error. Also, control beam spot 140 and traffic beam spot 142 have an error of 0.9 mm from target mirror 138, which is an error of 0.34°. An error of 0.9 mm will cause no illumination of the target mirror by the traffic beam. When an expanded control beam is not used, this means that the control beam will also completely miss the mirror. Control beam spot 146 and traffic beam spot 148 have an error of 0.4 mm from target mirror 144, with a 0.15° error. An error of 0.4 mm will cause the loss of half of the traffic optical power. Traffic beam spot 174 and control beam spot 172 are aligned with target mirror 170. A very high degree of precision is required in the steering of the MEMS mirrors.

Figure 15:
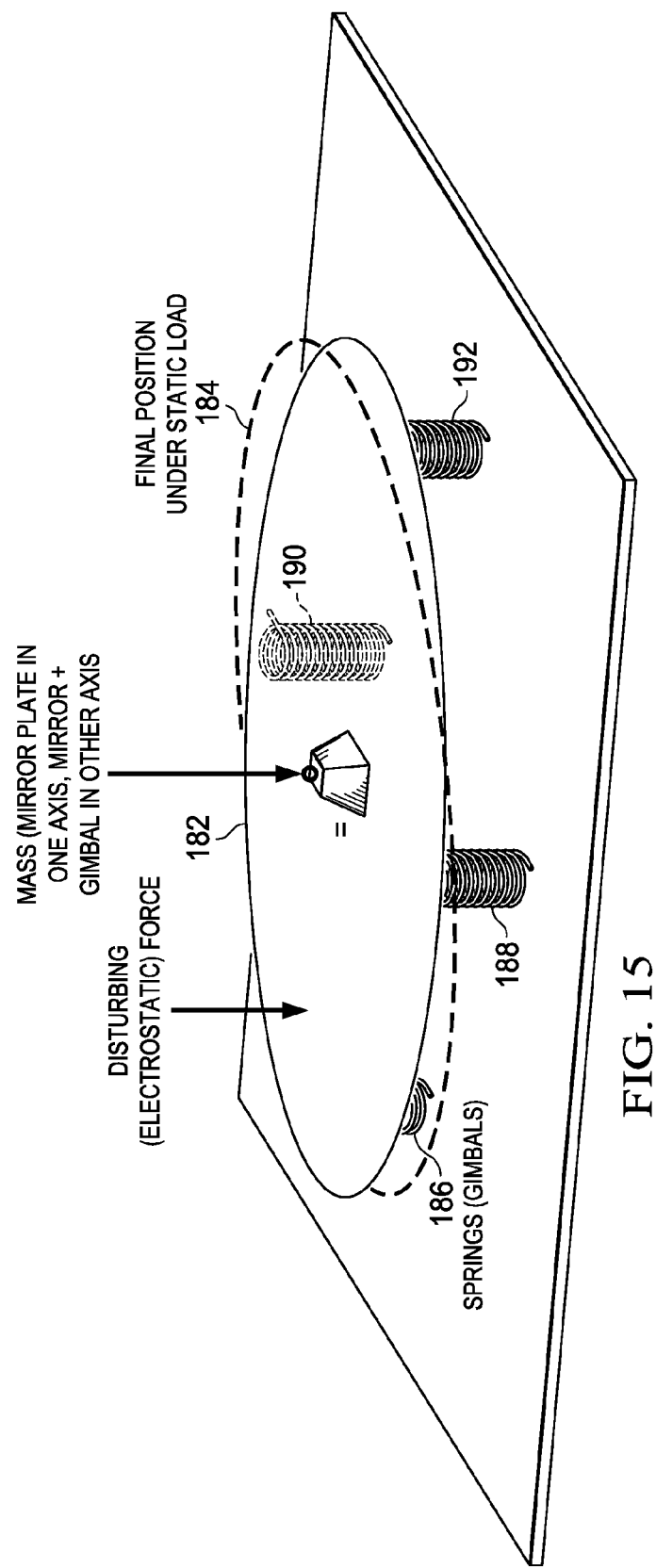
FIG. 15 illustrates a sprung mass model of a MEMS mirror.

FIG. 15 illustrates the sprung mass equivalent of a MEMS mirror. Mirror 182 has the mass of the mirror plate in one axis, and the mirror and gimbal in the other axis. Four springs or gimbals, springs 186, 188, 190, and 192 support mirror 182. When an electrostatic force is applied, the mirror has a final position under static load 184. When the step voltage is applied, it creates a step electric field across the gap between the electrode and the mirror, which results in the mirror being subjected to a step attractive force proportional to the electric field and the electrode area. The mirror is accelerated at a finite acceleration rate due to the mirror mass. As the mirror accelerates, it picks up kinetic energy. As the mirror moves towards its target position, it continues to accelerate as the electric field, which is somewhat intensified due to the reduced electrode-mirror gap pulling on the mirror. However, the rate of acceleration decreases due to the spring backpressure force increasing at a higher rate. The spring force is always trying to return the mirror to the original plane. As a result, as the mirror reaches its target angular displacement, its acceleration drops to zero, since the force due to the electrostatic attraction between the mirror and electrode is balanced by the back-pressure from the springs. However, despite the acceleration dropping to zero, the mirror has picked up a sizable rotational velocity, and hence kinetic energy, so it continues to move. The mirror is decelerated by the spring backpressure, which is increasing at a faster rate with incremental mirror angle than the electric field increases.

Figure 16:
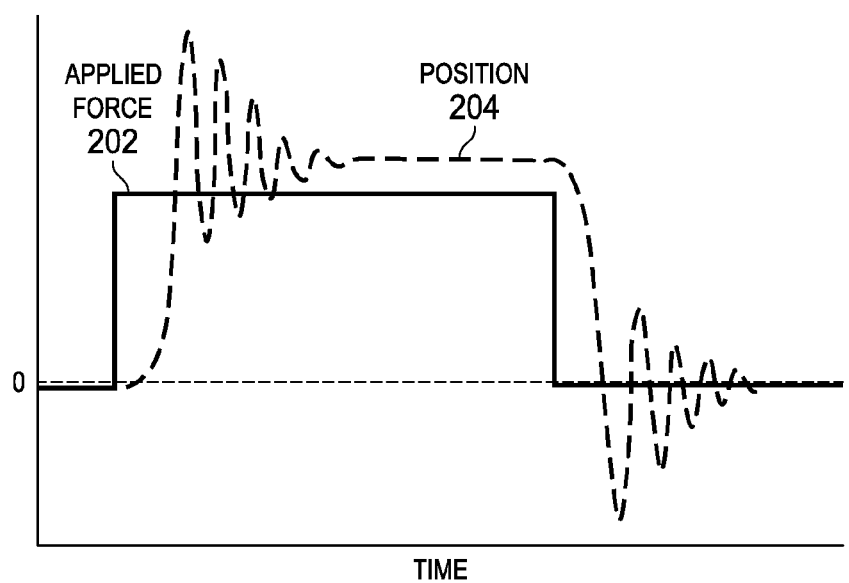
FIG. 16 illustrates a response of a MEMS mirror to an applied voltage.

FIG. 16 illustrates a graph of the mirror positional response as a sprung mass to a sudden step in applied force, such as from the electric field resulting from applying a voltage to an electrode beneath the mirror. Curve 202 shows the applied electrostatic force, and curve 204 shows the position of the mirror. There is significant ringing when the electrostatic force is applied, until the mirror reaches its final position under static load. When the electrostatic force is removed, there is again ringing.

Figure 17:
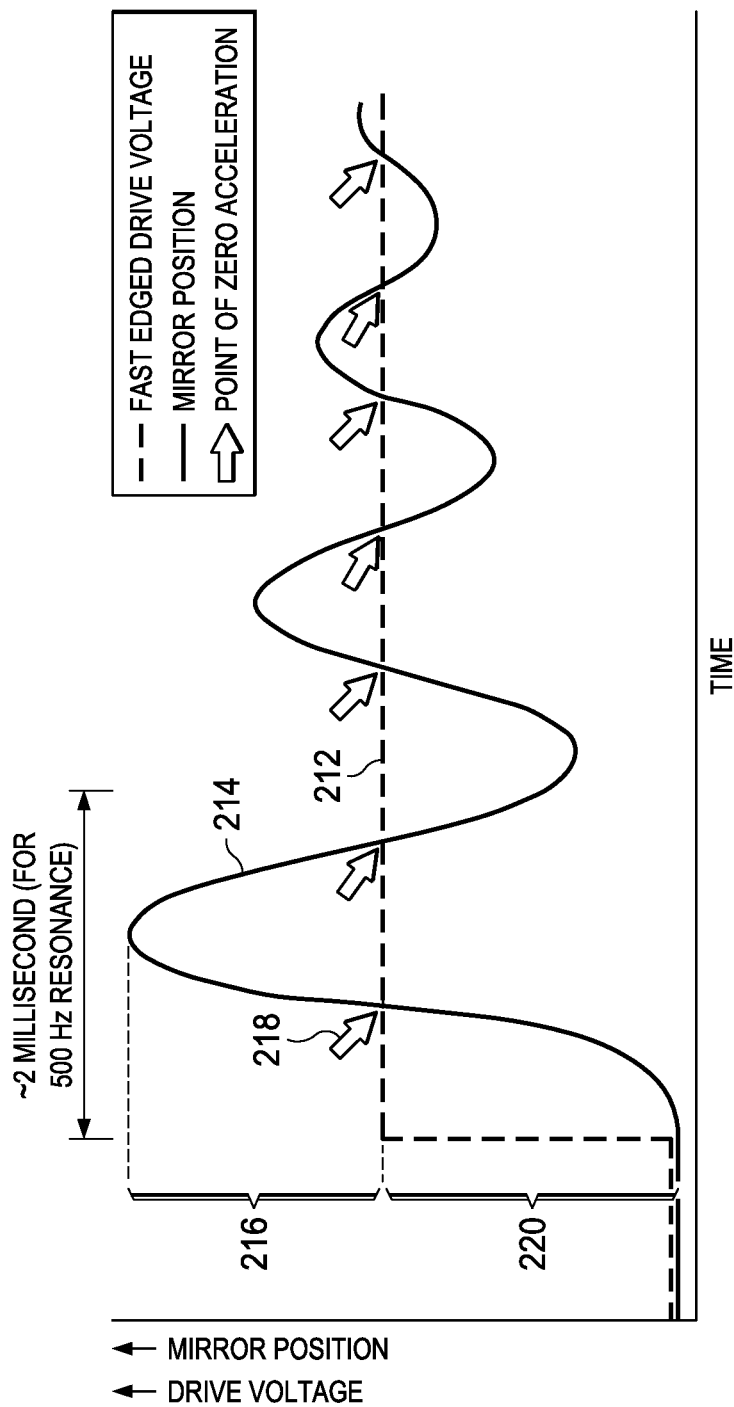
FIG. 17 illustrates a response of a MEMS mirror to a fast edge waveform.

FIG. 17 illustrates another graph of mirror position and drive voltage. Curve 212 shows the applied drive voltage, and curve 214 shows the mirror position. In region 220, the mirror undergoes decreasing acceleration but increasing velocity as spring forces build to counter electrostatic point. At point 218, the zero acceleration point, there is the maximum velocity and maximum kinetic energy. In region 216, the mirror undergoes increasing deceleration and velocity reversal as spring forces exceed electrostatic forces. The overshoot continues to increase until all of the kinetic energy in the mirror due to its movement is converted into potential energy in the spring. At this point, the mirror stops, but the spring is at a higher tension than can be counterbalanced by the electric field, since the mirror is at a deflection angle beyond the target where the spring pressure would be balanced by the electric field. The springs then release their excess potential energy by accelerating the mirror back towards the target position. However, once the excess potential energy from the springs is released, which occurs as the mirror reaches the target position, all of the released potential energy has be transferred to kinetic energy. Again, as the mirror reaches its maximum velocity, it passes through the target position, creating an undershoot. The excess potential energy is the potential energy above what is implied by the backpressure of the spring when the mirror is stationary at the target angle set by the drive voltage. In a completely lossless system with an infinite quality factor, Q, and a damping ratio, $\zeta$, of zero, the process continues forever. However, in a practical system, friction forces or damping forces dissipate this energy over multiple oscillations. Hence, the resonance between the kinetic energy of the mirror and the potential energy of the springs dissipates.

Q is defined in terms of the ratio of the energy stored in the resonator to the energy supplied by a generator, per cycle, to keep the signal amplitude constant at the resonant frequency, $f_r$. The stored energy is constant with time. Q is defined as:

$$Q = 2\pi \frac{\text{Energy Stored}}{\text{Energy dissipated per cycle}} = 2\pi f_r \frac{\text{Energy Stored}}{\text{Power loss}}.$$

The damping ratio is given by:

$$\zeta = \frac{1}{2Q}.$$

The dissipative elements may include the air surrounding the mirror, spring losses from a non-perfect spring system or non-perfect spring material, and electrostatic damping due to the changes of mirror-electrode capacitance as the mirror moves. Because the mirrors are tiny and the movements are small, the velocity is not large, and air damping is probably small. Spring losses depend on the nature of the spring design, the choice of spring material, and whether that material exhibits ideal lossless elastic characteristics. When the spring is silicon under torsional stress, it does not provide a very high damping. Some damping may be achieved electrostatically by using the change in capacitance to remove energy from the system. However, this causes the drive voltage to only ramp slowly. This is effective for preventing the buildup of too much energy in the system, but creates significantly longer switching times.

Figure 18:
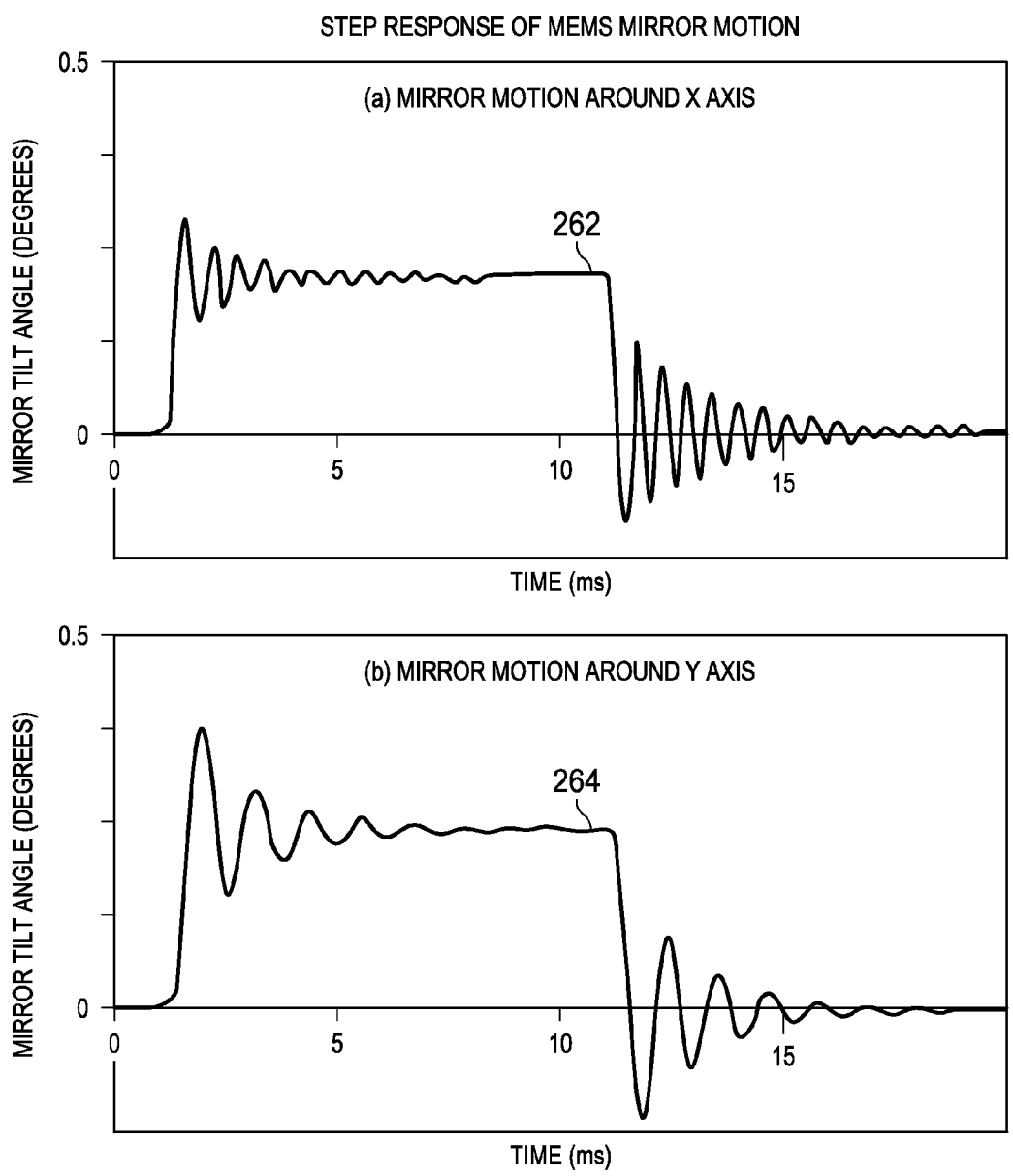
FIG. 18 illustrates step responses of MEMS mirrors.

The damping forces on the mirror movement are relatively light. Hence, the resonances continue for several cycles. FIG. 18 illustrates graphs of mirror tilt in the x and y axes for an example mirror with a Q factor in the single digits. Curve 262 shows the mirror position in the x axis and curve 264 shows the mirror position in the y axis. The resonant frequencies in the two axes are different. This may be due to mismatch in spring constants or due to a mismatch in the sprung masses in the two axes. In one axis, the sprung mass is the mirror, while in the other axis, the sprung mass is the mirror, its springs, and the gimbal ring carrying the mirror. Hence, for similar spring constants, the resonant frequencies are rather different.

Figure 19A:
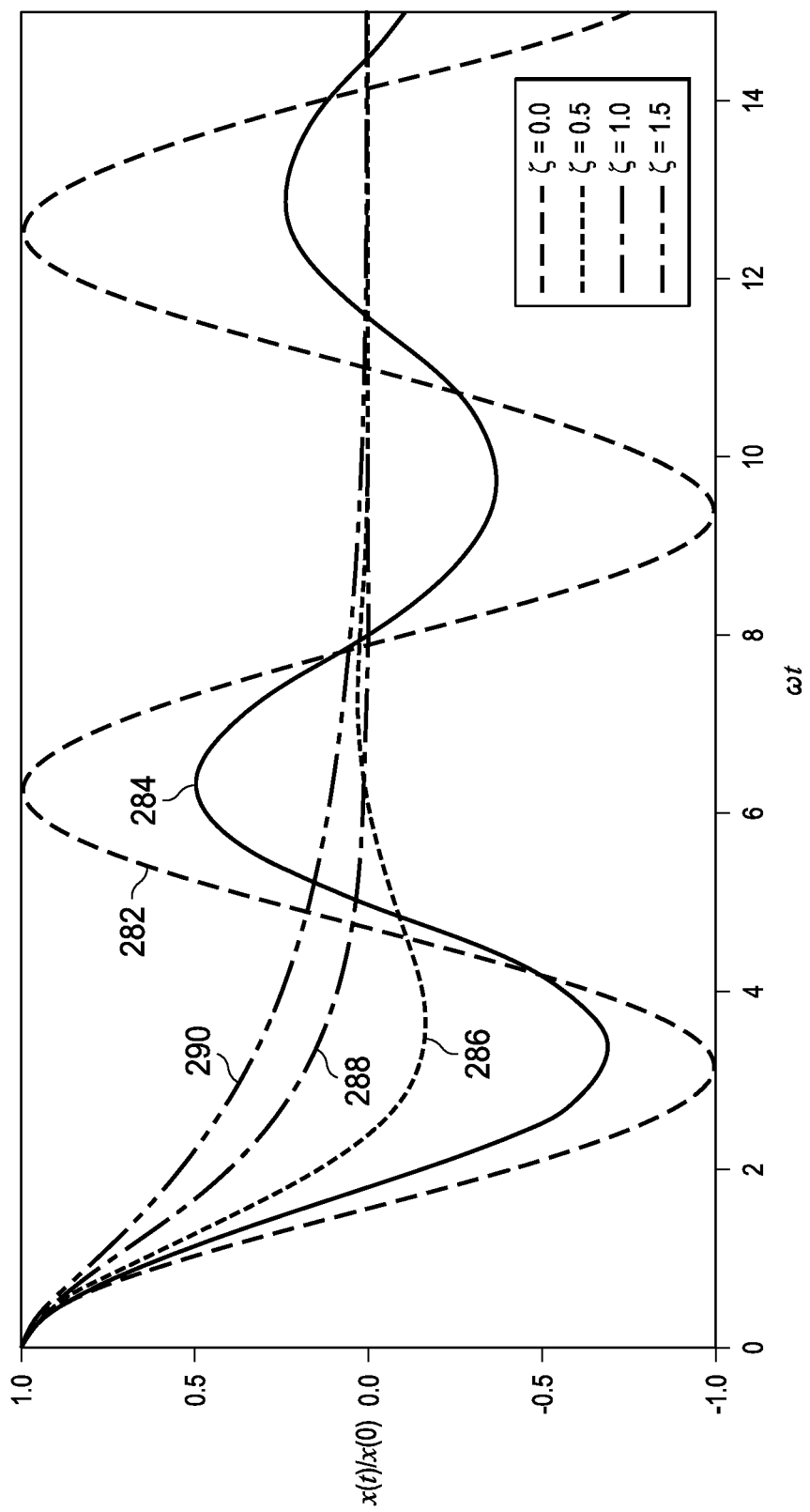
FIGS. 19A-19B illustrate the response of a sprung mass to an impulse.
Figure 19B:
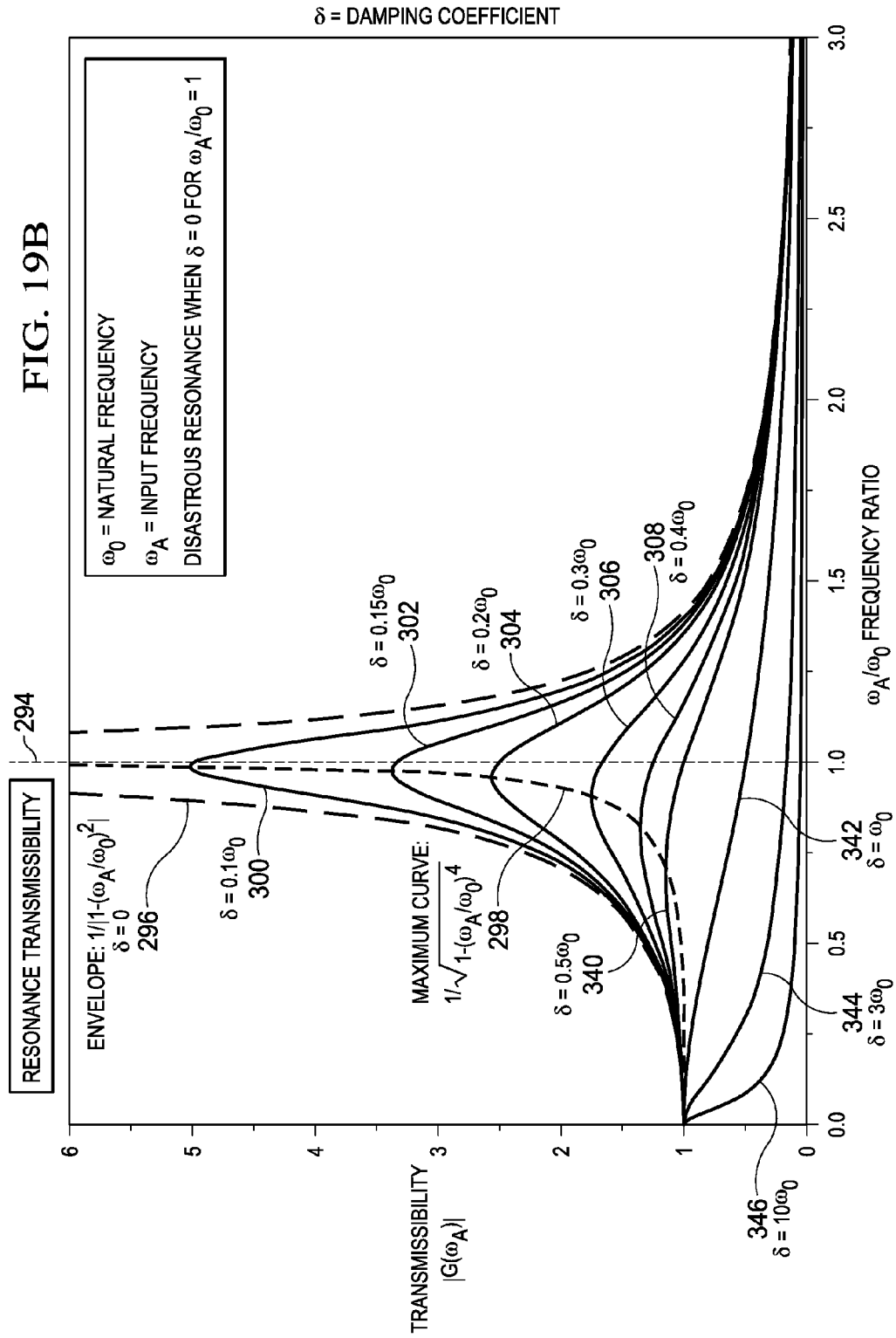

When the mirror system is hit by a vibration impulse, it acts as a sprung mass, and will move in a manner described by the mathematics of a sprung mass multiplied by the mathematics of that particular impulse. FIGS. 19A-B illustrate the behavior of a sprung mass responding to an impulse. FIG. 19A shows the response in the time domain, while FIG. 19B shows the response in the frequency domain.

In FIG. 19A, curve 282 is for $\zeta=0.0$, curve 284 is for $\zeta=-0.2$, curve 286 is for $\zeta=0.5$, curve 288 is for $\zeta=1.0$, and curve 290 is for $\zeta=1.5$. The response is highly variable dependent on $\zeta$. For high Q low $\zeta$ springs, the impulse causes a sine-wave motion with time as a characteristic resonant frequency around the displaced position. The peak-to-peak of the sine-wave is twice the displacement. As $\zeta$ increases and Q falls, the sine-wave oscillation becomes progressively more rapid over time. The time constant of the decay is determined by Q, where the lower the Q the faster the decay. At $\zeta=0.5$, the sine-wave characteristic is so attenuated that the response becomes a fast movement to an approximately 20% overshoot followed by a damped settling to a final position. For a $\zeta$ above about 1, the system shows no overshoot, just a damped but slow response to the input deflection.

FIG. 19B illustrates the sprung mass system response to mechanical input, such as a vibration event, or a mechanical force resulting from an electrostatic force as a function of frequency. In FIG. 19B, the resonant frequency is illustrated by curve 294, the envelope for $\zeta=0$ is shown by curve 296, curve 298 is the maximum curve, curve 300 for $\zeta=0.1\omega_o$, curve 302 is for $\zeta=0.15\omega_o$, curve 304 is for $\zeta=0.2\omega_o$, curve 306 is for $\zeta=0.3\omega_o$, curve 308 is for $\zeta=0.4\omega_o$, curve 340 is for $\zeta=0.5\omega_o$, curve 342 is for $\zeta=\omega_o$, curve 344 is for $\zeta=3\omega_o$, and curve 346 is for $\zeta=10\omega_o$. The envelope is:

$$\frac{1}{\left|1-\left(\frac{\omega_A}{\omega_o}\right)^2\right|},$$

where $\omega_A$ is the input frequency and $\omega_o$ is the natural frequency (resonant frequency $f_r$). The maximum curve is given by:

$$\frac{1}{\sqrt{1-\left(\frac{\omega_A}{\omega_o}\right)^4}}.$$

The response is highly dependent on $\zeta$. A transmissibility or amount of the input movement at that frequency that is reflected in movement of the sprung mass of 1 at low frequencies, building up to a high value at the resonant frequency for a high Q or reducing in amplitude by the resonant frequency for a low Q. For a $\zeta$ of about 0.1-0.3, the response is an increase in transmissibility of up to about 1.5-5 at the resonance, followed by a monotonic reduction in the response to higher frequency inputs as the input frequency increases beyond the resonance.

Figure 20:
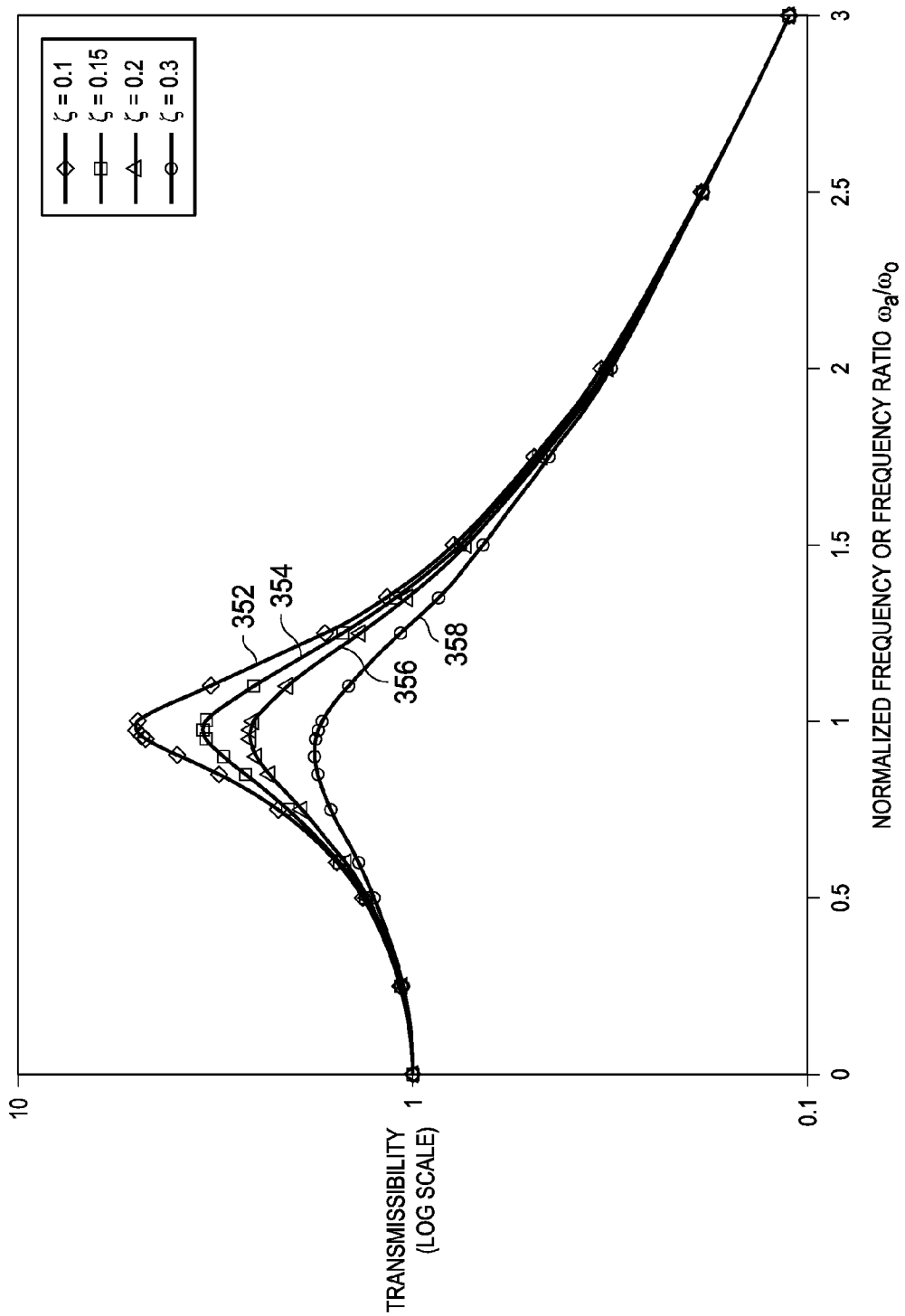
FIG. 20 illustrates the response of a sprung mass to an impulse.

FIG. 20 illustrates the transmissibility versus frequency on a logarithmic scale. Curve 352 shows $\zeta=0.1$, curve 354 shows $\zeta=0.15$, curve 356 shows $\zeta=0.2$, and curve 358 shows $\zeta=0.3$. There is a monotonic roll-off of response above the resonance point, normalized at a frequency ratio of 1. A typical resonance frequency (f=1) would be several hundred hertz or a few kilohertz, typically well under 10 kHz.

When mirrors are initially moved in a setup process using integrated photodiodes, the mirror position is determined by calculating the required deflection angles that need to be applied from the mirror's previous rest position, deriving the new deflection steady state deflection voltages in the X and Y axes and applying these voltages such that the mirror deflects the beam into the zone of uncertainty. When a mirror is pointing its beam into the zone of uncertainty and hence approximately in the general direction of the target mirror, the positional error of that beam from the target is calculated, and a correction vector for the beam, and hence the mirror pointing angle, is computed. From the pointing angle versus drive voltage characteristics in the two axes, a new or modified set of electrode drive voltages is calculated. If either or both of these processes is carried out accurately, the application of the new drive voltages results in the mirror pointing at the center of the target mirror. If there are errors in the calculation or measurement, or in the mirror pointing angle versus voltage drive characteristics, the eventual position of the beam will be pointing much closer to the target mirror, but not directly at the mirror. An iterative process may place the beam into better alignment.

If the changed drive voltage is applied suddenly, the voltage waveform contains frequency components with energy at the resonant frequency of the mirror-spring subsystem. This results in an amplified mirror positional response, resulting in overshoot and damped oscillatory ringing. The final responsive mirror position after the drive voltage level changes is not reached until this dies away, which may take 5-10 oscillation periods or more, greatly extending the settling time. For example, with a 500 Hz resonance, settling might take 10 milliseconds or more.

Figure 21:
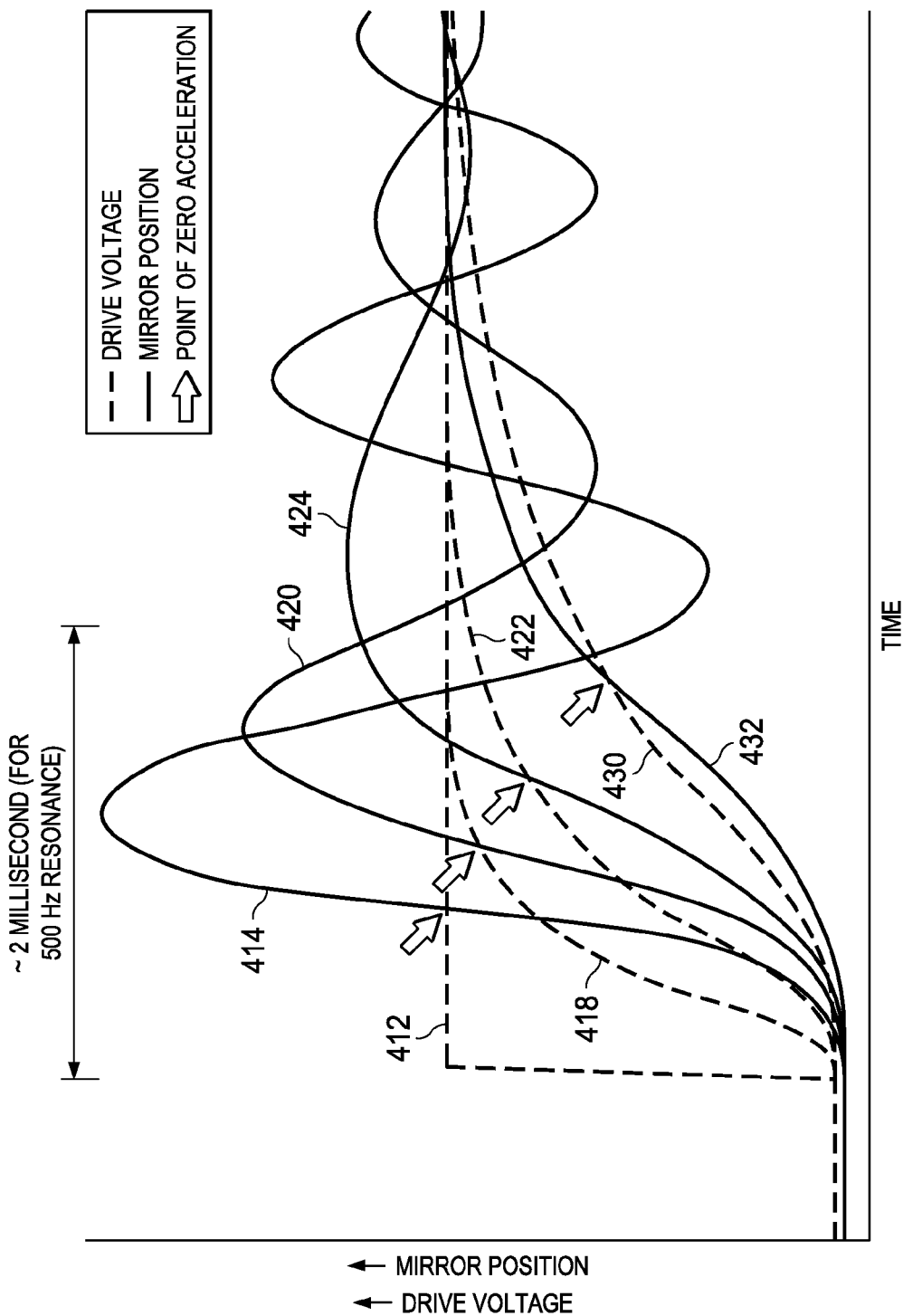
FIG. 21 illustrates MEMS mirror responses to various drive waveform rise times.

One solution is to remove those frequencies coincident or close to the mirror mechanical resonance frequency from the drive waveform. This leads to a slower rise time waveform, while retaining some residual ringing and overshoot unless the rise time is very long. FIG. 21 shows the mirror position response to various drive voltage edge waveforms. When a voltage of curve 412 is applied, the response is curve 414, when a voltage of curve 418 is applied, the response is curve 420, when a voltage of curve 422 is applied, the response is curve 424, and when a voltage of curve 430 is applied, the response is curve 432. Because the mirror movement lags the waveform ramp in the early stages, but the mirror continues to accelerate, the point of maximum velocity occurs at the intended deflection for a step-value waveform. For a step voltage, the overshoot is significant. For slower waveform, the maximum velocity point occurs at a lower percentage of the intended deflection. The arrows indicate the point of highest velocity, where the polarity of the acceleration reverses. After these points, the spring forces exceed the still ramping electrostatic forces, providing deceleration. Because this happens at a lower percentage of the intended deflection for slow edged drives, this results in less excess kinetic energy being injected into the mirror to trigger the mechanical sprung-mass resonance. The slower drive edges have less overshoot as the rise time increases, because the mirror stops accelerating before the full amplitude, resulting in lower kinetic energy and more spring action braking of the mirror. At one critical rise-time, the peak mirror kinetic energy as acceleration passes through zero equals the stored potential energy at the final deflection. This is the fastest ramp that can be used with a simple single polarity drive signal without triggering resonance. Much of this energy may be removed by the time the mirror reaches 100% of the deflection. However, this approach is slow. For example, the mirror movement takes about 3-5 ms for a 1,000 Hz resonance mirror.

The behaviors illustrated in FIG. 21 occur because, to move the mirror from its starting position to its final position in a short time, velocity, and hence kinetic energy, are injected into the mirror-spring system, which has to be removed from the system before the mirror becomes stationary again. The use of a fast rise time drive waveform results in high velocities and high kinetic energies, which takes time to bleed away due to spring damping. Long rise times of the drive waveform result in lower velocities and less kinetic energy imparted to the mirror that then has to be dissipated against rising spring tension as the mirror follows the final part of the slow drive waveform, where the rate of change of voltage with time is decreasing.

Figure 22:
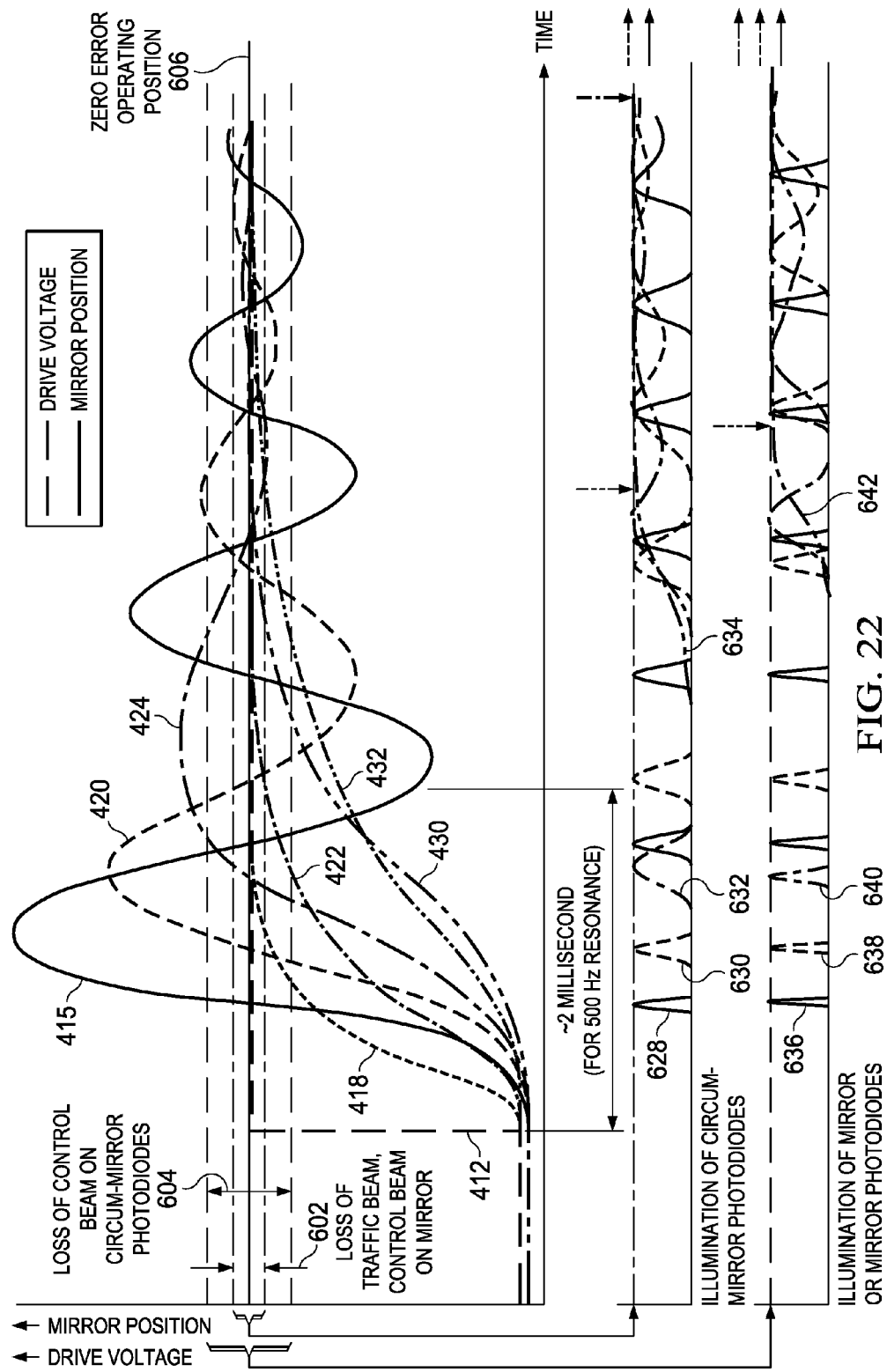
FIG. 22 illustrates the effects of resonant overshoot on a MEMS mirror.

FIG. 22 illustrates the effects of overshoot and resonant ringing of FIG. 21 on the operation of the MEMS system. FIG. 22 shows the waveforms and mirror responses of FIG. 21 overlaid on the tolerances on the deflection angles for the loss of the traffic beam on the mirrors and the loss of control on the interstitial photodiodes. Lines 604 mark the onset of the loss of the control beam on interstitial photodiodes surrounding the target mirror and lines 602 show the onset of loss of the traffic beam from the mirror once the beam moves above or below the area between the respective lines. Line 606 shows the zero error operating position. The lower portion of FIG. 22 shows the illumination of mirror photodiodes and interstitial photodiodes. For mirror position 415, curve 628 shows the illumination of interstitial photodiodes, and curve 636 shows the illumination of mirror photodiodes. For the mirror position over time shown by curve 420, curve 630 shows the illumination of mirror photodiodes, and curve 638 shows the illumination of mirror photodiodes. For the mirror position over time shown by curve 424, curve 632 shows the illumination of interstitial photodiodes, and curve 640 shows the illumination of mirror photodiodes. For the mirror position shown over time by curve 430, curve 634 shows the illumination of interstitial photodiodes and curve 642 shows the illumination of mirror photodiodes. The resonance is large enough that for extended periods of time the photodiodes are only illuminated as flashes as the beam oscillates. The beam also disrupts neighboring mirror control systems during this time. When there is a sufficiently slow edged waveform of about 4-5 ms for a 500 Hz resonance, the beam moves without overshoot. This adds significant time to the switching connection time.

Snap-down may be a problem for electrostatically deflected MEMS mirror cells. Beyond a certain drive voltage and mirror position, the rate of increase of electrostatic force on the mirror increases faster with incremental deflection than does the spring backpres sure, even if the drive voltage is held constant. At that point, the electrostatic force overwhelms the spring pressure, and the mirror snaps to an end position, causing snap-down. Snap-down causes loss of control of the mirror. Also, snap-down may damage or destroy the mirror or its gimbals. Snap-down comes about due to the drive voltage deflecting the mirror to a point where the closing gap between the mirror decreases rapidly, resulting in the electric field increasing more rapidly with deflection angle than the spring tension holding the mirror in position, because the force on the mirror is proportional to the electric field. The electric field is the potential difference (drive voltage) divided by the gap distance. The electric field goes to infinity as the gap distance goes to zero. If the mirror, through mechanical overshoot, reaches a position where it is more deflected than intended, the resultant electric field will be increased, and the mirror may snap down. Hence, if the mirror is driven by a fast waveform so it can overshoot, the amplitude of that overshoot should not reach the snap-down angle for that drive voltage, or mirror positional control will be lost. Because the overshoot may reach over 100% in a highly undamped mirror system, the maximum intentional deflection may be limited to about 50% of the snap-down angle, reducing the area by the conical angle of allowable deflection to about 25% of that possible if the mirrors could be deflected to just below the snap-down angle. With slow waveforms, it is problematic to approach closer than about 80-90% of the snap-down angle, because the mirror movements with drive voltages changers become extreme, affecting control system loop gain.

To improve switching time and prevent snap-down the dynamic mirror movement may be better controlled. The mirror position may be measured, and the mirror radial velocity and acceleration determined, resulting in position, velocity, and acceleration in real time with fine time granularity. This data may be used to control the mirror so that it reaches a high velocity en-route to its target position, resulting in a fast path towards the target mirror for the control beam. However, as the control beam approaches the target mirror, it may be actively slowed so that it is no longer at its maximum velocity, but is decelerating, so its velocity reaches zero at the target angle. Hence, the beam may arrive at the target mirror with no excess kinetic energy. In one example, this is achieved through drive waveform shaping with electrostatic braking. In another example, this is achieved through real time control of the drive signal. Real time control of the drive signal may be based on dynamic or real-time measurements of the mirror position, distance to the target, velocity, and acceleration, and using a model of the mirror dynamic mechanical properties. These two approaches may be combined.

Figure 23:
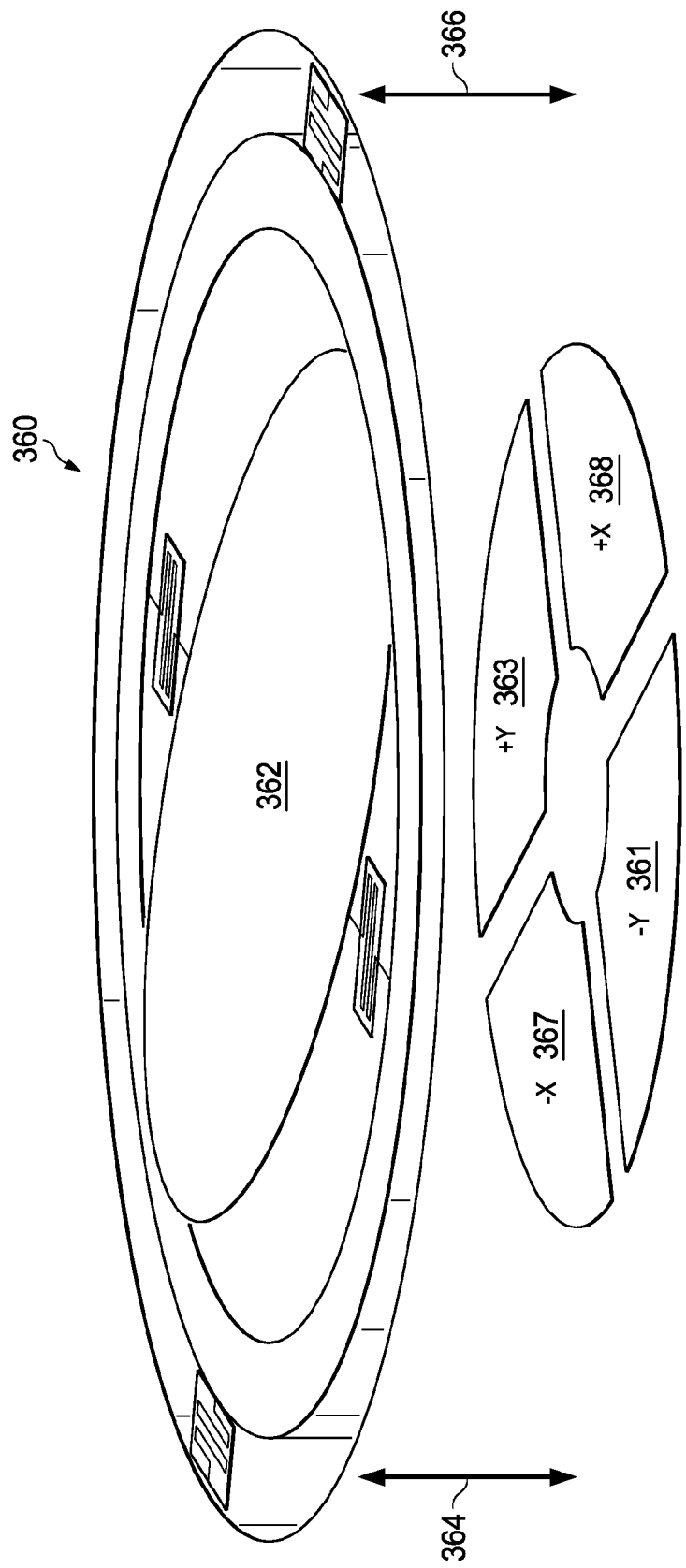
FIG. 23 illustrates an embodiment MEMS mirror with drive electrodes.

FIG. 23 illustrates MEMS mirror structure 360 containing MEMS mirror 362, a 1 mm diameter mirror. On the left side, there is gap 364, which is an approximately 0.006 to 0.10 mm gap. On the right side, there is gap 366, which is an approximately 0.06 to 0.10 mm gap. With a five degree tilt, the mirror edge moves about 0.0087 mm further away from electrode 367. Hence, the field strength at the attracted edge of the mirror for a given voltage increases by 14.5%, contributing to an increase in deflection sensitivity of somewhat less than 14.5%. The actual value depends on the shape of the electrode, because it is the integral of the field elements area x moment with a non-even gap, and hence the field, that determines the attractive force across the mirror radius. Electrode 368, which may be used to decelerate the mirror, experiences a slight drop in sensitivity, as the field strength at the mirror edge falls by about 12.6%.

The electrostatic force generated when a voltage is applied to the appropriate deflection electrode accelerates the electrode away from zero deflection. The voltage generates an electric field proportional to the voltage divided by the gap, which develops an attractive force proportional to the electric field and area of the electrode. The electrostatic force creates a turning momentum on the mirror based on the distance of the electrode area from the center of the mirror, or the pivot line. Hence, the turning moment on the mirror is the integral of the field force times the area times the moment of that area. The attractive force is proportional to the field, and acts against the torsion spring tension. As the deflection angle increases, the gap decreases, increasing the electric field for a given voltage. Hence, as deflection increases, the mirror becomes more sensitive to drive voltages.

To decelerate the mirror or accelerate the mirror towards a lower deflection, there are two forces that may be used. The forces are the torsion spring tension, which nominally increases linearly with deflection, and the electrostatic forces from driving the opposing electrode with a voltage. Driving the opposing electrode creates an electric field proportional to the voltage divided by the gap. The attractive force is proportional to the integral of the field times the area times the moment. The electrostatic force acts in concert with the spring tensions. As the deflection angle increases, the gap increases. Hence, mirror deceleration by an electrostatic force becomes somewhat less sensitive to drive voltage changes as the mirror deflection increases.

Whether the mirror is being electrostatically accelerated or decelerated, the applied drive voltage creates a force, and the force creates an acceleration. Integrating the acceleration by applying the voltage for a time period creates a velocity change, and integrating the velocity yields the position change. Photodiodes detect the instantaneous position of the beam. The derivative of the position over time yields the velocity, and the derivative of the velocity over time gives the acceleration.

A forward drive pulse may be used to provide kinetic energy to the mirror in excess of the potential energy the spring tension requires at the target angle. Then, the energy is removed as the mirror approaches its target location with electrostatic braking. This may lead to very fast switching with no resonance.

The drive waveform may be modified to provide more energy to the mirror system. Then that energy is actively removed from the mirror system at an appropriate time. The target mirror position is determined and a deflection angle vector is calculated. The vector angle is then mapped to a final drive voltage. However, this voltage is not immediately applied to the electrodes. Instead, a calculated larger voltage is applied to those electrodes for a short period of time. The period of time and/or the voltage is determined by the amount of kinetic energy to be placed in the mirror and the distance to move the mirror. This is a function of the mirror's current position and the final target position. The electric field of these drive signals on the electrodes creates an impulse of force on the mirror, causing it to rapidly accelerate to move in the desired direction. This impulse is calculated to be the magnitude, which is time multiplied by the voltage, so the mirror is accelerated to an excess of the required velocity to propel the mirror through its target pointing angle, and the beam through its target destination, against the known rising spring tension. As the mirror moves towards its target angle, it will slow due to spring back pressure, which is rising. To prevent excess velocity leading to an overshoot and oscillation, as the mirror approaches its target destination, a second impulse is applied to the opposing electrodes. This second impulse eliminates the kinetic energy, so the mirror decelerates due to the combination of rising spring back-pressure and an electric field operating on the other side of the mirror in concert with that spring back-pressure. The mirror may be brought to rest just as it reaches the target angle and the beam reaches its target location. At the moment that the mirror comes to rest, a calculated maintenance drive voltage is applied, and the mirror stays at rest, because the spring back-pressure matches the electrostatic force on the mirror. If the mirror comes to rest at the correct angle, it will not have excess kinetic energy to trigger the mechanical resonances with the spring. If the calculated static deflection drive voltage is accurate, the mirror remains at rest at the correct pointing angle due to the balance between the resultant electric field forces of the static drive voltage and the static spring tension at the deflection angle.

Figure 24:
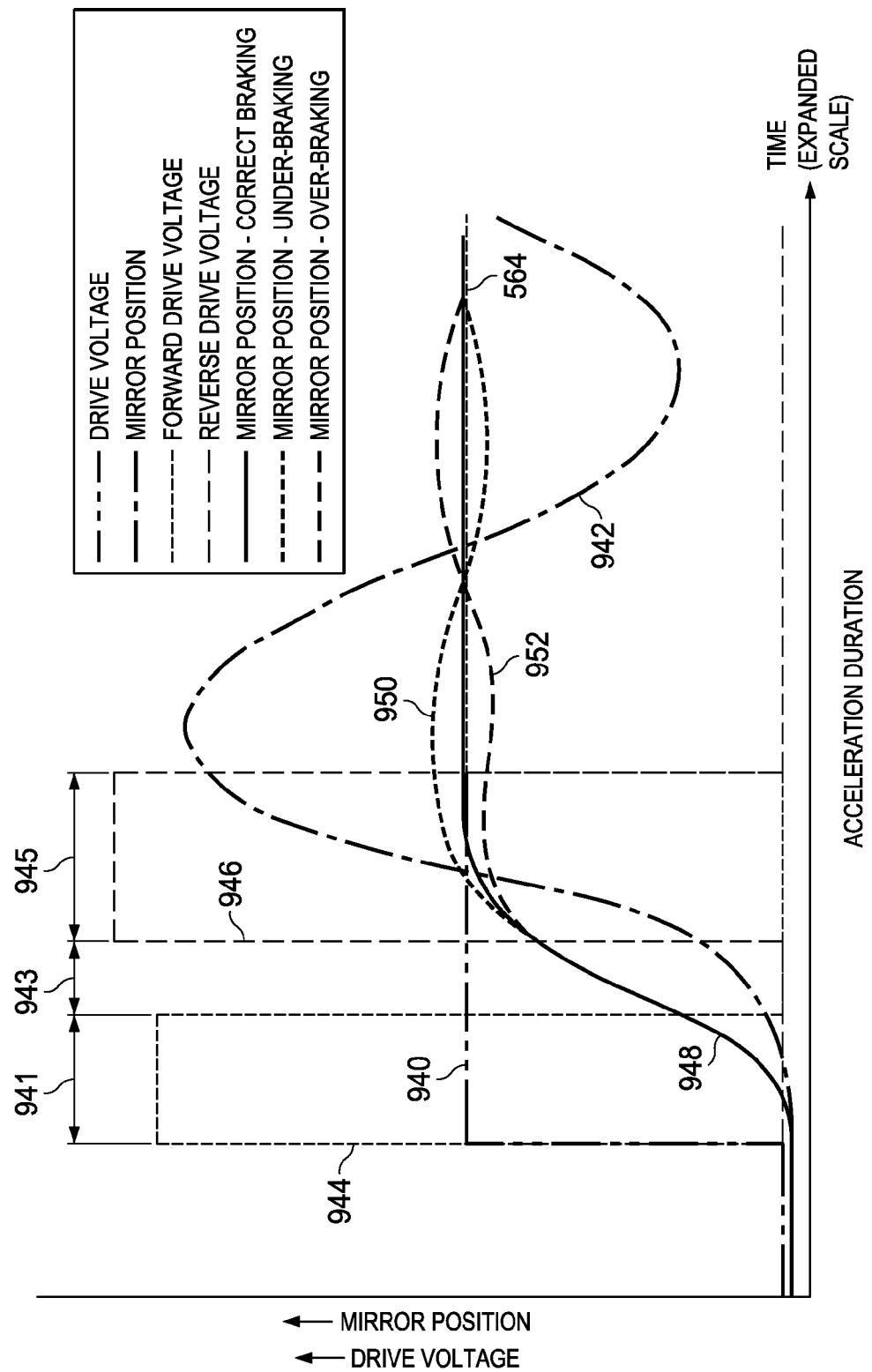
FIG. 24 illustrates impulse acceleration and deceleration to move a MEMS mirror.

FIG. 24 illustrates examples of the drive waveform and the resultant mirror movement, along with the response, to an acceleration pulse followed by a deceleration pulse. When sharp edged waveform 940 at the final drive voltage is applied, the mirror oscillates along curve 942 as previously described. Alternatively the mirror can be driven with an acceleration impulse and a deceleration impulse. Waveform 944 is the acceleration voltage impulse for final deflection, and waveform 946 is applied on the opposite plates for braking. Waveform 944 is applied for initial acceleration duration 941. Curve 948 shows the response with accurate braking, curve 950 shows the response for under-braking, and curve 952 shows the response for over-braking. During the time between the application of the acceleration voltage and the braking voltage, duration of coasting 943, the mirror coasts towards its final position, retarded by the spring pressure. The fastest switching occurs when the coasting period is eliminated, and the acceleration and deceleration times are expanded. While the braking voltage is applied, there is a period of deceleration 945. The deceleration voltage may be applied for a longer time than the acceleration voltage, because the larger electrode-mirror gap reduces the deceleration for an applied voltage. Alternatively, the deceleration voltage is higher than the acceleration voltage when the mirror-electrode gap is larger on the deceleration electrode side of the mirror. A drive voltage for the correct mirror angle is applied when braking is completed. The mirror reaches its final position with zero velocity, and therefore with zero kinetic energy.

The mirror is accelerated hard by an overdriven electrode voltage, producing a high electric field. After a finite time, the electrode voltage is removed. At this point, the mirror has picked up a velocity in excess of what it needs to coast past its required operating angle, even though the spring back pressure is acting against that velocity, and the spring back pressure is rising with increasing deflection angle. At an appropriate time, a high drive voltage is applied to the electrodes on the opposite sides of the mirror for a predetermined duration to decelerate the mirror further. If the amplitude, timing, and duration of the reverse drive is correctly chosen, the mirror decelerates so that it reaches zero velocity as it reaches the required operating angle. The calculated static drive voltage is applied to hold the mirror in position without ringing, because the mirror is at zero velocity, zero acceleration, and zero displacement error from its final position. However, if the mirror stops short of that point or overshoots that point, a resonance with a magnitude proportional to the error (and much smaller than with drive waveform 940) is triggered.

Because the mirror is at an offset angle, the gap between the mirror and the opposing or braking electrodes has increased rather than decreased, so the effect of even a large drive voltage is somewhat limited in terms of braking forces. The amplitude of this effect is dependent on the mirror-electrode geometry and the changes in the mirror-electrode gap, which is a function of deflection angle. In MEMS mirror structure 360, this effect would be significantly less than a 27% peak-to-peak sensitivity change. It is dependent on the detailed electrode shape and highly dependent on the mirror center to electrode gap. However, the braking forces of the electric field brake are assisted by the spring tension, instead of being opposed by the spring tension for the case of the acceleration. The magnitude of the electrostatic braking effect can be significantly less than the electrostatic acceleration. The electrostatic acceleration provides enough kinetic energy to move the mirror to the correct static position, where it becomes kinetic energy, plus some level of excess kinetic energy, whereas the electrostatic brake just has to remove the excess kinetic energy so the mirror becomes stationary.

The tolerances and accuracy of the timing to avoid over-braking or under-braking may be tight. Errors in the impulse levels or timing may lead to the mirror being left in an incorrect position relative to the target position, which becomes a damped resonant mirror movement at a lower or much lower amplitude than for a step voltage. Or, the mirror may be left with some residual motion, which will turn into angular error that dissipates as the mirror returns to the position determined by the drive voltage.

In an embodiment real time control system, the mirror position, velocity, and acceleration are continuously measured and derived. Computations are made to determine whether to put energy into the mirror system or to extract energy into the mirror system to move the mirror quickly while bringing the mirror to a state of zero velocity at the target location. This computation may be performed using a software model of the mirror dynamics that is built into the mirror control system. The energy input and mirror motion or energy extraction and mirror motion may be rapidly and accurately computed, and the appropriate adjustments are made to the drive voltages.

There are two examples where kinetic energy is taken out of the system. In one example, as the mirror deflection angle increases, mirror kinetic energy is transferred to torsion spring potential energy. The torsion spring stores a constant amount of potential energy once the mirror is stabilized at its final resting point. However, it is possible for the spring to absorb a certain amount of potential energy, the amount represented by the static deflection angle and the integral of the spring back pressure, without triggering a resonant reaction. In another example, the electrode plates on the opposite side of the mirror are used as an electrostatic brake. However, because the gap on the side approached by the mirror exhibits a decreasing gap, resulting in a higher electric field, the opposing electrode plates exhibit a large and increasing gap, requiring a higher drive voltage to create the same electric field and braking force. Hence, higher voltages, longer braking periods, or both may be used for the same level of velocity change with electrostatic braking.

When a mirror is at rest at its final pointing angle, the force on the mirror from spring tension back-pressure is equal to the force on the mirror from the electrostatic fields between the mirror and the electrodes. The energy in the mirror system is in the form of potential energy stored in the springs of the mirror system, and the mirror is stationary relative to its surroundings.

A vibration impulse introduces excess energy into the system by causing the mirror to move relative to its surroundings, because the mirror is resiliently mounted on gimbal springs. Due to the resiliency of the gimbal springs, instead of moving with the surroundings, the mirror can move differentially to its surroundings, altering the mirror position in the gimbals and the mirror pointing directions. The mirror-spring system acts like a sprung mass in the presence of a mechanical impulse. A vibration even may have a range of magnitudes and directions. The event may include linear and rotational components. The mirrors may convert a linear vibration impulse into rotational mirror motion, for example, if the center of mass of the mirror is not in the plane of the torsion spring. The vibration event may cause various differential movements of the mirror relative to the mirror's surroundings, depending on the nature and direction of the vibration impulse events. After the event has passed, the mirror may retain some continuing movement relative to its surroundings as well as be in a different position than before the vibration event. Hence, energy is injected into and captured by the mirror mass. This energy, along with the mirror movement and positional error may be removed from the system to make the mirror stationary again.

The vibration impulse sets the mirror into its mechanical resonance or resonances. There are a variety of possible resonances. One resonance is the rotational resonance of the sprung mass versus the spring torsional forces of the vertical gimbal. This is rotational movement in the X plane. There is also the rotational resonance of the sprung mass versus the spring torsion forces of the horizontal gimbal, which is rotational movement in the Y plane. One of these resonances includes the gimbal ring, while the other does not. Another resonance is the movement of the mirror versus the gimbal ring in the Z plane orthogonal to the gimbal plane of the zero-drive mirror surface plane. This causes Z plane displacement operating against the plane retention forces of the gimbal springs. An additional resonance is the movement of the mirror-gimbal ring combination versus the surroundings in the Z plane orthogonal to the gimbal plane of the zero-drive mirror surface plane, causing Z plane displacement operating against the plane-retention forces of the gimbal springs.

The rotational movements cause mirror pointing errors. When the resonance event passes, the mirrors may be returned to alignment, or they may be out of alignment. This offset error may arise from the nature of the impulse and from the mirror/electrode system itself. The electric field between the mirror and the electrode, and hence the force between the mirror and the electrode, does not have a linear relationship with distance. Hence, during the vibration response cycle with unchanged electrode drive voltages, there is more of an increase in the electrostatic force on the mirror pulling it towards the electrode when the resonance reduces the mirror-electrode gap than there is reduction in the electrostatic force on the mirror pulling it towards the electrode when the resonance increases the gap by the same amount. Hence, the resonance from the vibration event causes the integral over time of the electrode-mirror electrostatic force to be somewhat increased for the duration of the resonance, causing an additional mirror pointing displacement in the direction of the mirror deflection before the event. This likely will die away afterwards as the mirror returns to its balanced position, because the spring tension is now greater than the electrostatic force.

An embodiment minimizes the rotational effects of a vibration event. A vibration event and its disruption of the mirror system are initially detected. Then, the effects of the vibration event in terms of measured mirror displacements and movements that affect the beam position are determined. Next, the mirror instantaneous errors in terms of position, velocity, and acceleration are computed. Based on the mirror error, the real-time correction to return the mirror to at rest and at the correct pointing angle is computed, and a corrective action is applied. The effectiveness of the corrective action is determined. This process is repeated at a high rate until the mirror is at rest in the correct position. Applying these steps rapidly and continuously immediately following the commencement of a vibration impulse event may significantly reduce the effect of the impulse, both in terms of the amount of mirror movement and the speed and efficiency of removing residual effects from the system.

An embodiment uses a MEMS mirror array with integrated photodiodes. The photodiodes may be placed interstitially between the mirrors, integrated on the mirrors, or in both locations. An expanded control beam may be used to facilitate the control beam landing on photodiodes.

Figure 25:
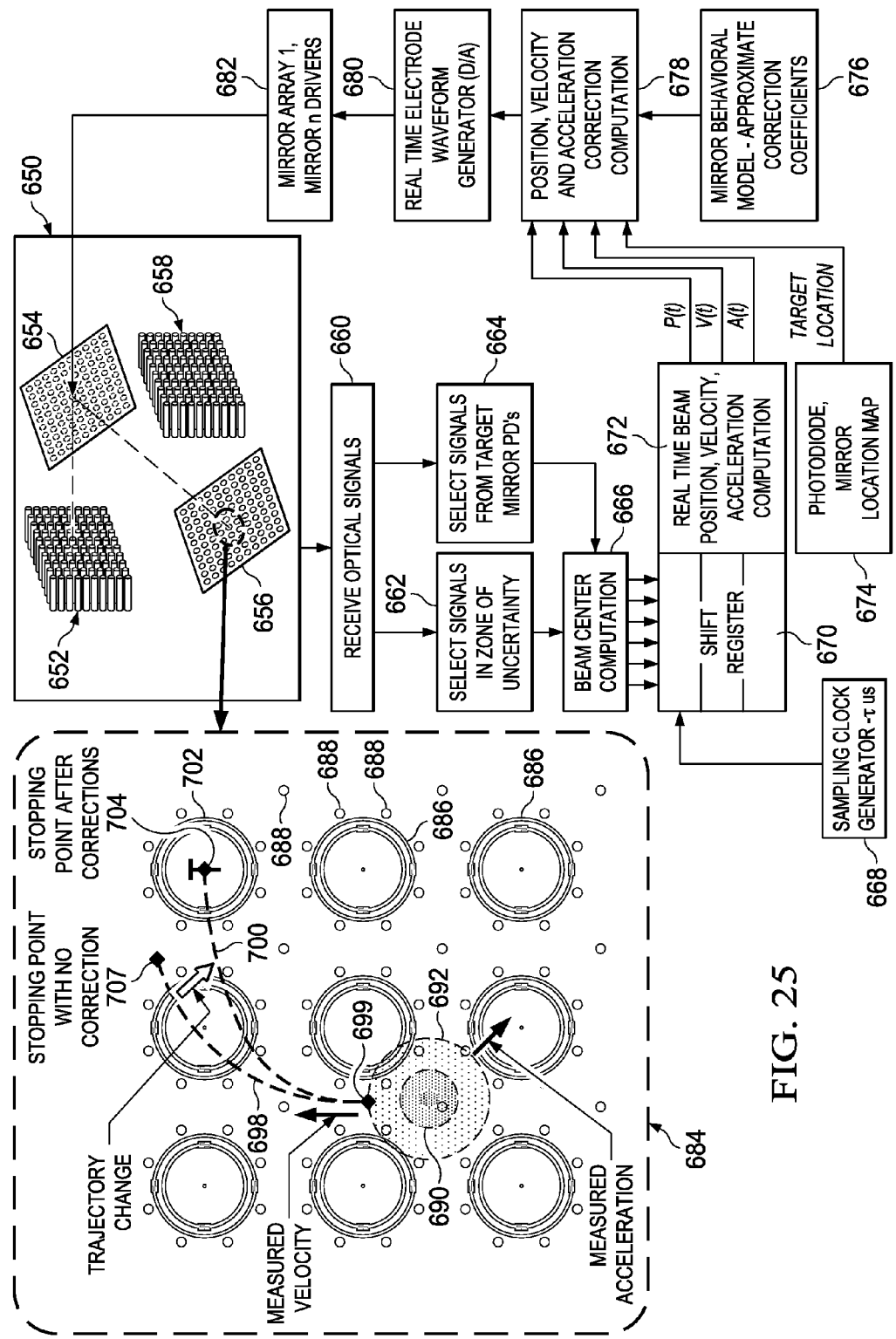
FIG. 25 illustrates an embodiment control system for controlling a MEMS mirror.

FIG. 25 illustrates an embodiment control system and an array of photodiodes for fast closed loop dynamic control of a mirror. Photodiode array 684 contains mirrors 686 and photodiodes 688, the photodiodes of which may be configured, for example, as shown in FIGS. 4A-E, FIG. 10, FIGS. 11 A-C, or other configurations. Traffic beam 690 and control beam 692 move across the mirror array. The control beam illuminates some photodiodes, causing the location of the beams to be detected. By comparing the received powers of the photodiodes, the location of the center of the control beam, P(t), may be determined with a fine time granularity based on power detected by three or more photodiodes. Comparing the locations of the measured beam in consecutive samples a short time apart, $\tau$, the average vector velocity V(t) of the beam may be determined. With a time granularity $\tau$, the average delay for the time of the measured velocity is $\tau/2$. The delay $\tau$ may be, for example, from about 0.5-20 μs with a shorter time giving better system time resolution but greater errors in velocity and acceleration calculations due to measuring smaller changes. Then, successive velocities may be compared to determine the acceleration, A(t). Hence, the position, velocity, and acceleration are determined on a real time basis. From these position, velocity, and acceleration values, the track of the beams may be determined. For example, track 698 would bring the beam to stopping point 707 away from target mirror 702. When the projected track does not pass over the target mirror, as in FIG. 25, a corrected track, track 700, with stopping point 704 on target mirror 702 is determined. A correction to the trajectory is approximately calculated, and an approximate desired acceleration and/or velocity is established to change the trajectory to more closely approach the target mirror or to pass over the target mirror with a velocity close to zero. This calculation and correction may be carried out iteratively based on the results of previously calculated. The new trajectory does not need to be accurate, and will lead to a converging result on the target mirror as long as the error is being reduced, because additional similar iterations may be performed. As long as the error margin is generally reduced, after multiple cycles, the error margin becomes very low. For example, if the error in the trajectory is reduced by an average of 30% in each cycle, after twenty measurement cycles, the error is 0.08% the original error.

MEMS module 650 contains collimator array 652 coupled to mirror array 654, which is opposite mirror array 656, coupled to collimator array 658. In the early part of the set up process, active control is not activated, because the control beam is not within the zone of uncertainty. The traffic beam enters through a collimator of collimator array 652 and is reflected off a mirror of mirror array 654 towards mirror array 656. The initial mirror pointing coordinates and drive voltages and the required acceleration impulse and nominal braking inputs are calculated or looked up. This may be based on the required mirror deflection angles from the overall device geometries. The acceleration impulse is applied, and, as the traffic beam (and virtual control beam) from the moving MEMS mirror approaches the target mirror, the deceleration impulse is applied. As the beam enters the zone of uncertainty the control beam is illuminated, and the dynamic real-time beam location is determined. The deceleration pulse may be applied before or after entering the zone of uncertainty. The traffic beam may be illuminated at all times, but this beam may be at a wavelength where the control photodiodes are unresponsive and, while this traffic beam does "splash" across other mirrors en route to the target mirror, the probability that those mirrors are oriented so as to cause coupling into their respective outputs is extremely low (and zero for in-traffic mirrors).

When the control beam is turned on, the responses of the photodiodes of mirror array 656 are received by receive optical signals block 660. From receive optical signals block 660, the photodiode responses are sent to selector 662 or selector 664. Selector 662 selects photodiodes in the zone of uncertainty, while selector 664 selects photodiodes associated with the target mirror. In the early stage, when the beam enters the zone of uncertainty, selector 662 is used, and for final alignment, selector 664 is used.

The selected photodiode signals are analyzed by beam center computation block 666. Beam center computation block 666 determines which photodiode locations are receiving beam energy. Based on the received energy, the beam center location over time is determined.

Figure 26:
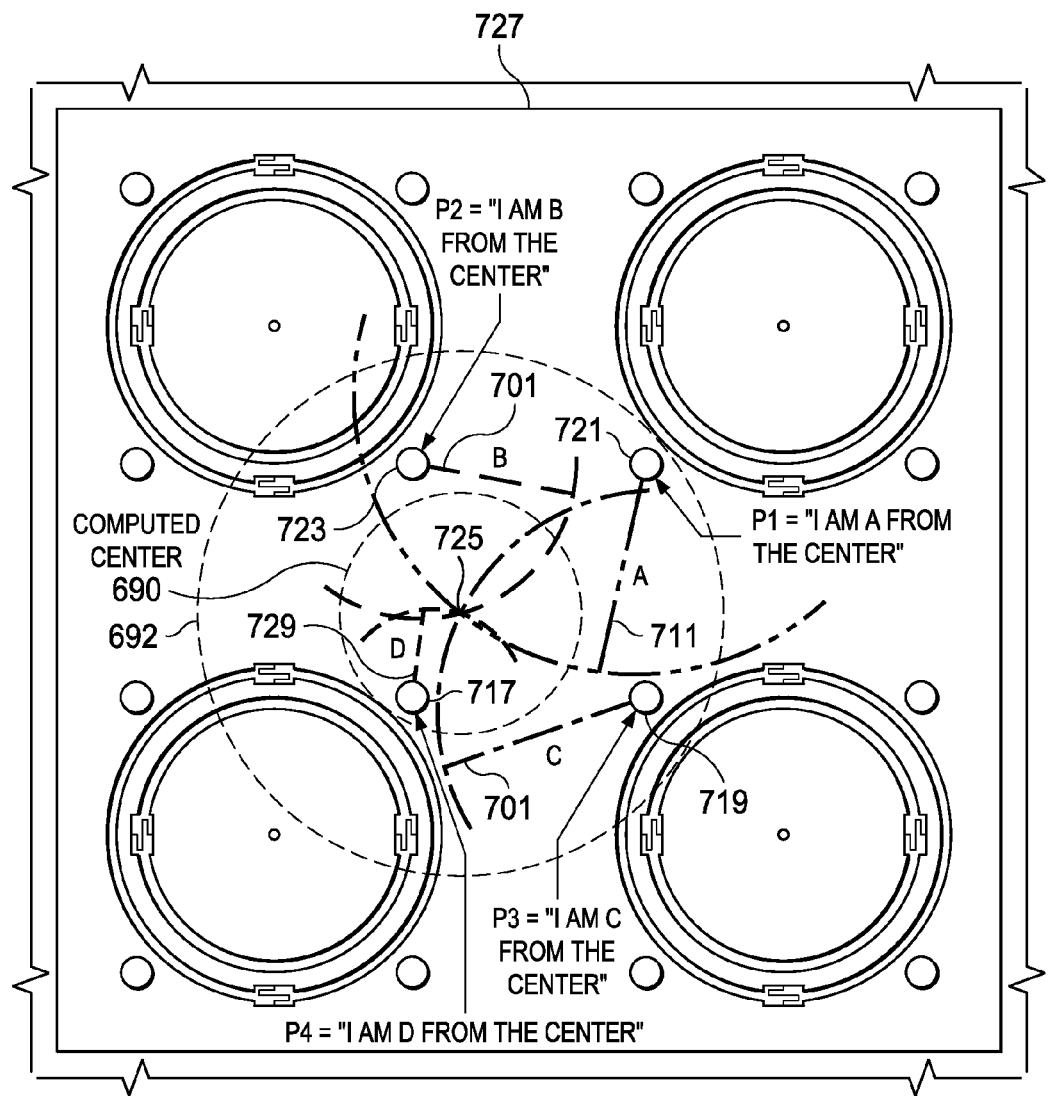
FIG. 26 illustrates triangulation of a beam center.

FIG. 26 illustrates the determination of a center of a control beam based on the response of photodiodes. In mirror array 727, photodiodes 717, 719, 721, and 723 detect the received optical power from control beam 692, which has a known intensity as a function of distance from the beam center (for instance a truncated Gaussian function). The beam center is a distance 711 from photodiode 719, a distance 701 from photodiode 723, a distance 701 from photodiode 719, and a distance 729 from photodiode 716. Two photodiodes may determine two different candidate locations for the center of the beam. However, when a third photodiode is used, the center of the beam may be uniquely determined, for example, in FIG. 26, the beam center is at location 725, which is at the intersection of arcs for four photodiodes.

The position of the beam center determined in beam center computation block 666 is placed in shift register 670. The positions for other beams from other set ups occurring concurrently, and hence being measured are also placed in shift register 668. Sampling clock generator 668 clocks shift register 670 at $\tau$, which may be between 50 kHz and 2 MHz corresponding to $\tau$=20 μs and $\tau$=0.5 μs respectively. Every $\tau$, shift register 670 steps the entered values one step down its stack as new values come in. The beam vector positions for the current and previous values are then read out from adjacent stack levels and compared by computation block 672. The difference between the two position values represents the vector distance the beam has traveled in τ. Dividing this value by τ gives the vector velocity as a function of time. This value may also be stored and shifted. Comparing the velocity vector values for adjacent sample pairs provide the change in velocity every τ gives the acceleration values. Vector values of position, velocity, and acceleration are thus available with a granularity of τ.

As the process of determining velocity and acceleration proceeds, the effects of small measurement errors or noise builds up. Noise filtering may be performed for acceleration and velocity. For example, the position may be available with a 5 μs granularity, the velocity with a 10 μs granularity, and the acceleration with a 40 μs granularity. Alternatively, a weighted average is used for velocity and acceleration.

Then, computation block 678 computes the forward trajectory of the current beam path based on the position relative to the target mirror, the velocity vector, and the acceleration vector. Locations of the photodiodes and mirrors are obtained by location map 674. Because the acceleration is a function of the current electrostatic voltage drive, it may be assumed that the acceleration component from the electrostatic drive is approximately constant, but that an additional acceleration component from the changing spring tension as a function of angle is included as the deflection angles changes. The values and parameters for this are obtained from mirror behavioral model 676.

Computation block 678 uses the input coefficients to calculate a projected current path trajectory, determines the desired path trajectory to the target mirror, and computes an approximate acceleration vector to correct the trajectory towards the desired trajectory. The time taken for the deceleration drive to continue may also be computed.

The results are passed to electrode waveform generator 680, which modulates the electrode braking to change the mirror acceleration. Electrode waveform generator 680 is a digital to analog (D/A) converter.

Then, mirror drivers 682 drive the mirrors of mirror array 654.

This is recomputed and changes once per τ. The process repeats once per τ until the mirror is stationary at the target mirror.

Figure 27:
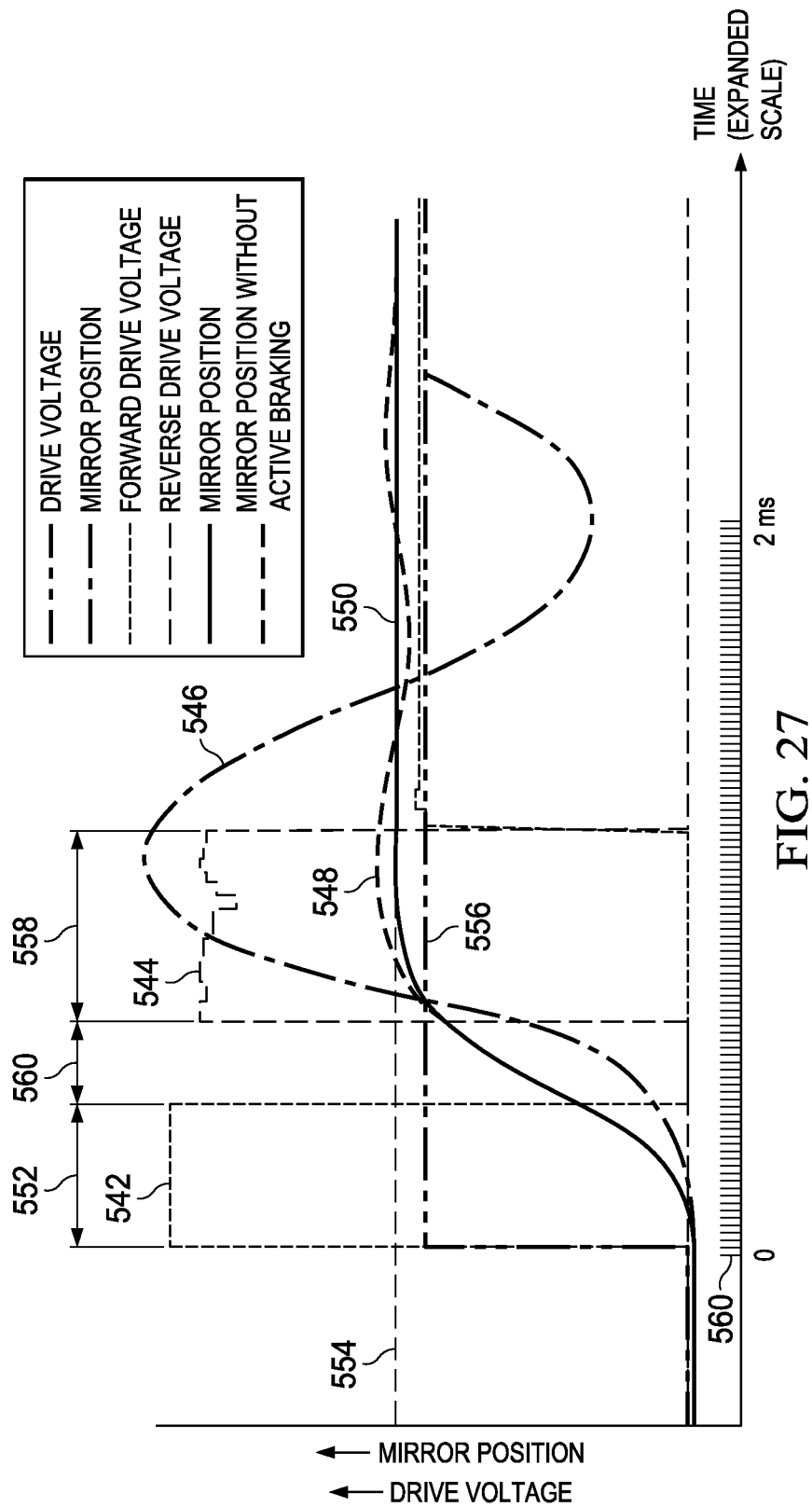
FIG. 27 illustrates the control of a MEMS mirror using closed loop control.

FIG. 27 illustrates the responses and drive waveforms using a step function final value drive and using an active acceleration and deceleration with closed loop control on the deceleration. Line 554 shows the desired mirror offset position. For the case of a step function final value drive, drive voltage 556 shows the drive voltage for an applied drive voltage, and curve 546 shows the response when drive voltage 556 is applied. Curve 548 shows the response with an applied acceleration and deceleration without active closed loop braking, resulting in a small residual error of position or velocity, while curve 550 shows the response with active closed loop braking.

With active deceleration and closed loop control, the initial acceleration is computed and applied, with drive waveform 542 having duration 552. While drive waveform 542 is applied, the mirror rapidly accelerates due to an increased drive voltage. The initial deceleration voltage is also computed to halt the mirror. Drive waveform 544, with duration 558, shows the deceleration waveform. When the acceleration voltage is turned off, before the deceleration voltage is applied, the mirror coasts. Alternatively, the deceleration voltage is applied immediately after the deceleration voltage. At some point while the deceleration voltage is being applied or before the deceleration voltage is applied, the beam enters the zone of uncertainty, and is illuminated. In FIG. 27, the beam is illuminated as the deceleration voltage is turned on. When the control beam is turned on, it is detected by photodiodes, and its position, velocity, and acceleration are determined. Then, a control loop modulates the braking voltage to correct the deceleration to steer the mirror along the desired trajectory. While FIG. 27 shows a single set of waveforms, this process is actually occurring on two orthogonal axes (X-axis, Y-axis). Clock signal 560 depicts the control sampling, which may be 50 kHz or even higher. When the mirror reaches its target position, drive voltage 564, a static drive voltage, is applied.

When no active control is used, the mirror may decelerate to zero at a point slightly offset from the target position, or decelerates only approximately to zero. This triggers a mirror mirror resonance, as shown in curve 548.

If the calculated static mirror voltage is slightly in error, the mirror begins to move with a slow acceleration. This will be detected as the start of a positional drift by the control system and the static drive voltage will be corrected, usually within one to three τ periods of when the drift is detected.

For a mirror with a 500 Hz resonance, the mirror set up and optimization may be completed in about 1.2 ms. For a mirror with a 1 kHz resonance, the mirror set up time may be about 0.6 ms.

Figure 28A:
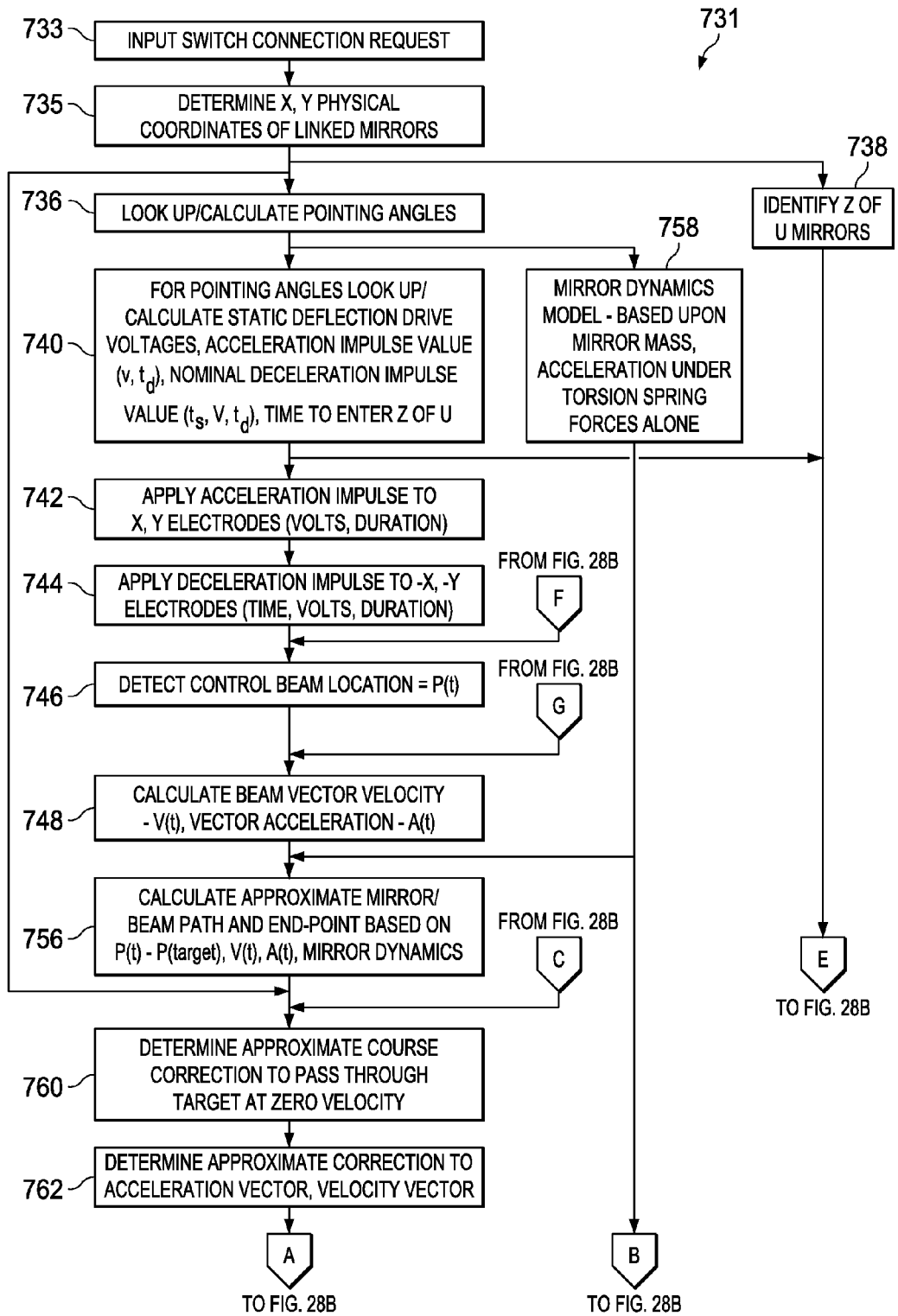
FIGS. 28A-28B illustrate a flowchart of an embodiment method of controlling a MEMS mirror using closed loop control.
Figure 28B:
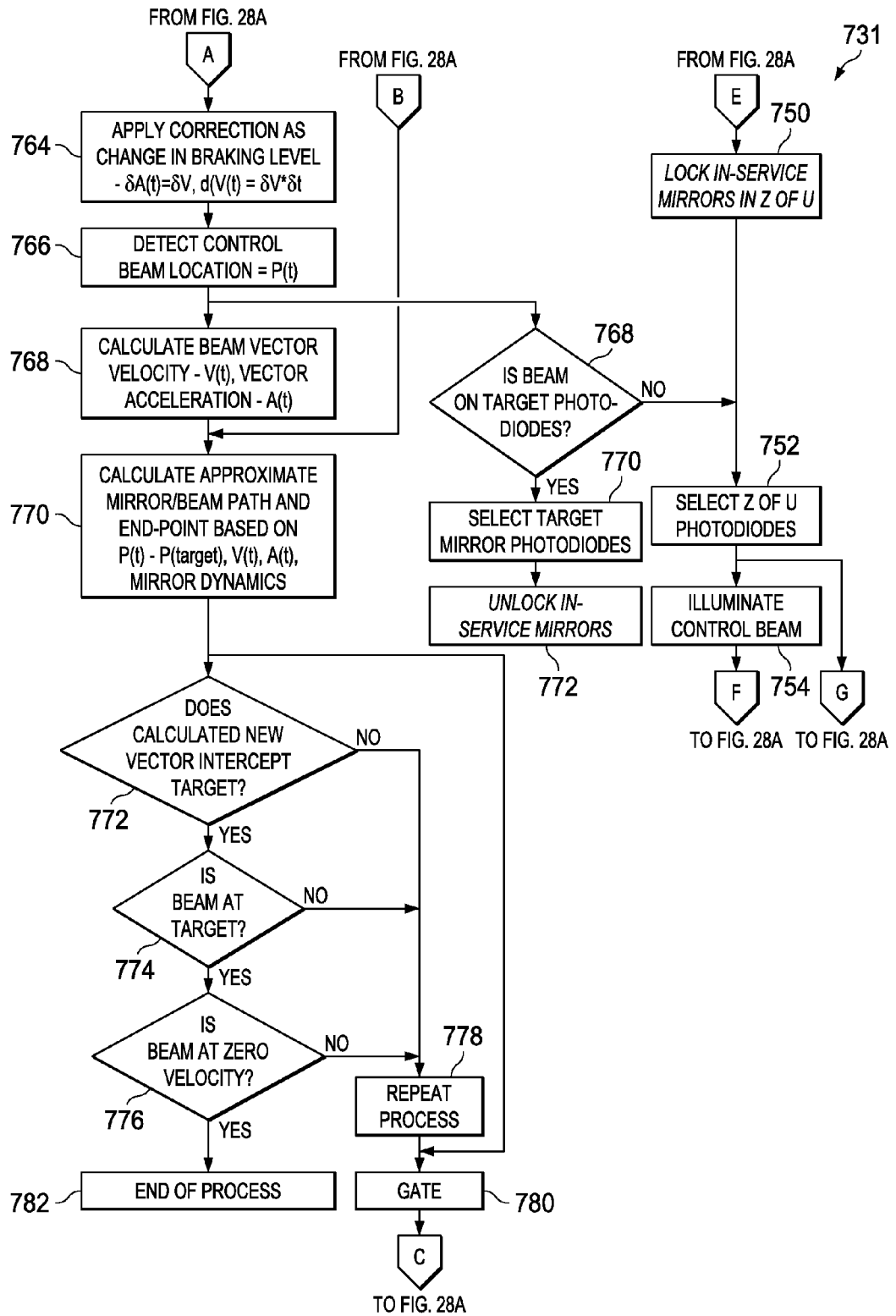

FIG. 28 illustrates flowchart 731 for a method of performing closed loop deceleration. Initially, in step 733, the input switch connection request is received. This indicates a mirror on one mirror array to be connected to a mirror of the opposing mirror array.

Next, in step 738, the x and y physical coordinates of the linked mirrors are determined. This may, for example, be obtained from the connection request, or calculated based on the mirror geometry of the respective mirror array substrates and the mirror cavity geometry.

In step 736, the pointing angles are determined. In one example, the pointing angles are looked up in a lookup table. Alternatively, the pointing angles are calculated based on the geometry of the mirror array.

The drive values are then determined based on the pointing angles determined in step 736 along with the stored known static deflection angles versus drive voltages for the MEMS mirrors, based upon design parameters or determined by individual or sample testing. The voltage and duration of the acceleration impulse drive is determined from the desired angle, the known mirror angular moment of inertia, and the mirror drive sensitivity. Also, the start time, duration, and voltage of the deceleration voltage are determined, although these are subject to change later in the process, once the mirror comes under closed loop control. Additionally, the static deflection drive voltage to maintain the pointing angle of the mirror is determined. These values are determined from the mirror characteristics. The time that the beam will enter the zone of uncertainty and be illuminated is also determined.

The acceleration impulse with the voltage and duration derived in step 740 is applied to the electrodes in step 742.

Then, at the time determined in step 740, the deceleration voltage is applied in step 744.

Meanwhile in step 738, mirrors within the zone of uncertainty of the target mirror are determined. This is performed based on the location of the target mirror and the size of the zone of uncertainty. The zone of uncertainty is the area where the beam would initially land.

In step 750, the in-service mirrors opposing mirrors within the zone of uncertainty determined in step 738 are locked.

After the beam enters the zone of uncertainty, the photodiodes in the zone of uncertainty are selected in step 752.

Also, in step 754, the control beam is illuminated. For example, a signal is applied to a modulator to illuminate the control beam. Alternatively, a light source such as a vertical cavity surface emitting laser (VCSEL) at the control wavelength is activated.

In step 746, the location of the control beam is determined. The position of the control beam is detected based on the response of photodiodes within the zone of uncertainty. The center of the control beam may be determined by triangulating the location based on the response of three or more illuminated photodiodes.

Based on the current and previous beam locations, the velocity of the control beam is determined. The velocity is the difference in position of the beam location divided by the time between the samples. Then, the acceleration of the control beam is determined based on the difference in the current and previous velocity divided by the time step.

Figure 29A:
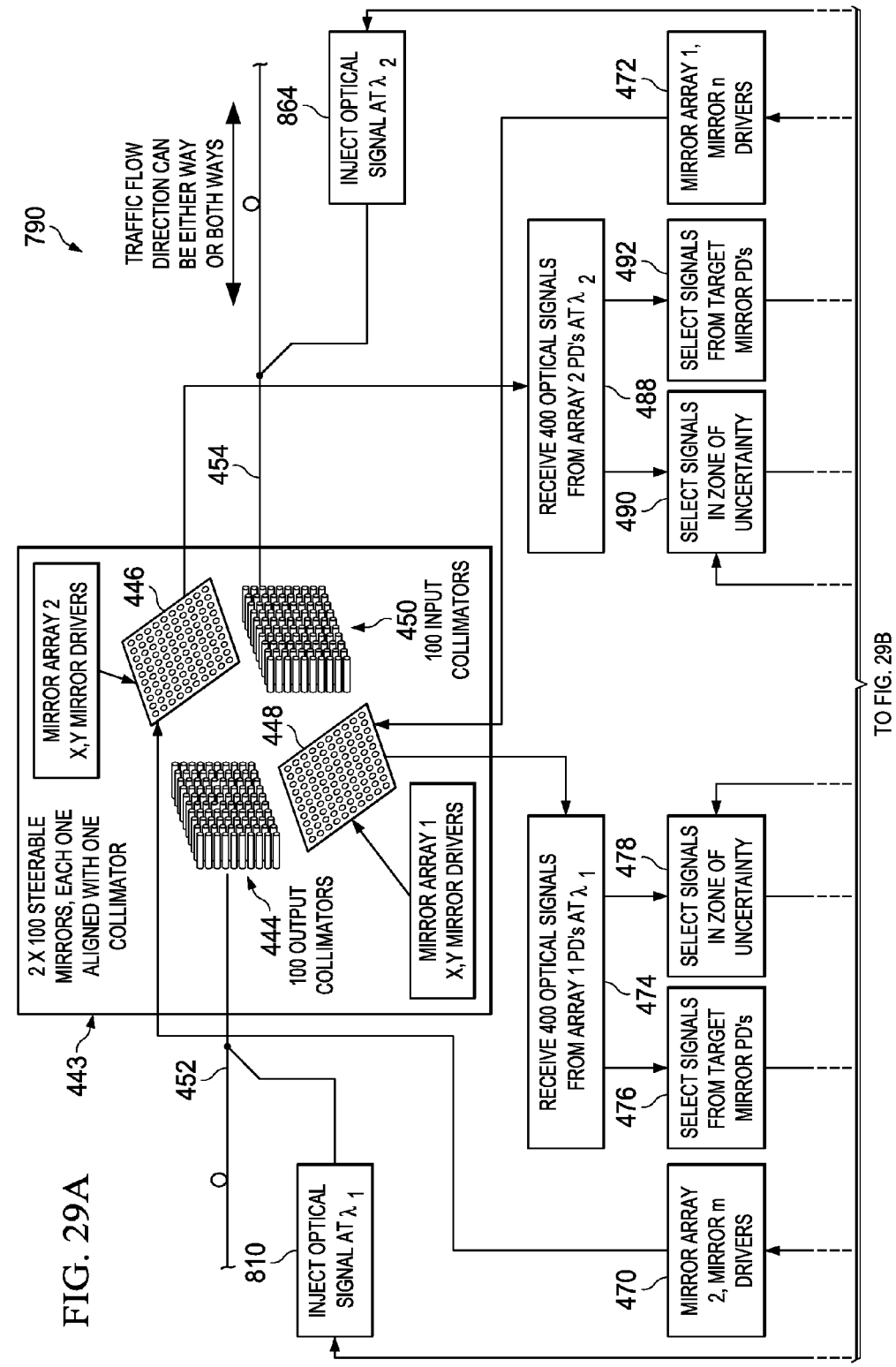

FIG. 29 illustrates control system 790, an example control system for real time dynamic mirror control with impulse-based mirror drive implementing the method illustrated in flowchart 731. Control system 790 uses impulse drive and braking to move the mirrors rapidly without triggering mechanical resonances. Additionally, control system 790 uses real time monitoring of mirror position, velocity, and acceleration derived from the detection of beam location velocity, and acceleration. The detected beam location, velocity, and acceleration come from the broadband photodiode output signal at a rate, for example, of 50 kHz to 2 MHz, corresponding to a $\tau$ of 20 $\mu$s–0.5 $\mu$s. Errors in the beam trajectory arising from the MEMS mirror system tolerances and calculated impulse size errors from these tolerances are corrected by a process of measuring the course of the illuminated control beam within the zone of uncertainty and correcting its trajectory.

Sampling clock generator 850 creates the timing for equally time-spaced repetition rate beam position data samples, which are turned into beam position, velocity, and acceleration vector values by comparing adjacent samples in position, velocity, and acceleration blocks 832 and 852. This position, velocity, and acceleration information is passed to correction blocks 816 and 858, which compute the course correction to be applied so that the beam trajectory more closely passes across the target mirror and the beam velocity more nearly passes through zero velocity at the mirror crossing. Correction blocks 816 and 858 may be hardware state machines. These blocks determine the current future path of the control beam and the corrections to bring the paths to pass through the target location as the velocity reaches zero. The calculation does not need to be very accurate as long as each iteration reduces the path and residual velocity errors, because they are repeated iteratively at a fast rate.

When connection control sequencing processor 466 receives a connection request, for example in the form of an input port-output port request, it determines which row and column on mirror array 446 and mirror array 448 to connect to deflect incoming beams to the center of the opposing mirror. Then connection control sequencing processor 466 establishes the appropriate initial static drive voltages for those mirrors to nominally retain the correct static pointing angle to reflect incoming control beams form their respective collimators to the opposing target mirror. The area around the target mirror where the initially calculated beam might land after the point of the control beam illumination is the zone of uncertainty, which arises from the tolerances in the calculation process and variations in the mirror deflection sensitivity. Once the mirrors are moved far enough by the application of the computed acceleration and optionally the deceleration waveforms, such that the beam is in the zone of uncertainty, the control beam is illuminated, the beam location will be measured, and the correction vector calculated and applied without the beam ever stopping until it reaches its target. In one example, the initial beam pointing and resulting zone of uncertainty is established using a pre-measured look up table. In another example, an algorithmic approach is used.

When an algorithmic approach is used, connection control sequencing processor 794 computes the appropriate drive voltages by calculating the mirror pointing angles in the X and Y planes from the geometry of the mirror chamber. Then, from the average drive voltage/deflection characteristics of the mirror cells, connection control sequencing processor 794 computes the required drive voltages.

Initial starting point block 792 may also compute the required initial drive impulse amplitudes and durations. When the mirror is to be pointed towards an opposing mirror at coordinates X, Y, it is moved through a pointing angle change that may be calculated from the system geometry. This calculated vector angle change is applied against a rising spring force, which entails injecting potential energy into the springs (the gimbals). This may be calculated from the angular change and the spring force. If the same amount of kinetic energy is inserted into the mirror, the mirror will stop at the right deflection point. If the computed static drive voltage is calculated correctly and applied immediately, the mirror will remain stationary. A drive impulse is applied to provide the mirror with enough kinetic energy to reach its target destination plus one half or more of the kinetic energy that can be removed by braking. The value of one half provides the maximum ability to handle system tolerances, which may require active reduction or active increasing of the electrostatic braking levels or durations, to give the largest margin for tolerances. When the system tolerances are not needed, a larger amount of energy is added to the accelerating impulse, leading to higher mirror velocities and shorter switching times and the removal of more energy by electrostatic braking. The appropriate acceleration and deceleration impulses are a factor of the pointing angle required and various known mirror/mirror drive constants from the specific MEMS design. The impulses may be calculated in initial starting point block 792.

The drive voltages are applied to the appropriate acceleration electrodes of the two mirrors in the intended new optical path by ramping the electrode voltages up rapidly to a high drive voltage for a defined short period of time which may be different for the X, Y plane electrodes to produce the required angle vector or alternatively may be the same for the X, Y plane electrodes in which case the high drive voltages would differ to produce the required angle vector. After an appropriate time calculated by initial starting point block 792, which is downloaded to real time electrode waveform generators 814 and 860, the acceleration impulse is removed. Either immediately after the acceleration impulse is removed, or after a short predetermined period of time following the removal of that impulse, during which the mirror momentum is coasting it towards its target angle at a falling velocity from the spring backpressure, the opposite side electrodes are activated with a calculated timed braking impulse with the computed level and duration. At some point in the application of this braking impulse, determined by the size of the zone of uncertainty, the control system assumes that the mirror is pointing the virtual (unilluminated) control beam into the zone of uncertainty. At this point, the control beam is illuminated, and active dynamic mirror control commences. This adapts or modifies the voltage level and duration of the braking impulse using real time beam dynamics detection and dynamic mirror control to bring the mirror to progressively halt at the target position with zero velocity and zero positional error. Thus, triggering mirror resonances is avoided or minimized, while actively steering the beam and mirror pointing to align with the target at the center of the zone of uncertainty. As the mirror comes to a halt, the braking impulse is rapidly ramped down and the static angle retention voltages are applied to the forward deflection electrodes to retain the mirror at the static deflection angle.

Optical signals from the photodiodes of mirror array 448 and mirror array 446 are received by receive block 474 and receive block 488, respectively. Receive blocks 474 and 488 may be electronic amplifiers of the photodiode electrical responses to the incident signals. The required output signals from receive blocks 474 and 488 are selected. Initially photodiodes in the zone of uncertainty are selected by zones of uncertainty blocks 478 and 490, and photodiodes associated with the target mirror are selected by target mirror blocks 478 and 492. The zone of uncertainty may include photodiodes around the mirrors and, for example, within two to four mirror pitches of the target, depending on the precision of the initial pointing calculation, the size of the mirror array, inter-array optical path lengths, and the tolerances in beam velocity at the point where the control beam is activated. The selected photodiodes locate the actual beam landing spot in real time within the zone of uncertainty. The beam location is determined when three or more photodiodes are illuminated, and may be triangulated to determine the exact beam landing spot. The mirrors opposing the mirrors within the zone of uncertainty may be locked during the initial alignment. Alternatively, different control timeslots are used.

At the start of the set up process, the mirror has no drive voltage, so it is in a known quiescent position. Alternatively, if the mirror is moving from a previously set up connection it is moving from a known position and known set of drive voltages. In either example, the starting conditions are known. The initial approximate angular deflections are calculated to bring the mirror pointing to a point where the reflection beam will land somewhere within the zone of uncertainty surrounding its destination beam position at the target mirror. This facilitates an X, Y pointing vector or change in pointing vector to be calculated, which can be mapped to both a set of steady drive voltages to retain the mirror at the required pointing angle and a resultant level of potential energy to be stored in the gimbal springs at that pointing angle. Based on the required deflection angles, and hence the stored potential energy of the gimbal springs, two impulse levels are chosen by initial starting point block 792. One value is to accelerate the mirror to an angular velocity in excess of that needed to reach the appropriate initial computed beam pointing angle, where the energy of the impulse is greater than the potential energy required to be injected into the springs. The second impulse removes angular velocity since it is applied to the opposite plates, and is of a magnitude so as to remove approximately all the excess kinetic energy of the mirror as it approaches the target location, so that that mirror is brought to an approximately stationary state with its reflected beam at the target location.

If this is accurately done, the mirror has no excess kinetic energy and no positional error (potential energy error), and the spring-mass kinetic energy/potential energy resonance cannot be triggered.

There are several sources of tolerances and errors, including the variability in the deflection sensitivity of individual mirrors on in the wafer batch and the spring constants of the silicon torsion springs of the gimbals, so the mirror may not be brought completely to rest. However, the approximate final position is achieved much more rapidly. Also, the amplitude of the resonance will be substantially attenuated. The resonance is a response to the errors of the calculated level, not to the total step change.

Closed loop deceleration may prevent this ringing. As the mirror moves close to its final pointing angle, the control beam would enter the zone of uncertainty. At that time, the control beam is switched on by inject optical signal modules 810 and 864. Fast repeated measurements of the beam's intensities by received power comparators 828 and 846 and beam center computation blocks 830 and 848 using the signals from zones of uncertainty blocks 478 and 490 and the photodiode and mirror locations from photodiode and mirror location block 838 facilitating the moving beam's center to be determined as a function of time. If the location of the beam center is available about every 2-50 µs, depending on the chosen control framing rate, quasi-real time establishment of the location of the beam spot may be achieved much faster than the rate of the MEMS mechanical resonances. Knowing the beam positional differences between successive measurements, the beam's velocity, and hence the mirror's angular velocity may be computed ever 2-50 µs with an average lag of 1-25 µs. The comparison of beam velocities at different times, such as between adjacent beam velocity determinations enables beam acceleration, and hence mirror acceleration, to be computed. This is computed by entering the results from beam center computation blocks 830 and 848 into shift registers 834 and 854, wide short registers, which may contain the results of multiple simultaneous mirror set up processes. Then, shift registers 834 and 854 are clocked by clock generator 850 one step every sampling period, which determines the time granularity of the calculators. The first stage of shift registers 834 and 854 first holds the actual most recent beam locations of the currently captured position, while the second stage holds the previous positional samples for each beam, the third stage the samples before that, etc. By comparing the current positional samples with the previous positional sample, the beam velocity can be determined, because the velocity is the change in vector position divided by the change in time (one sample period). This velocity is then stored. During the next sample period the new velocity is calculated from the new positional sample, and its difference to the previous positional sample gives the new velocity one sample period later. Changes between adjacent velocity samples provide a measure of the acceleration. The data storage and computation is carried out for both the X and Y axis.

The continuous monitoring of the beam position, velocity, and acceleration by the photodiodes and the associated control blocks means that, once the control beam illumination is activated as the beam enters the zone of uncertainty, the beam position is tracked in real time by the photodiode responses. Its beam dynamics is compared against projected instantaneous beam dynamics expected from the application of the two impulses.

The deceleration impulse is still being applied during this period. The error components derived from comparing the actual beam dynamics to the projected beam dynamics are then used to compute any correction to the final stages of the deceleration impulse. For example, the deceleration impulse is maintained for an additional few microseconds if the actual beam velocity requires additional vector deceleration, or decreased for less vector deceleration. The voltage may be increased or decreased if the acceleration level should be modified. Changing the voltage changes the acceleration, while changing the time at a given voltage/acceleration modifies the overall velocity change. Hence, the error analysis, when presented as a vector acceleration change and residual velocity to be shed by the mirror maps to a new voltage level to correct the acceleration and a new duration at that voltage eliminates the residual velocity to bring the mirror to a halt at the target in the center of the zone of uncertainty. Thus, a continuous process of zeroing in on the optimum target alignment by fast iterative closed loop vector corrections is achieved.

When the deceleration voltage is removed, a steady state or static electrode drive voltage is applied. The mirror remains at rest. If the mirror is not exactly in the target position, it will move again with a low acceleration. The start of this movement may be detected very rapidly, for example within 10-50 µs of the start of the movement. Based on the velocity and acceleration computations, the drive voltage may be corrected.

An example time budget for rapidly moving a mirror with a 500 Hz resonance is 1153 microseconds. Computing the angles and drive voltages is about three microseconds. Applying an impulse to the mirror may take about 450 microseconds. Also, the deceleration impulse may take 150 microseconds before the illumination of the beam upon entry into the zone of uncertainty. Active control of the last stages of deceleration and matching the initial mirror position and applying the stabilization drive voltage may take about 550 microseconds. Since the speed of set up is determined largely by the rate of movement of the mirror mass, which is related to the resonant frequency, a mirror with a resonance above 700 Hz may have a sub millisecond set up time, and a mirror with a 2 kHz resonance might be set up on 300-500 µs, to not exceeding the maximum drive voltages.

When the process is complete, the mirror pointing angle is such that the control beam lands on the target at the center of the zone of uncertainty, and is stationary with no resonances.

As the mirror positional error is small, and the velocity is close to zero, the beam landing site is precisely ascertained, by mapping the photodiode responses around the target mirror to the beam cross-sectional intensity. Then, the remaining photodiodes in the zone of uncertainty can be released. Any small final correction vector can be calculated if needed based on the photodiodes associated with the target mirror, to bring the beam to complete alignment with the center of the target mirror.

At this point, other mirrors opposing mirrors in the zone of uncertainty are unlocked, and the photodiode responses from the photodiodes associated with the target mirror are examined by received power comparators 828 and 846. These photodiodes are selected by target photodiodes blocks 476 and 492. A fine correction vector is calculated. The fine correction vector corrects the centering of the beam on the target mirror. When the beam is centered on the target mirror, the photodiodes are equally illuminated. For real time vibration control, the responses are continuously monitored, and variations in readings from the photodiodes surrounding/on the mirror can be used to produce a quasi-real-time drive to cancel any vibration-induced mirror displacement.

The overall mirror set up can be done with a single mirror angular acceleration and a single closed loop controlled deceleration. The mirror starts at rest in the quiescent non-energized state, or at rest in a known pointing state, if changing connections instead of initiating a connection where none previously existed. The mirror blind vector to enter the zone of uncertainty around the target is calculated, the control beam is switched off to avoid flashing across other mirrors' photodiodes outside the zone of uncertainty, and an appropriate drive impulse is calculated and applied, rotationally accelerating the mirror and accelerating the virtual beam pointing across the surface of the opposing MEMS mirror array. The second or reverse braking impulse is calculated and applied. The control beam is then activated at the point where it is projected that the beam would fall inside the zone of uncertainty, usually occurring partway through the deceleration. At that point, the control beam is illuminated somewhere within the zone of uncertainty, with a moving beam landing spot. The photodiodes within the zone of uncertainty that are illuminated measure the spot intensity in real time. Its position, velocity, and acceleration can be determined from one, two, and three consecutive measurements respectively. The required vector to point at the target mirror is calculated, and the required vector changes are calculated and applied to change the mirror trajectory. This results in a beam trajectory closer to one that brings the mirror to a stationary state at the point where the beam is pointing directly at the target mirror. This measurement and computation cycle continues until the mirror is stationary at the correct pointing angle, which is determined by equal illumination of the photodiodes associated with the target mirror by the control beam.

Figure 30A:
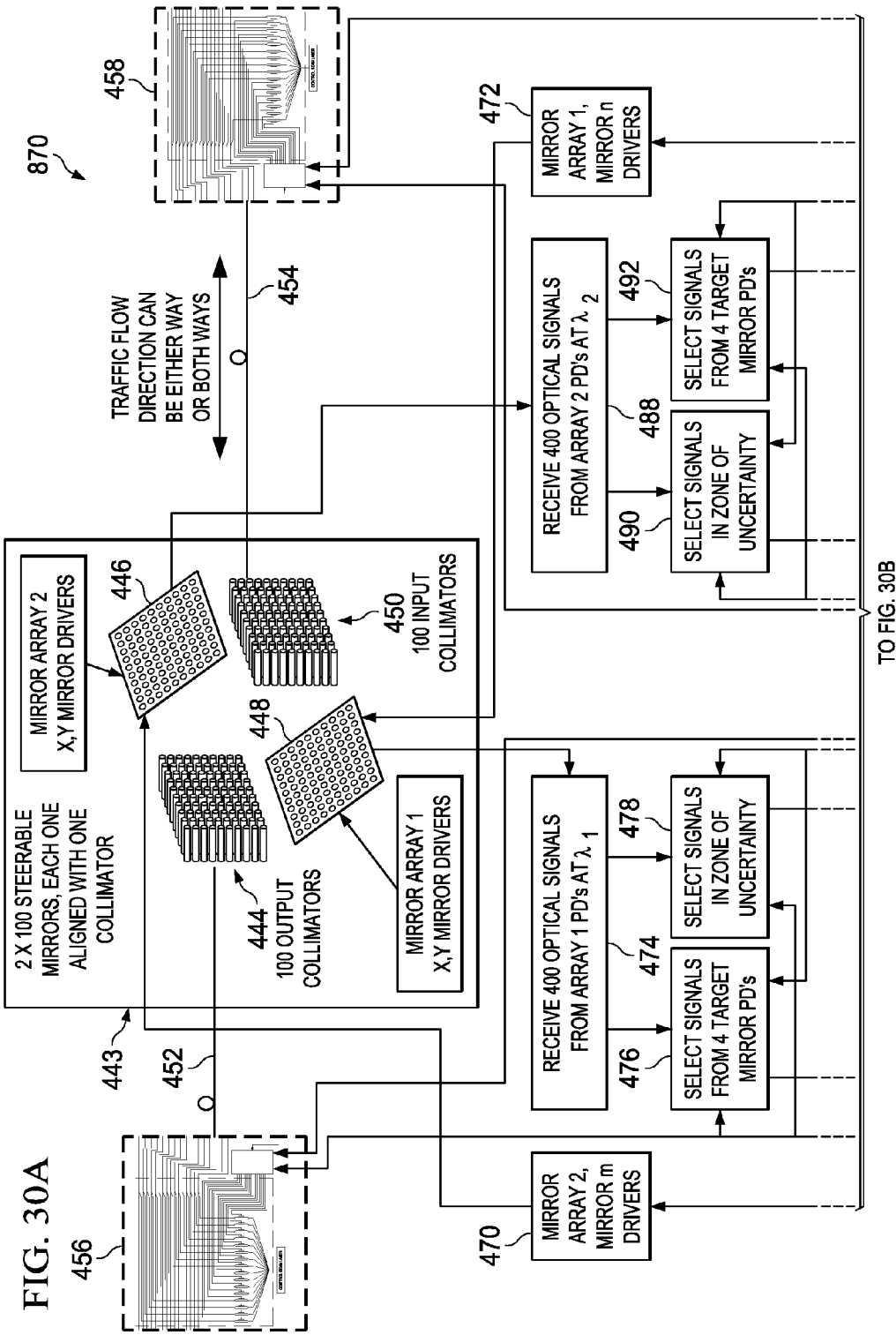
FIGS. 30A-30B illustrate another embodiment control system for closed loop control of a MEMS mirror.
Figure 30B:
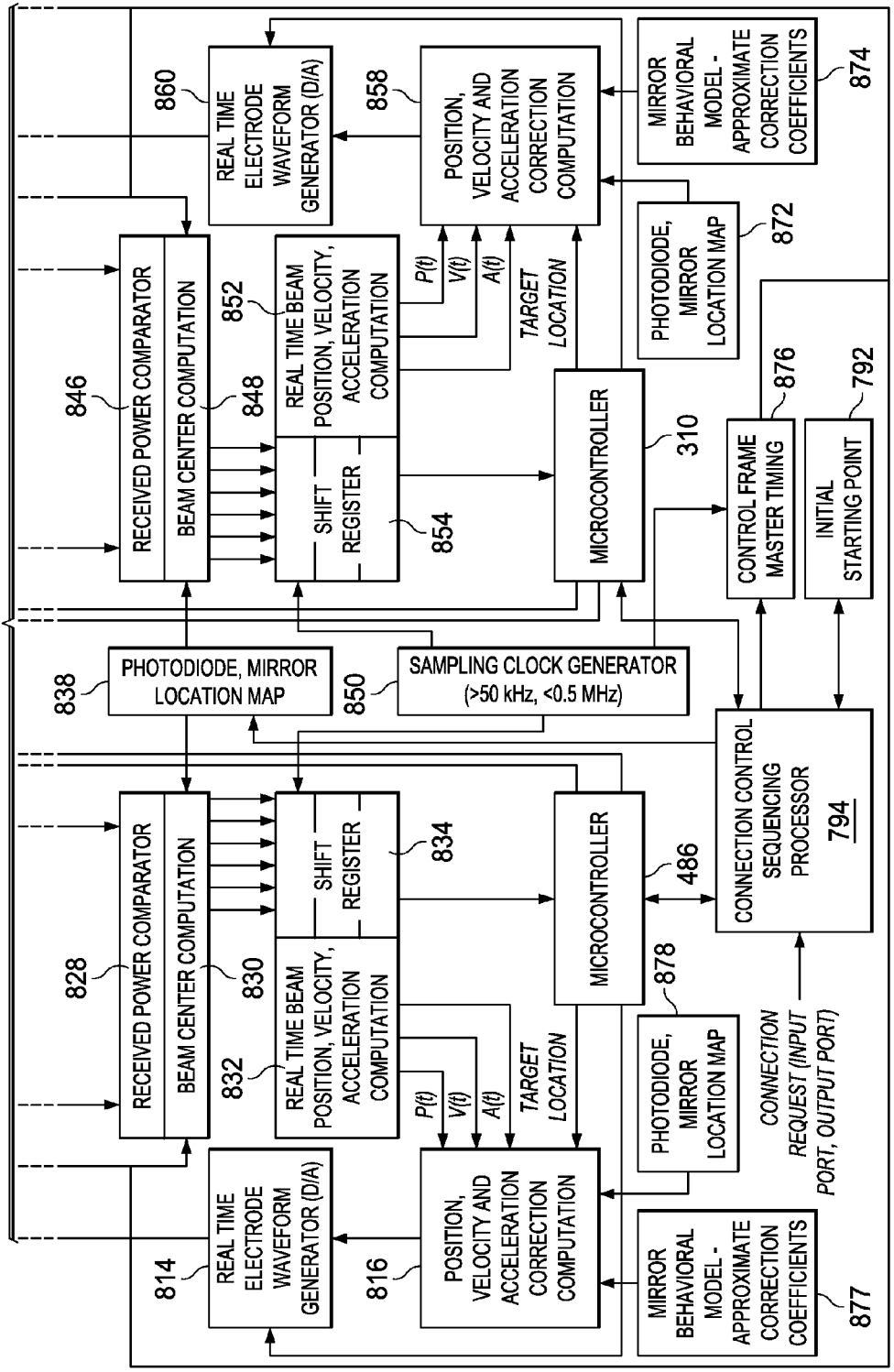

FIG. 30 illustrates control system 870 for applying dynamic mirror control and impulse based mirror drive to a control system using a frame structure to set up MEMS mirrors. The connection request is received by connection control sequencing processor 466. Connection control sequencing processor 466 determines the X and Y physical coordinates of the mirrors to be linked and the zone of uncertainty around these mirrors. Initial starting point block 468 and connection control sequencing processor 466 determine the approximate steady state bias voltages to hold the mirrors at the appropriate angles so the opposing mirrors are approximately pointed to beam at each other. Connection control sequencing processor 466 receives, from initial starting point block 468, or calculates, the voltage level and duration of the acceleration impulse to provide enough vector acceleration to project the mirror and beam towards the target alignment with an excess kinetic energy. Also, the timing, voltage level, and nominal duration of the deceleration impulse is determined, so the excess kinetic energy can be removed, and the mirror can be brought to rest approximately aimed at the opposing target mirror. The nominal time of flight for the mirror and its virtual beam to enter the zone of uncertainty is used to allow the control beam to be off as the virtual beam transits the areas of the target MEMS array outside the zone of uncertainty surrounding the target mirror, but to be illuminated soon after entering the zone of uncertainty to avoid interference with other zones of uncertainty while making the control beam available as soon as possible for trajectory control inside the zone of uncertainty.

These values are passed by connection control sequencing processor 466 to microcontrollers 486 and 310. FIG. 30 shows one microcontroller per mirror for the purposes of clarity, but the microcontrollers may each control many mirrors, thereby reducing the required number of microcontrollers. A micro-controller may be dedicated to one or more rows or columns of mirrors on the MEMS array.

Microcontrollers 486 and 310 set the control beams to be illuminated within the appropriate slot of the control frame. This is done by microcontrollers 486 and 310 instructing control frame master timing block 876 to blank control beam to the associated input port for that portion of the duration of the mirror's set up trajectory when the virtual beam would fall outside the target mirror's zone of uncertainty and instructing real time electrode waveform generators 814 and 860 to initiate the X, Y impulse voltages and durations, followed by the timed start of the deceleration impulse on the −X, −Y electrodes at the determined initial voltage and nominal duration, after which the microcontrollers instruct control frame master timing block 460 to illuminate the control channel by activating the previously turned off set up slot in the control frame once the virtual beam has entered the zone of uncertainty around the target mirror. At this point, control frame master timing block 460 illuminates the control beam as one of the set-up slots.

When the control beam is illuminated, microcontrollers 486 and 310 hand over control of the deceleration and ongoing static station to position, velocity, and acceleration blocks 816 and 858. Position, velocity, and acceleration blocks 816 and 858 have been fed the parameters of the target mirror location so they may have pre-computed the expected trajectory to bring the beam, and hence the mirror, to a stationary state aligned with the target. The parameters come from mirror behavioral models 877 and 874. The photodiode positions come from photodiode mirror location maps 872 and 878, which provide the X, Y positional coordinates of all the MEMS mirrors and all the photodiodes.

The illuminated beam causes responses in some of the photodiodes in the selected zone of uncertainty. Responses of these photodiodes are sampled, measured, and analyzed at the sampling clock period by received power comparators 828 and 846.

Received power comparators 828 and 846 determine which responses are of sufficient measured received power to be of relevance, and passes these to beam center computation blocks 830 and 848, respectively, which process the streams of photodiode response values to triangulate the beam center locations as a function of time to produce a real time view of the moving beam center as it tracks across the surface of the opposing MEMS substrate's zone of uncertainty, using the coordinate geometry.

These results are fed into time delay shift registers 834 and 854, so previous samples continue to be available in time sequence. By comparing the differences in beam position as a function of time, the beam velocity and beam acceleration are calculated in position, velocity, and acceleration blocks 832 and 852. These results are streamed to trajectory correction blocks 816 and 858.

Then, position, velocity, and acceleration blocks 816 and 858 compare the position, velocity, and acceleration of the measured beam with the anticipated position based on the projected trajectory. Based on the differences in trajectory, a new trajectory is calculated to bring the beam to a stop at the target location.

The new trajectory, which will be somewhat different from the original computed trajectory, unless the residual errors in the impulse levels were zero, can be turned into accelerations lateral to the trajectory if the trajectory path should be moved to the left or right to intersect the target. The corrections may be applied as an additional acceleration along the trajectory if the computations show a projected undershoot, where the beam and mirror is heading to stop short of target. Additional deceleration along the path may be applied if the computations indicate an overshoot whereby the beam crosses the target at a non-zero velocity and comes to rest beyond the target.

These four acceleration options can steer the mirror accurately to align with the target. The error correction may be approximate provided there is a diminishing error level, because the trajectory can be checked very frequently, and new corrections can be made until the end point. These accelerations options may be turned into electrode drive voltage changes by mapping the required trajectory acceleration changes into X, Y acceleration changes by coordinate remapping, and then mapping the required X, Y acceleration changes into voltage changes on the X, Y or −X, −Y electrodes. Trajectory correction blocks 816 and 858 stream these new voltage levels to real time electrode waveform generators 814 and 860, which applies them to mirror array drivers 470 and 472.

This process continues iteratively until the measured trajectory intercepts the target, and the beam is at the target at zero velocity. The steady state voltages are applied to keep the mirror in place. If these steady state voltages are accurate, and the mirror stays on target. If they are not accurate, the mirror starts to slowly drift. This will be rapidly detected as a slight unbalance of power detected by the photodiodes, which can be corrected for by modifying the drive voltages.

Vibration or mechanical impulses applied to the MEMS system may impact the mirror system and mirror orientation. FIG. 20 shows the effects of vibration on a MEMS system. A low frequency vibration at moderate amplitude may not be a problem, because the mirror and its surroundings follow it together. However, larger amplitude vibration inputs, especially continuous vibration in the region of the spring-mass resonance, may be a significant problem. Near the sprung mass resonance of the mirror-gimbal spring system, the mirror can move differentially from its surroundings with large amplitude movement due to the magnification of the vibration components around the sprung mass resonance. Above the resonance frequency the transmissivity of the vibration to the mirror falls. At a high frequency, the vibration is not able to move the mirror a significant amount before the vibration phase is reversed and its action on the mirror is reversed.

Beyond about three to ten times the resonant frequency, the transmissivity may be insignificant. Hence, a control loop based vibration approach should have a 3-10 kHz bandwidth with a 1 kHz resonant mirror, requiring a digital sampling rate of 6-20 kHz with a 1 kHz mirror.

Vibration may have a variety of forms. There may be a broad range of vibration frequencies, for example as a result from a busy street's traffic penetrating a building. This will have a band-limited white noise spectrum. If this is not an overwhelming amplitude, the application of a control loop will reduce the effects of such vibration by a factor of the control loop's gain as a function of frequency.

A vibration may occur continuously or over a period of time containing one frequency or a small frequency band, such as an unbalanced flywheel on an electric motor. The open loop response of the MEMS switch mirrors depends on the direction of the vibration, the amplitude of the vibration, and the frequency of the vibration, since all of these will affect the efficiency in coupling vibration energy into the sprung mass system of the MEMS mirror plus gimbals. Vibration near the resonant frequency is magnified by the MEMS resonance. If this is not of large amplitude, it can be reduced by a factor of the loop gain in a closed loop controlled system.

Figure 31:
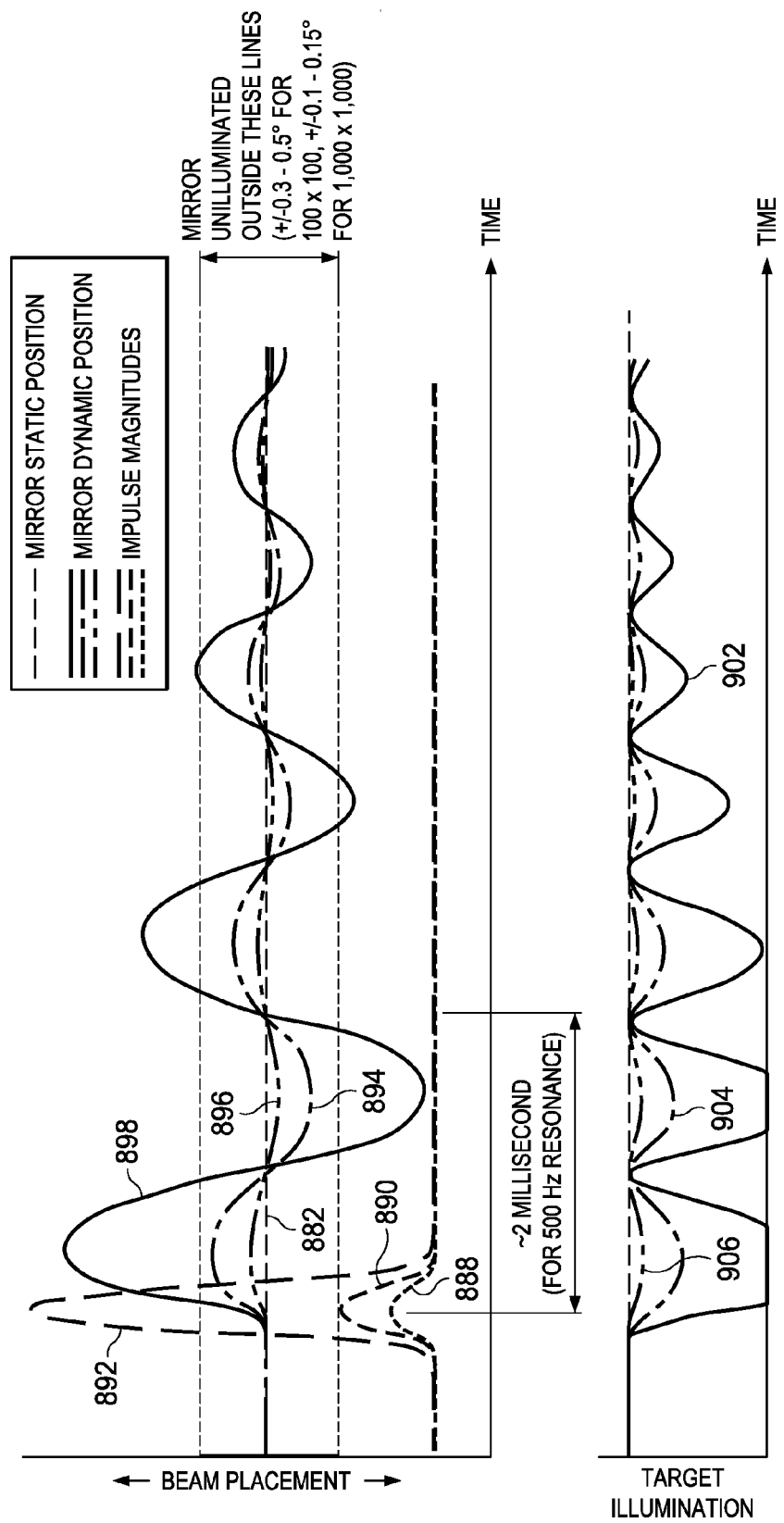
FIG. 31 illustrates MEMS mirror responses for applied impulses.

For an isolated or repeated application of a mechanical impulse, such as using a hammer drill on the ceiling of the floor below the equipment or someone impacting the equipment rack with a trolley. FIG. 31 illustrates a mirror response to a vibration impulse before closed loop control.

Line 882 shows the static mirror position. Curves 888, 890, and 892 show various magnitudes on mechanical impulses being applied to the MEMS switch module. Curve 898 shows the mirror dynamic position response and curve 902 shows the beam mirror illumination response to the impulse of curve 892, curve 894 shows the mirror dynamic position response and curve 904 shows the beam position response to the impulse of curve 890 and curve 896 shows the mirror dynamic response and curve 906 shows the beam position response to the impulse of curve 888. For the low level impulse of curve 888, a low level of mirror perturbation and target beam movement occurs. Because mirror angular displacement in any direction causes a reduction in the target illumination for a previously properly aligned mirror, the modulation of the target illumination is at twice the resonant frequency. If a wideband closed loop control system responsive to photodiode-based beam location detection is applied, this mirror perturbation will be detected and corrected in a similar manner to a mirror overshoot or drift, reducing the error rapidly to zero.

A larger impulse, such as that shown in curve 890, creates a much larger resonant mirror reaction, which would, in the open loop case, significantly impact the target illumination while the resonance slowly dies away from damping.

A very large mechanical shock impulse, such as the impulse shown in curve 892, creates such a large mirror displacement to cause periodic non-illumination of the target mirror, and the illumination of neighboring mirrors. In this case, in a closed loop system, control is maintained by reverting to using all of the photodiodes within the zone of uncertainty, since the perturbed beam would move beyond the local area of the photodiodes immediately surrounding the mirror. This would require use zone of uncertainty level photodiode monitoring and, in some scenarios, the use of mirror locking, when control framing to avoid mirror locking is not used.

For these vibration regimes, the situation may be improved by applying a wideband closed loop system, which can rapidly detect the onset of a vibration induced beam departure, determine the acceleration being applied by the vibration event, and apply a counter-acceleration up to the drive voltage limits, to keep the mirror excursion within the range of the local target mirror photodiodes.

A significant mirror response to vibration produces a beam displacement which may be rapidly detected by the photodiodes as an unbalance in the received power, facilitating a corrective response similar to that for a mirror that drifts or during a set up procedure. That is, the mirror position, velocity, and acceleration is determined rapidly from one to a few sampling periods, and corrective acceleration is applied to return the mirror towards its target station keeping point. The same control system is used in the same manner for trajectory error control, with some differences.

Mirror beam landing movement can be detected after one clock cycle of the sampling clock generator or one frame of the framed control signal, about 0.5 to 20 microseconds depending on the control frame rate. Since the mirror was at rest for the previous two measurements, both the initial velocity and the initial acceleration can be determined from this displacement. An inverse acceleration can be computed to reverse the mirror's movement, and a trajectory may be computed and applied to rapidly return the mirror to its original position at rest. Correction to the perturbed mirror is initially applied 1-30 µs after the perturbation begins, while the perturbation is still small. The mirror position is rapidly corrected unless the vibration impulse is so massive that its acceleration is larger than any electrostatic acceleration that can be applied within the voltage limits of the mirror drivers. When the vibration is massive, the control system is unable to reverse the acceleration until the impulse acceleration decreases, but it can reduce its effects, preventing such a massive mirror displacement, reducing peak mirror velocities, and enabling a fast return to the normal station keeping point when the mechanical impulse abates.

Hence, for large impulses (mechanical shocks), the necessary maximum corrective acceleration may be applied for multiple clock cycles, since there is a finite limit on the drive voltage, and hence the electrostatic acceleration. The control system will register an overload error in the mirror tracking until the mechanical impulse forces abate. Then, it applies the corrective acceleration until the required mirror return trajectory is complete. If the mirror is displaced significantly from its correct operation point, its target, this may include the use of an acceleration impulse and a deceleration braking pulse to return the mirror as rapidly as possible, and may involve the use of photodiodes other than those immediately surrounding the target mirror—for instance the photodiodes of the zone of uncertainty, in the case of the most massive vibration or shock events. For lower level events, this is not necessary, and the event may be handled with measurements from the photodiodes local to the target mirror. However, this scenario only applies to very large impulses or massive levels of vibration. For normal levels of vibration, the effects of vibration impulses that do not saturate the control are reduced by a factor of the control loop gain, making the unit more vibration resistant.

Figure 32:
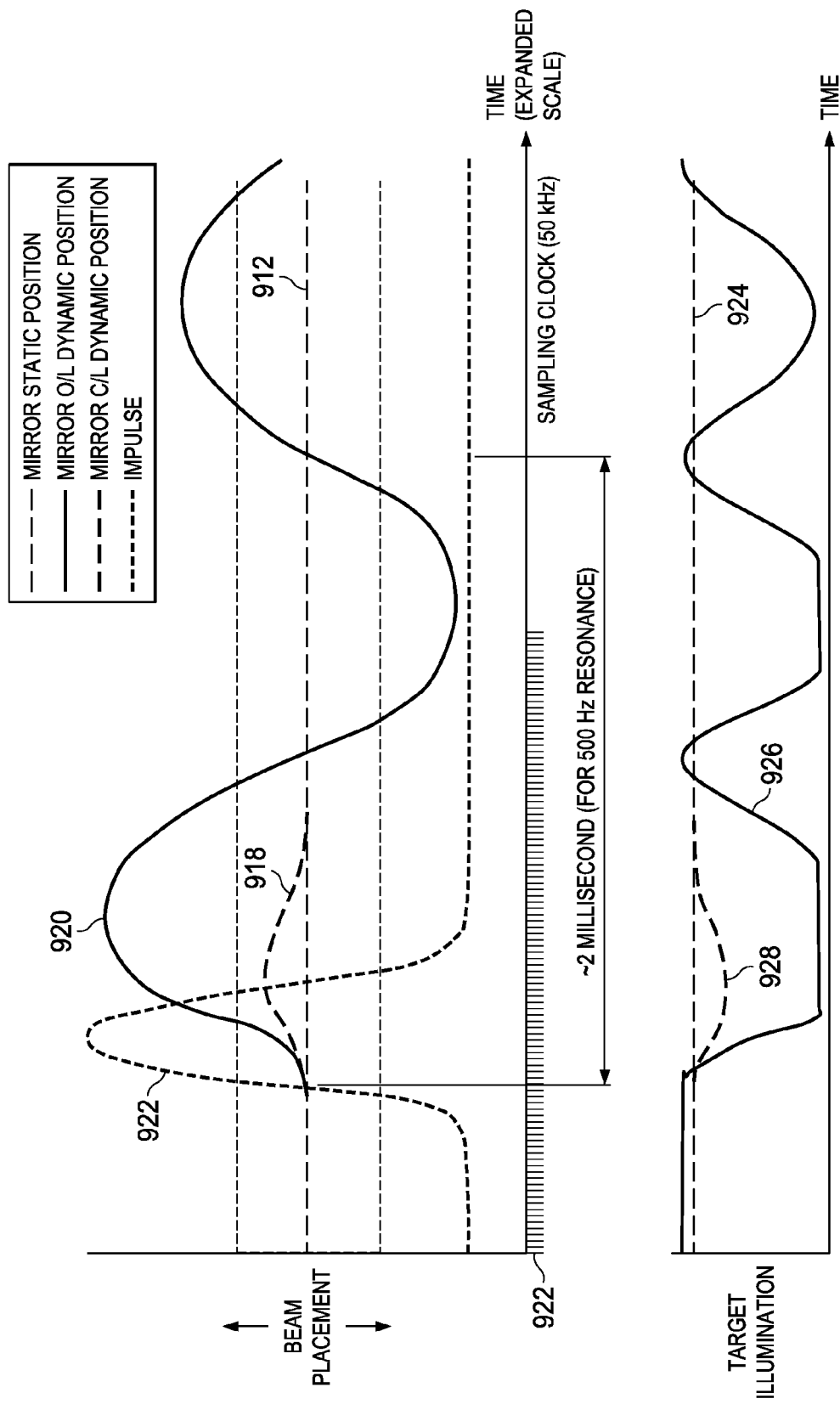
FIG. 32 illustrates a MEMS mirror response with open loop and closed loop control.

FIG. 32 illustrates a response to a large mechanical impulse with open loop and closed loop control. Curve 922 shows the input mechanical impulse. Line 912 shows the static mirror position, and curve 924 shows the static value of the mirror illumination. Also, curve 920 shows the open loop mirror position, and curve 926 shows the mirror illumination for open loop control. Curve 918 shows the mirror position with closed loop control, and curve 928 shows the mirror illumination for closed loop control. Curve 922 shows the sampling clock, for example 50 kHz, with an expanded scale.

Under open loop conditions, the impulse accelerates the mirror rapidly, as shown by curve 920, transferring kinetic energy to the mirror. The mirror therefore picks up significant velocity during the mechanical impulse acceleration. As the impulse abates, the acceleration decreases, but the mirror is still carried further away from the target by its kinetic energy, until the rising spring tension decelerates the mirror to a standstill by absorbing the excess kinetic energy as excess potential energy. The spring tension now accelerates the mirror back towards the target line, crossing that target line at zero acceleration, but at maximum speed. The system experiences a mechanical resonance, resulting in a resonant oscillation in position with time. This has a significant impact on the optical path through the switch, which becomes a series of flashes of light separated by the darkness of broken connections, until the mirror resonances abate after many cycles.

On the other hand, with closed loop control, as soon as the mirror starts moving with a high acceleration from the mechanical impulse, the movement is detected, within one to two sampling periods, and the acceleration is measured. The control system now applies a counter acceleration to reduce the mirror deviation. In the case where the mechanical shock induced acceleration is large, it may momentarily exceed the maximum electrostatic acceleration and the control system can apply due to the drive voltage limitation. In this case, even though the control system is retarding the mechanical acceleration at its maximum level, the acceleration away from the target will continue, albeit at a much lower level. The level of acceleration is the mechanical impulse induced acceleration minus the maximum level of braking acceleration applied by the control system. This continues until the level of mechanical acceleration declines, when the control loop can return the mirror much more rapidly, and without resonance, by computing a return trajectory, which reaches the target position with zero velocity, and controlling the mirror path to approach that trajectory.

Figure 33A:
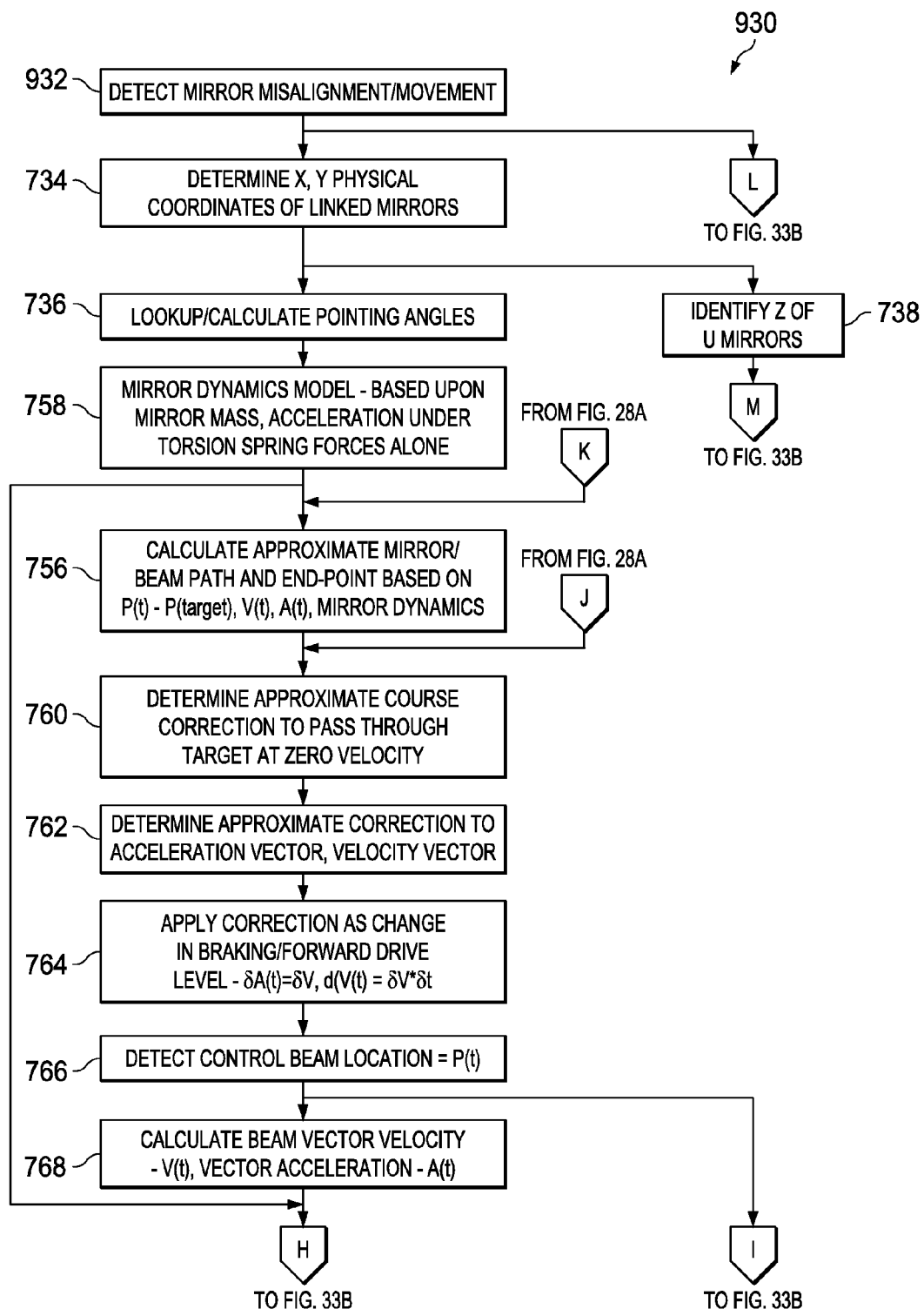
FIGS. 33A-33B illustrate a flowchart for an embodiment method of closed loop control of a MEMS mirror.
Figure 33B:
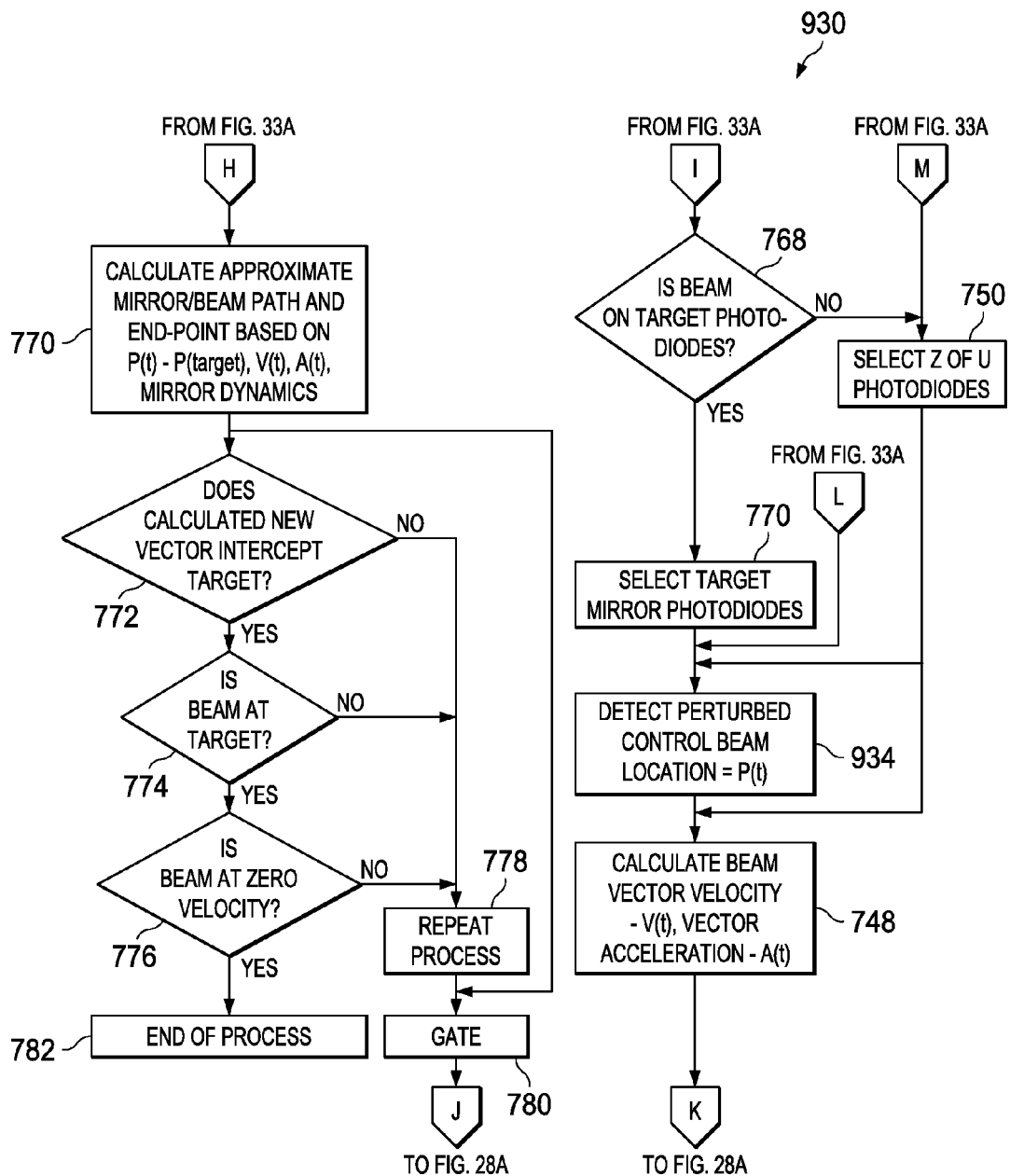

FIG. 33 illustrates flow diagram 930 for a method of controlling MEMS mirrors to respond to vibrations. Initially, in step 932, mirror misalignment or movement is detected.

When the mirror misalignment is detected, the control system determines the X and Y physical coordinates of the linked mirrors in step 735.

Based on the coordinates of the linked mirrors, the control system determines the pointing angles in step 736. In one example, the pointing angles are determined from a look-up table. Alternatively, the pointing angles are calculated.

Also, in step 738, the control system identifies the mirrors in the zone of uncertainty. This is done based on the target mirror location and the radius of the zone of uncertainty.

Then, in step 750, mirrors within the zone of uncertainty are selected. In step 934, the control system detects the perturbed location of the control beam. This is based on detecting the mirror misalignment in step 932, using the photodiodes in the zone of uncertainty, including the photodiodes associated with the target mirror.

Next, the velocity and acceleration vectors are calculated in step 748. The velocity vector is determined based on the change in position. Then, the acceleration vector is determined based on the change in velocity.

Block 758 contains the mirror dynamics model, which is based on the mirror mass and acceleration under only torsion spring forces.

Then, in step 756, the approximate mirror path, and hence the approximate beam path, and the beam end point are calculated. This is done based on mirror dynamics, the position of the target mirror, the position of the beam, the velocity of the beam, and the acceleration of the beam. The mirror dynamics comes from step 758.

In step 760, the approximate course correct to pass the control beam through the target at zero velocity is determined. This is done based on the approximate beam path from step 756, the physical coordinates of the linked mirrors from step 735, and information from gate 780. Gate 780 provides the information to calculate the approximate mirror beam path and end point from step 770 back to the start of the next cycle of the determine approximate course correction to step 760 to provide the previous view of the trajectory path so step 760 may derive the correction. The correction is the current view of the required trajectory minus the previous view. The signal from step 778 enables the gate to pass the data back. Disabling the gate stops the process. As an alternative a feed from step 782 may be used to stop the process.

Next, the approximate correction to the acceleration vector in the velocity vector and the acceleration vector is determined in step 762. This is done based on the approximate course correction from step 760.

Then, in step 764, the correction determine in step 762 is applied in step 764. The correction is applied as a change in the braking or forward drive levels.

In step 766, the beam location is again determined for the next time step.

Step 768 determines whether the beam is on the photodiodes associated with the target mirror. If the beam is not on the target photodiodes, the photodiodes in the zone of uncertainty are again selected in step 750. If the beam is located on the target photodiodes, the target mirror photodiodes are selected in step 770.

In step 768, the beam vector velocity and acceleration vectors are again determined.

Then, in step 770, the approximate mirror and beam path and the end points are calculated based on the position of the target mirror, the position of the control beam, the velocity of the control beam, the acceleration of the control beam, and the mirror dynamics. This path is placed in gate 780.

Next, in step 772, the control system determines whether the new calculated vector from step 770 intercepts with the target mirror. When the new vector does not intercept with the target mirror, the control system proceeds to step 778, repeats the process, and places the information in gate 780. If the new vector intercepts the target mirror, in step 774 the control system determines whether the beam is at the target mirror. If the beam is not at the target mirror, the control system repeats the process in step 778. If the beam is at the target mirror, the control system determines, in step 776, whether the beam is at zero velocity. If the beam is not at zero velocity, the process is repeated in step 778. If the beam is at zero velocity, the process ends in step 782.

Figure 34:
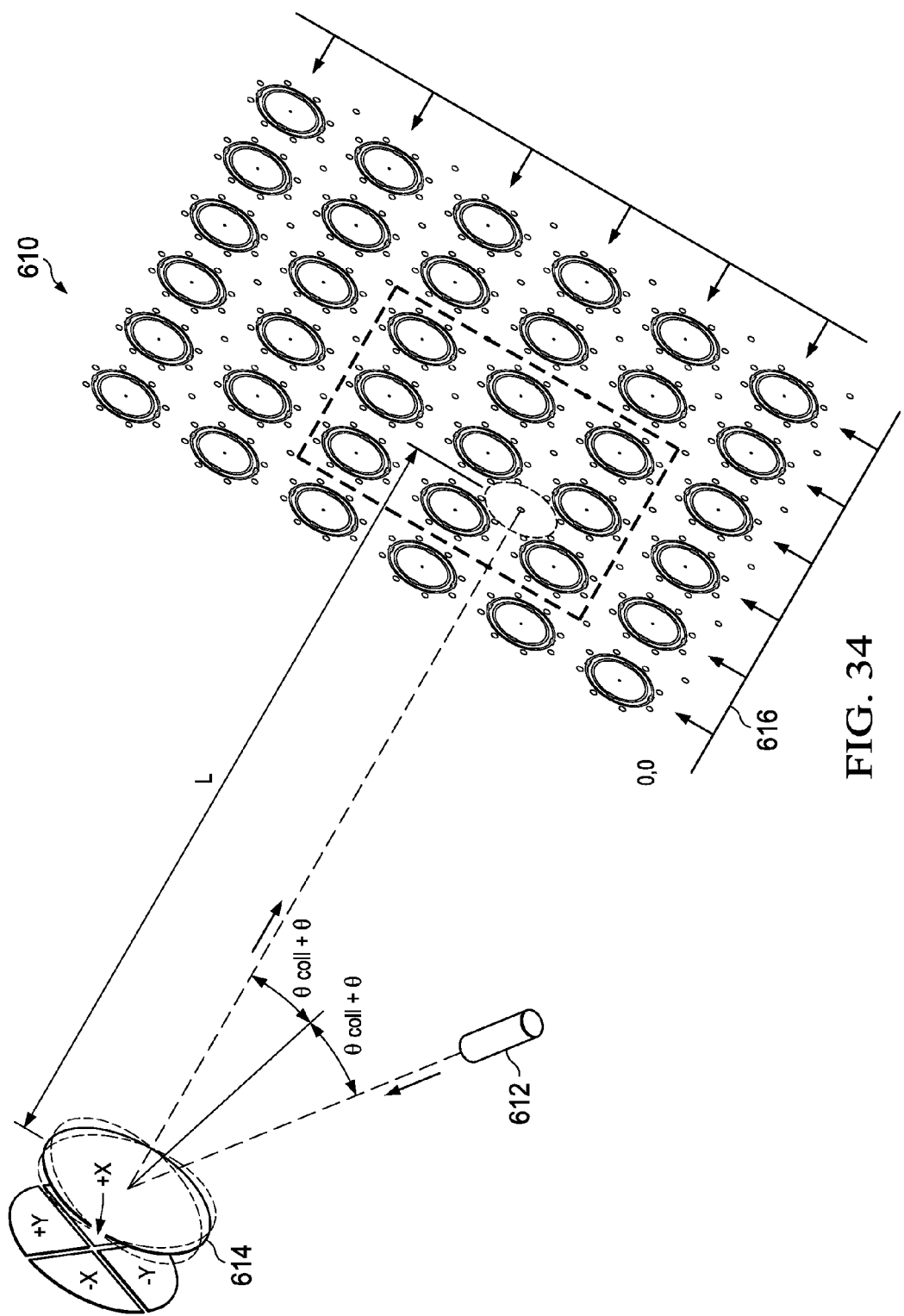
FIG. 34 illustrates an embodiment MEMS system.

FIG. 34 shows an example MEMS system, MEMS system 610, which contains collimator 612 which launches a control optical beam into MEMS system 610. The control optical beam is reflected off mirror 614 (one mirror in the first array) to second mirror array 616. Mirror array 616 contains integrated photodiodes. The angle of incidence of the incoming beam on the mirror is $\theta_{coll}+\theta$, where $\theta_{coll}$ is due to the collimator being offset from normal to the MEMS array surface to avoid blocking the inter-array optical path, and $\theta$ is the applied deflection angle of the MEMS mirror 614. Inter-array optical path length L is between mirror 614 and mirror array 616. The columns of mirrors in mirror array 616 have a pitch H, and the rows of mirrors have a pitch V. A beam spot moves across the surface of mirror array 616 as the angle of mirror 614 is adjusted. The angular movement of the mirror causes twice the angular movement of the beam. The mirror is deflected by electrostatic deflective forces operating against a gimbal spring arrangement, which provides torque resistance to the mirror being adjusted out-of-plane, which is nominally proportional to $\theta_x$, $\theta_y$, the components of $\theta$ in the x and y axis planes. The deviated mirror rest angle is determined by the point where the deflective electrostatic force is balanced by the restorative force of the torsion springs.

A detailed view of MEMS mirror structure 360 is illustrated by FIG. 23. Mirror 362 has a diameter D and area A. Mirror movement in the X and Y axes combine to provide movement in any direction. Four quadrant electrodes, electrodes 361, 363, 367, and 368 provide deflection in the −Y, +Y, −X, and +X directions, respectively, by applying a voltage to an appropriate electrode or electrodes.

The force applied to the mirror is a function of that voltage and the gap distance between the electrode and the mirror, as well as the shape and size of that electrode. If the four electrodes are driven with a common mode voltage, they may be treated as a single circular electrode. The force is given by:

$$F=((\epsilon_o*A*V^2)/(2*d^2))*(1+(2*d/D)),$$

where A is the area of the mirror, d is the mirror-electrode gap, D is the diameter of the mirror, V is the applied voltage to the electrode, and $\epsilon_o$ is the permittivity of free space.

However, this force acts through the center of the mirror, and, having no moment arm, applies no torque to the mirror. Instead, a force is applied to move the mirror towards the electrodes, which is resisted by the resistance of the torque springs to being deflected vertically. However, if only one electrode is activated, a force which approximates to one quarter of this:

$$F=((\epsilon_o*A*V^2)/(2*d^2))*(1+(2*d/D))/4.$$

This force equation is approximate, because the modifying edge relationship (2*d/D)/4 depends on the actual electrode shape.

At the point of no mirror deflection, i.e. the mirror and the electrode are parallel, the distance between the mirror and the electrode is the same over the entire electrode, and hence the value of V/d, the electric field, is independent of the position on the electrode. At this point, the force between the electrode and the mirror can be regarded as a single force, $F_o$, operating through the center-of-area of the electrode. This center-of-area of the electrode is not aligned with the mirror center, and is hence not aligned with the pivot axis of the torsion springs. Instead, the center-of-area is offset by a moment arm distance of $Rm_o$, the length of the moment arm for zero mirror deflection. This creates a torque on the mirror from the multiplication of the moment arm $Rm_o$ by the attractive force $F_o$ to yield a torque of $F_o*Rm_o$. This causes the mirror to start to rotate towards the electrode against the resistance of the torsion spring, which acts to provide a restorative force of $T*\theta$, where T is the restorative torque at 1° and θ is the deflection angle in degrees. This acts to slow the mirror such that after any ringing dies down, the mirror becomes stationary at a deflection angle where:

$$T*\theta=Rm_\theta*F_\theta.$$

Both $Rm_\theta$ and $F_\theta$ are functions of the electrode design as well as the angle.

Figure 35:
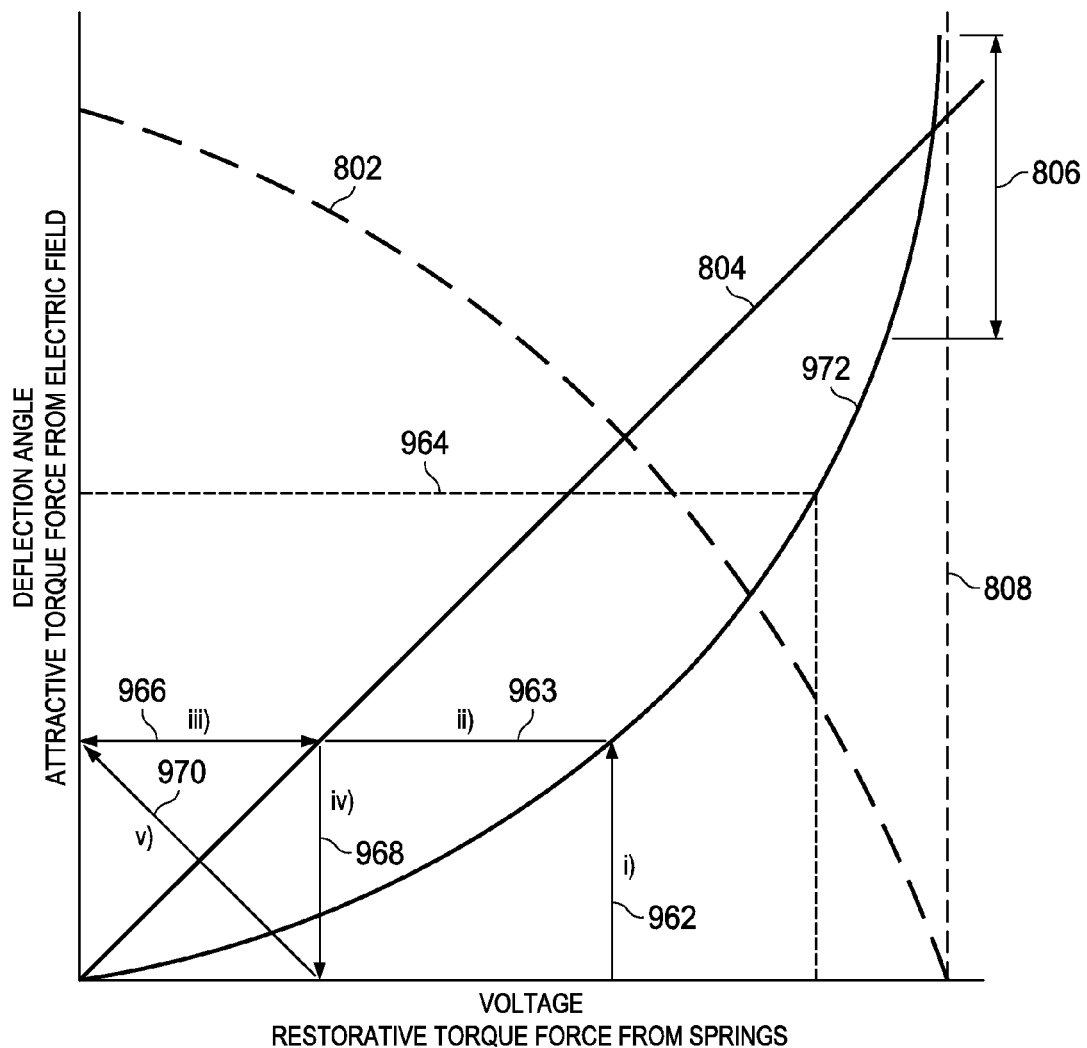
FIG. 35 illustrates a graphical representation of mirror deflection versus drive voltage and restorative torque forces.

As the mirror moves, it is no longer parallel to the electrode plane, and an inclined plate model may be used, where the gap between the mirror and the electrode is a function of the radial position of the gap from the center of the mirror. Because the voltage is constant across the electrode, the electric field across the gap between the electrode and the mirror is no longer constant. Instead, the electric field increases radially out from the center of the mirror, with a higher electric field exhibited along with a higher contribution to the overall force, from the parts of the electrode area further from the mirror center. The force on the mirror for a constant drive voltage increases, mainly due to a higher electric field near the edge of the mirror where the mirror-electrode gap is smaller due to the inclination of the mirror. Hence, $F_\theta$ for a given voltage is angle-dependent. Also, the center of force $F_\theta$, the apparent application point of the attractive force moves out from the increased force near the edge of the mirror, increasing the moment arm. Hence, $Rm_\theta$ becomes angle dependent FIG. 35 illustrates a voltage/static deflection characteristic for a gimbaled MEMS mirror device. The mirror deflection sensitivity increases with increasing deflection angle, and hence with increasing voltage due to the changes in $Rm_\theta$ and $F_\theta$ up to the point where the deflection sensitivity becomes infinite when the mirror control is lost from snap-down. FIG. 35 also shows the relationship between spring torque resistance and deflection angle, which is generally linear or close to linear. Because the restorative force due to spring torque grows linearly with angle, so does the net attractive force when the mirror is static at a given deflection angle, because at stasis these two forces are balanced. The nonlinearities in the voltage deflection curve are created by the changing mirror-electrode gap changing the electric field relationship to the applied voltage, thereby increasing the effect of incremental drive voltage as the deflection angle increases and the electrode gap decreases.

Curve 802 shows $\delta v/\delta \theta$ of the electrode drive (the incremental voltage required to produce an incremental unit of deflection), and curve 804 shows the torsion spring restorative torque force as a function of deflection angle, which is usually a non-linear relationship, and the relationship between the attractive electrode force and the restorative spring torque at a static angle, since under this condition, the two forces would be balanced. Also, curve 972 shows the mirror static deflection angle versus electrode voltage. This curve shows increasing deflection sensitivity with increasing angle of deflection until the deflection sensitivity becomes infinite. Line 808 shows where the deflection sensitivity becomes infinite, $\delta v/\delta \theta$ goes to zero, $\delta \theta/\delta v$ goes to infinity, and control is lost as snap down occurs. In region 806, there is a risk of snap-down. Boundary 964 is an example boundary of a usable zone.

When an electric field from a voltage V is applied between an electrode and the mirror, a deflection angle based on the non-linear curve 972 is produced. Arrow 962 projects the applied voltage V on to the non-linear curve of deflection angle versus applied voltage 972 and a horizontal arrow 963 projects the resultant deflection level on to the vertical axis, giving a static deflection angle once all the dynamics have been dealt with/died away. That deflection angle can be projected on to the deflection angle/restorative force relationship, shown as line 804, which may be linear or close to linear, via arrow 966 and that restorative force may be projected on to the horizontal axis via arrow 968 to give a measure of the restorative force, which is in balance with the attractive force of the deflection electrode(s) at voltage V. Since the restorative force and attractive force are balanced at stasis, the restorative force value can be transferred to the vertical axis as a measure of the attractive force from the electrode at the angle of deflection generated by voltage V.

Figure 36:
FIG. 36 illustrates a table of movement distance of a beam spot as a function of optical path length and mirror deflection angular change.

Once the MEMS mirror deflective characteristics are determined, the characteristics may be plugged into a control system. The drive voltages are used to deflect the mirror through an angle of θ by deflecting it by $\theta_x$ and $\theta_y$ in two orthogonal axes. This causes the beam to move through an angle of 2θ from where it would have been pointing with no mirror drive. This creates a beam spot movement distance on the opposing substrate of approximately L*tan(2θ). FIG. 36 illustrates table 1210 with some example mirror movements up to the maximum for mirrors with plus or minus six degree deflection capability at representative values of L with various arrays and mirror pitches.

Table 1210 shows the maximum deflection distance on the opposing MEMS array for six different inter-array optical path lengths, for mirror deflection angles between 1° and 6°. Whilst the peak-to-peak deviation is twice this distance, only half of that peak-to-peak is usable due to parallax between the various source mirrors across the MEMS array. MEMS mirrors at the edge of the array can only be deflected in one direction on one of their axes, while those in the corners of the array can only be deflected in one direction on both of their axes, because deflecting these mirrors in the opposite direction would cause them to miss the opposing array altogether.

The bottom part of 1210 provides a view of the maximum switch fabric sizes for various optical path lengths and for +/−6° deflection mirrors. The bolded numbers are those between 100 and 1,000.

FIG. 25 shows an example of a beam spot being projected via a deflected mirror onto a mirror array. Integrated photodiodes on the mirror array can detect the position of the beam, where multiple photodiodes provide their illumination levels to a measurement system, which determines the distance of each photodiode from the center of the beam based on their received optical power, enabling triangulation of the center of the beam spot, based on the known physical locations of the responsive photodiodes. The velocity of the beam spot is determined from the change in position of the beam spot over time, and the acceleration of the beam spot is determined from the change in velocity of the beam spot over time. Once the position, velocity, and acceleration of the beam spot are known, a forward trajectory can be plotted. However, such a trajectory exhibits increasing error with time and distance, for example due to measurement errors and tolerances or computational tolerances or approximations.

In one example, the trajectory is included in the calculation of the mirror dynamics. For example, the changes in acceleration with mirror angle due to spring back-pressure, and the change in that spring back-pressure or due to modulating the mirror-electrode gap, which changes the electrostatic forces, may be applied as a correction.

In another example, the trajectory is treated as a short term approximate projection which needs regular updating, for example every 5 to 100 µs. This repetitive corrective process can be used to modulate the electrode drive such that the trajectory is forced towards the target mirror. In the case of a constant percentage error below 100% error in the correction the trajectory calculation starts from a point closer to the target than the previous trajectory calculation, and over a period of time the trajectory iterates to reach the target.

In the example in FIG. 25, the objective is to bring beam spot 690 to rest centered on target mirror 702. With the current velocity without acceleration, the beam spot would continue along arrow 699 and would completely miss target mirror 702. With acceleration, the vertical velocity is decreased and the horizontal velocity is increased, significantly correcting the trajectory to make it pass closer to, but not coincident with, the target mirror. Hence, in the next measurement cycle, a further correction is computed, moving the trajectory closer to the target mirror. Because additional linear acceleration of the beam spot across the array corresponds to additional angular acceleration of the mirror and additional drive voltages on the electrodes creates additional acceleration, for small periods, changed acceleration requirements may be regarded as changed voltage drive requirements. This will create a projected new trajectory closer to reaching the target mirror. At the next time period for recalculation, the next set of position measurements are taken, and the velocity and acceleration is computed. Further adjustments may be made to continue correcting the trajectory, so the beam reaches the target mirror. This may be done separately on the two axes, because they are orthogonal.

For a given X axis or Y axis beam spot velocity and mirror angular velocity, there is a minimum stopping distance given by the maximum braking on the mirror's rotational velocity. This braking is a combination of the torsion spring torsion level and the braking achievable by driving the braking electrode. For braking with a velocity that increases the angle, the torsion spring braking and the braking forces of the opposing electrode are additive. However, for braking with a velocity that reduces the angle, the braking effect of the forward electrode is opposed by the torsion spring torsion, but the forward electrode has a lower gap and therefore can exert a greater force for any given electrode voltage.

Hence, there is a set distance, dependent on the beam velocity, where the beam should start a final rapid deceleration as it approaches the target mirror. The distance for the beam to stop is given by:

$$V_s^2 = V_i^2 + 2a_{max}D_s,$$

where $V_s$ is the stopping velocity, $V_i$ is the initial velocity, $a_{max}$ is the maximum beam acceleration, and $D_s$ is the stopping distance. When the stopping velocity is zero, the stopping distance is:

$$D_S = \frac{-V_i^2}{2a_{max}}.$$

The value of $a_{max}$ is determined by the value of the rate of rotational acceleration on the mirror, which is determined by the mirror inertia in the rotational axis, which is different for the X and Y axes, because the inertia of the gimbal ring contributed to one axis. If the inertia is expressed in terms of a torque to produce a one degree/s² of rotational acceleration is $I_R$, and the moment on the mirror from the torsion spring plus the electrode is given by:

$$Tq + F_b(\theta)Rm_b(\theta),$$

where the suffix b indicates the braking electrode is driven. Then, the maximum mirror rotational acceleration at angle θ is:

$$(Tq + F_b(\theta)Rm_b(\theta))/I_R.$$

This produces a maximum deceleration of the beam spot across the surface of the MEMS array of:

$$a_{max(array)} = L\left(2Tq + \frac{F_b(\theta)Rm_b(\theta)}{I_R}\right).$$

Hence, $$D_S = \frac{-V_i^2 L}{2}\left(2Tq + \frac{F_b(\theta)Rm_b(\theta)}{I_R}\right).$$

Figure 37:
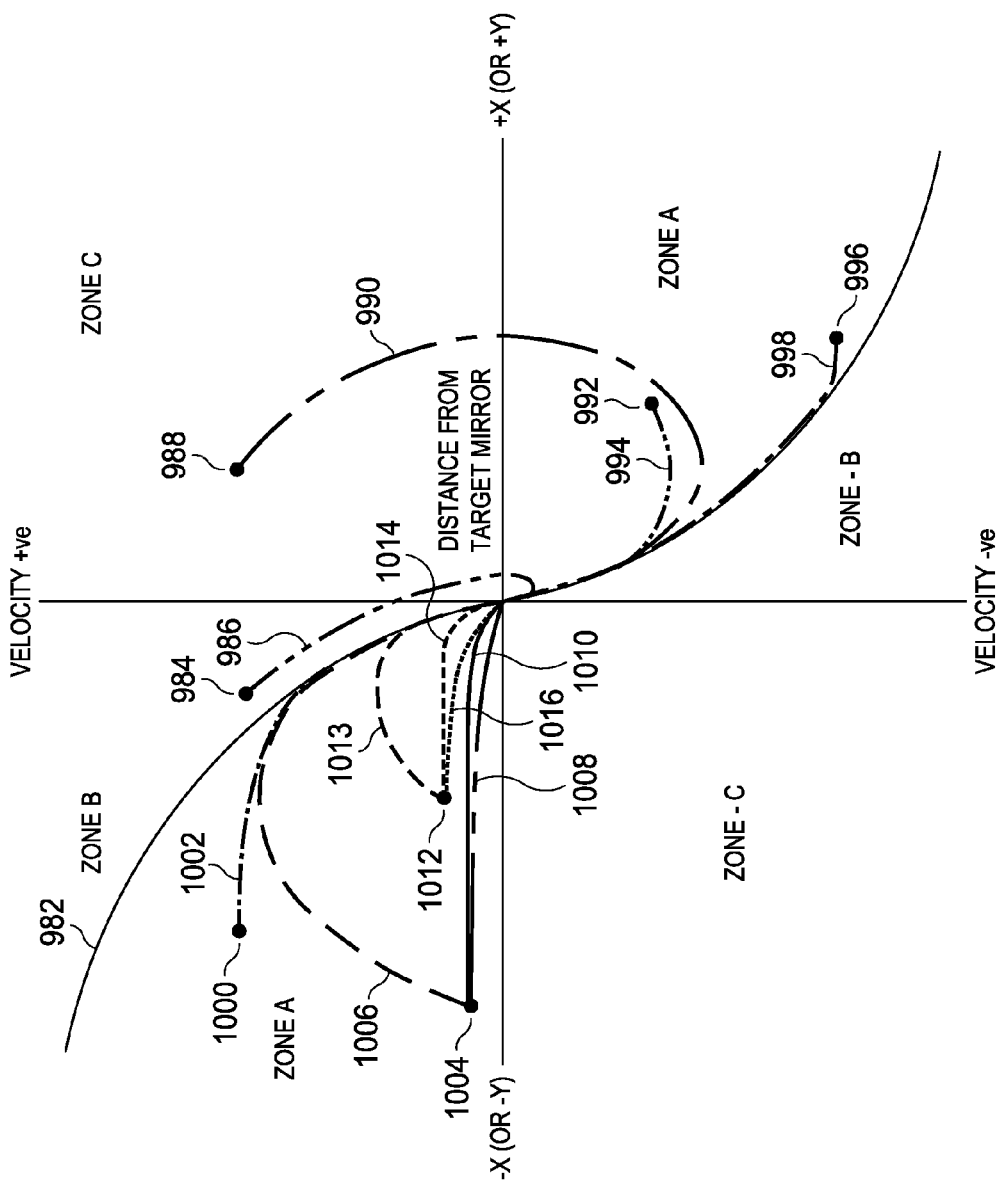
FIG. 37 illustrates a maximum deceleration curve and example beam spot positions and velocities.

FIG. 37 illustrates the dynamics of the beam velocity versus distance to target for a beam approaching the mirror, in the form of the resultant maximum allowable residual beam spot velocity versus distance to the target mirror.

Curve 982 shows the maximum permitted velocity as a function of distance to the target for the maximum rate of deceleration to reach zero velocity at zero distance to the target. In zone A below curve 982 for a negative positional displacement starting point and in zone −A above curve 982 for a positive positional displacement starting point, a beam spot can be decelerated at the maximum rate on a path towards the target so that it simultaneously will stop and reach the target without requiring accelerations in excess of the maximum. For example, a beam spot initially illuminated at location 1000 within the zone of uncertainty and travelling at a vector into the zone of uncertainty can be brought to the target along curve 1002, a beam spot initially illuminated at location 1004 can be brought to the target along curve 1006, curve 1008, or curve 1010, a beam spot initially illuminated at location 1012 can be brought to the target along curve 1013, curve 1014, or curve 1016 depending upon its velocity vector at illumination, a beam spot initially illuminated at location 992 can be brought to the target along curve 994, and a beam spot initially illuminated at location 996 can be brought to the target along curve 998. These beam spots can be decelerated at rates below the maximum deceleration, for example using curves 1008, 1100, 1014, and 1016. Alternatively, they can be accelerated towards the target mirror until they approach the maximum velocity/distance threshold and are decelerated at the maximum acceleration, such as along curve 1006 and curve 1013. This produces the fastest set up, because the distance gap to the target is closed more rapidly.

On the other hand, in zone B above curve 982 for a negative displacement starting location and in Zone −B below curve 982 for a positive displacement starting location, a beam spot is moving towards the target, but has insufficient distance to stop before reaching the target at the maximum deceleration level, so it will overshoot the target before returning to it in the opposite direction. Beam spot 984 is brought to the target along curve 986. The beam spot cannot be brought to rest at the target without some level of overshoot, because the remaining braking distance is inadequate. Instead, the best this beam spot can do is to maximally decelerate following the maximum achievable deceleration curve offset by its distance shortfall until it comes to rest at a point beyond the target mirror by a distance equal to the distance shortfall at its starting point. Then, once the beam spot has come to rest, it will be accelerated to a reverse velocity to return to the target mirror from the opposite side, decelerating within the maximum deceleration line from the opposite direction.

In the two zones, zone C and zone −C, a beam spot has already overshot the target location at its initial illumination point and is moving away from it. This is an error condition which may arise, for example, from too large an error in the initial calculations or the zone of uncertainty being too small. It is desirable for this condition to be covered and recovery demonstrated. The velocity of the beam spot at illumination must be reversed before the beam spot can close on the target. A beam spot initially illuminated at 988 is brought to the target along curve 990. The initial beam spot has already overshot the target mirror, and has a velocity taking it further away from the mirror. This mirror is brought to a halt, at which point the beam spot is even further away from the target. Then a reverse trajectory can be applied to return the beam to the target mirror. The last part of this trajectory is managed by keeping the beam spot dynamics within the maximum acceleration/deceleration to ensure that it becomes stationary at the target mirror.

Figure 38:
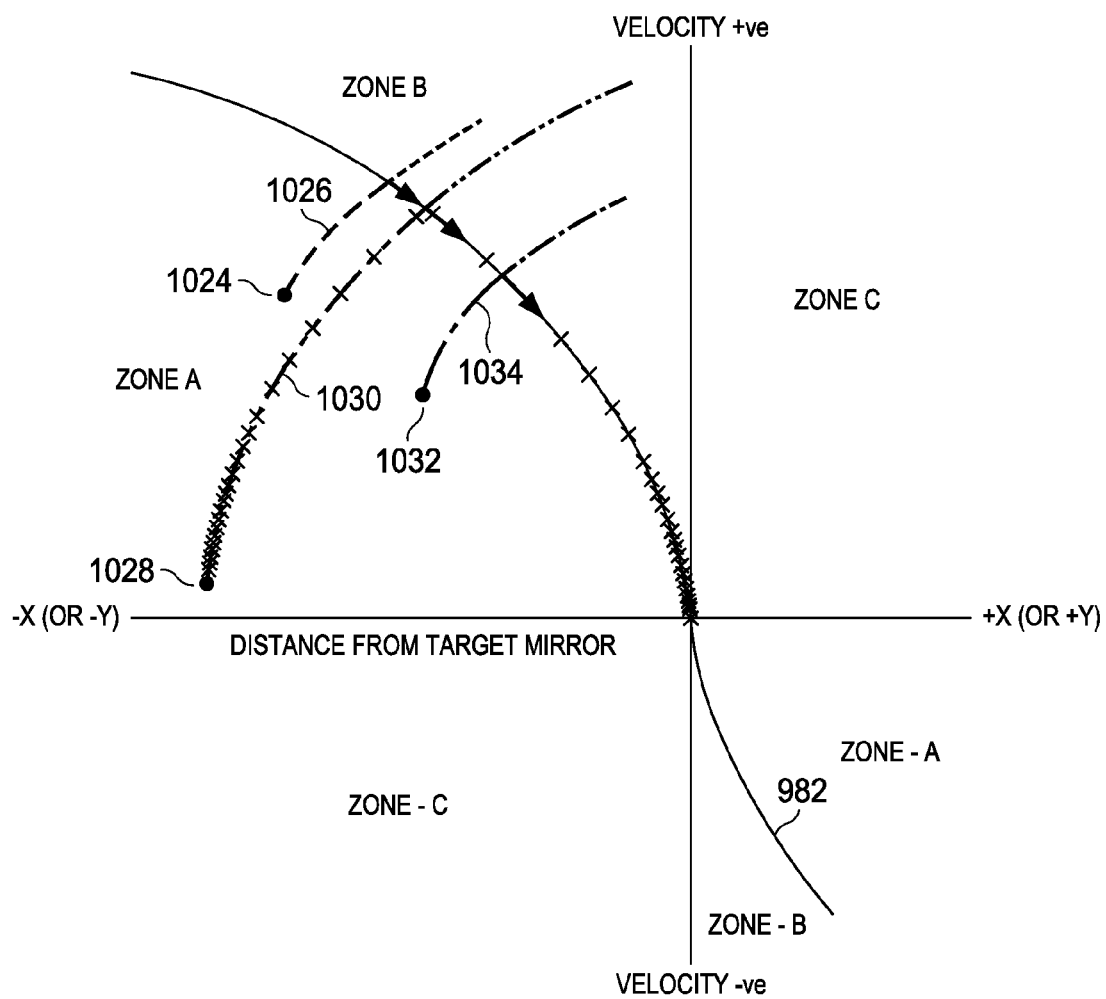
FIG. 38 illustrates trajectories for beam convergence to a target mirror.

From any position and velocity below curve 982 in zone A and above curve 982 in zone −A, the fastest convergence to zero displacement and zero velocity from the current beam spot position or velocity occurs if the beam is maximally accelerated towards the target until the beam spot reaches the boundary curve of maximum velocity, and then follows this curve, invoking the maximum deceleration, in a controlled deceleration to the target. This process is illustrated by FIG. 38.

The beam spot, initially illuminated and velocity/position-detected in zone A below curve 982, away from the threshold of maximum deceleration 982 is accelerated towards the target until the measurements indicate that it is about to cross the threshold of maximum deceleration, 982. A beam spot, initially illuminated at 1024 travels along curve 1026, a beam spot, initially illuminated at 1028, travels along curve 1030, and a beam spot, initially illuminated at 1032, travels along curve 1034. Then, once each of the beam spots is detected to be approaching the threshold of maximum deceleration 982, the electrode drive for maximum deceleration is applied and the beam spots travel along curve 982 with maximum deceleration. Some margin may be built in to the maximum deceleration profile to cover device-to-device variations to avoid overshoot. However, a small amount of overshoot may be automatically corrected if it were to occur, and would not add much time to the setup time.

The size of the zone of uncertainty is derived from the parameters and tolerances in those parameters for the dynamics of the MEMS mirrors. The zone of uncertainty is determined by a range of possible mirror locations due to those parametric variations and calculation approximations at the time of the initial illumination of the beam at a calculated time after the application of the initial blind acceleration and deceleration drives. At that time, the beam spot should be within the zone of uncertainty, moving towards the target mirror with a velocity slow enough that it will not overshoot the target mirror.

Figure 39:
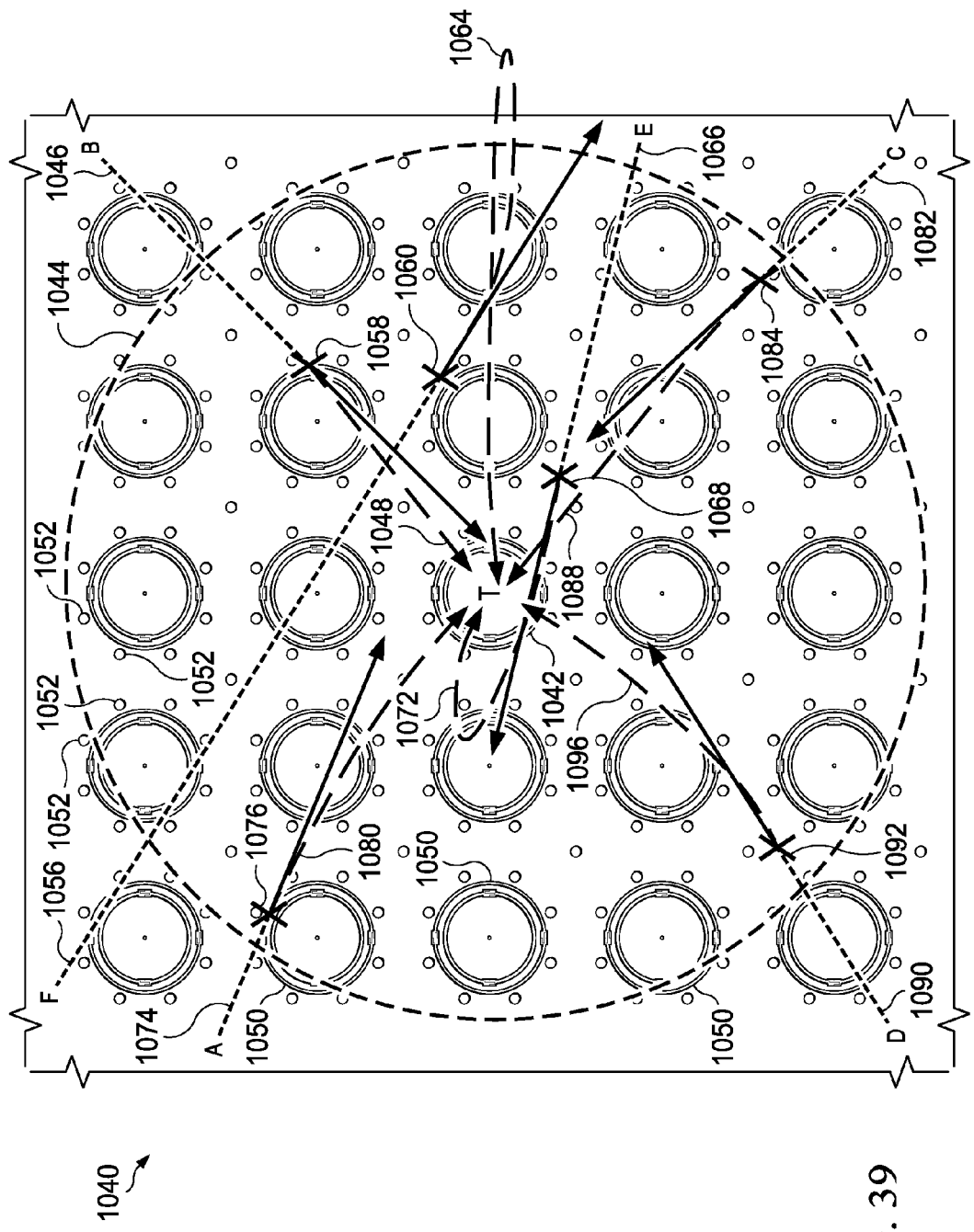
FIG. 39 illustrates examples of beam spot movement in a zone of uncertainty.

FIG. 39 illustrates multiple alternative virtual (unilluminated), real (illuminated), and corrected (illuminated and trajectory-controlled) paths for several different examples of initial beam spot illumination locations and velocity vectors at initial illumination. Mirror array 1040 contains mirrors 1050 and photodiodes 1052. Target mirror 1042 has zone of uncertainty 1044 around it. Beam A proceeds along virtual trajectory 1074, and is illuminated at point 1076, where it is converted from a virtual beam to an illuminated beam that proceeds along curve 1080 under active control. The associated solid line arrow shows where the trajectory would have taken the beam spot without that correction. The beam becomes real-time controlled by the photodiodes and may be accelerated towards target mirror 1042 until it reaches the threshold for deceleration. The beam decelerates to reach the target. In a similar manner, beam B proceeds along virtual trajectory 1046 and is illuminated at point 1058 and proceeds along curve 1048 under active control to rest at target mirror 1042. Also, beam C proceeds along virtual trajectory 1082, is illuminated at point 1084, and proceeds along curve 1088 under active control until it rests at target mirror 1042. Additionally, beam D proceeds along virtual trajectory 1090, is illuminated at point 1092, and proceeds along curve 1096 under active control until it rests at target mirror 1042. Beam E proceeds along virtual trajectory 1066, and is illuminated at point 1068 close to target mirror 1042. In curve 1072, it overshoots the target mirror, because it is already within the zone where it should be maximally decelerating, and has excess velocity, causing overshoot. This beam decelerates at a maximum rate, overshooting somewhat, and reverses direction to return to the target mirror under active control. This overshoot is less than the braking distance, because it starts decelerating before passing the target mirror, and does not impact the size of the zone of uncertainty.

Beam F, along virtual trajectory 1056, has already overshot target mirror 1042 when it is illuminated at point 1060 to proceed along path 1064 under active control. Beam F has already overshot the target mirror by the time it is illuminated. It has to brake to a standstill before reversing course and traveling a significant distance back to the target mirror. Depending on the size of the overshoot at the point of illumination and the initial velocity at illumination, the illuminated beam may transgress the boundaries of the zone of uncertainty, so the tolerances of the mirror calculation and mirror parameters, along with the zone of uncertainty sizing should be such that the beam illuminations outside the zone of uncertainty does not happen. The spread of the mirror dynamic characteristics may be calculated or measured, and the zone of uncertainty set to be large enough that the initial beam can be illuminated early enough that this situation is avoided.

Figure 40:
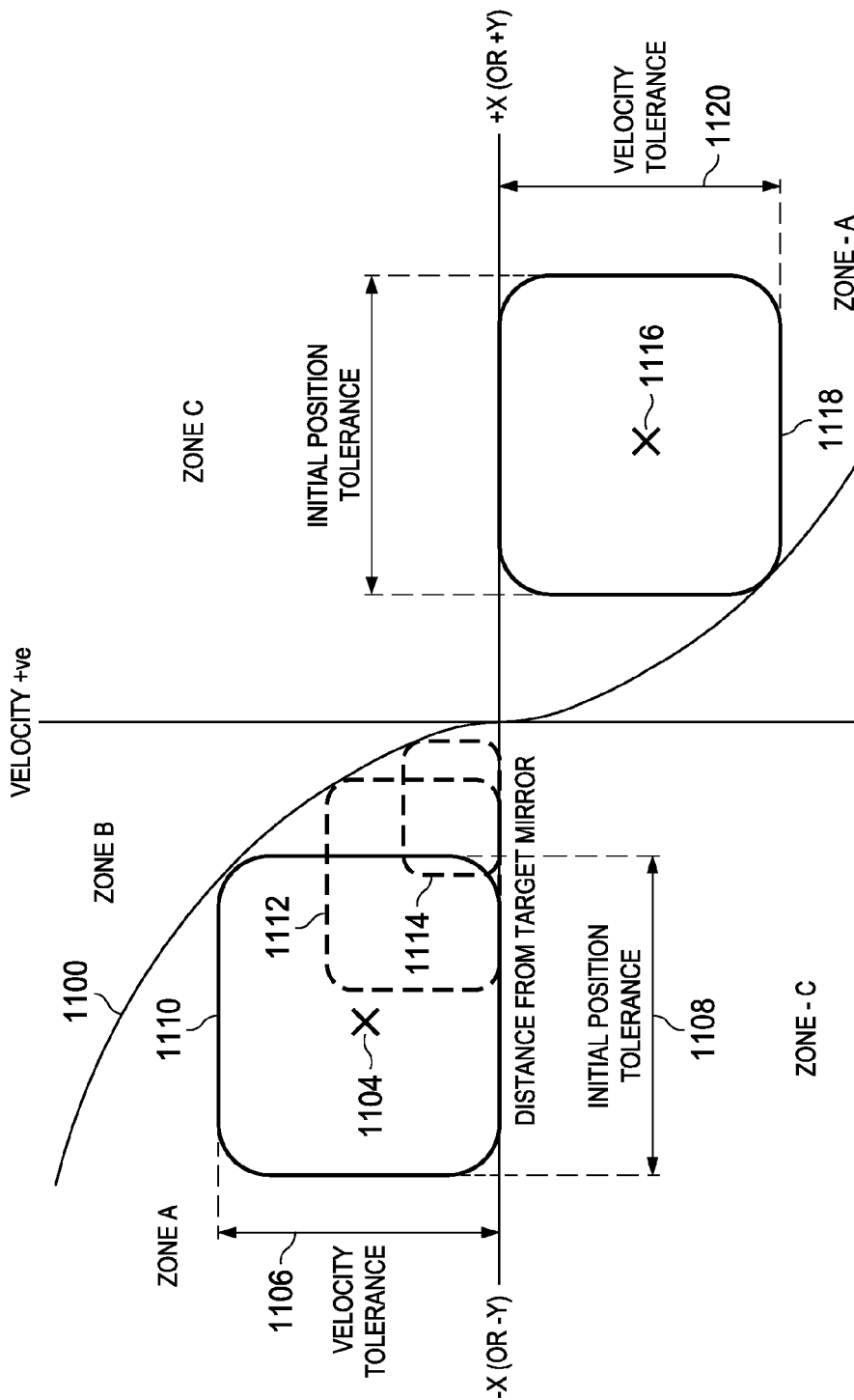
FIG. 40 illustrates a representation of positional and velocity tolerances for beam illumination.

FIG. 40 illustrates the effects of positional and velocity tolerances generating a zone of uncertainty on the dimension of that zone of uncertainty. Curve 1100 shows the maximum permitted velocity as a function of distance to the target to allow the maximum deceleration rate to take the beam to zero velocity at the target. Nominal target point 1104 is the nominal target point for an initial illumination for the beam spot. However, tolerance in initial position 1108 and velocity tolerance 1106 sweep out area 1110 of velocity and distance uncertainty so, for the device and calculation tolerances, an area is determined where the beam should initially be illuminated. In the opposite quadrant is area 1118 with velocity tolerance 1120 and initial position tolerance 2223, and nominal point 1116. With tighter design tolerances and more precise calculations, a closer approach to the maximum deceleration curve before initial illumination and smaller zones of uncertainty are pictured with areas 1112 and 1114.

Figure 41:
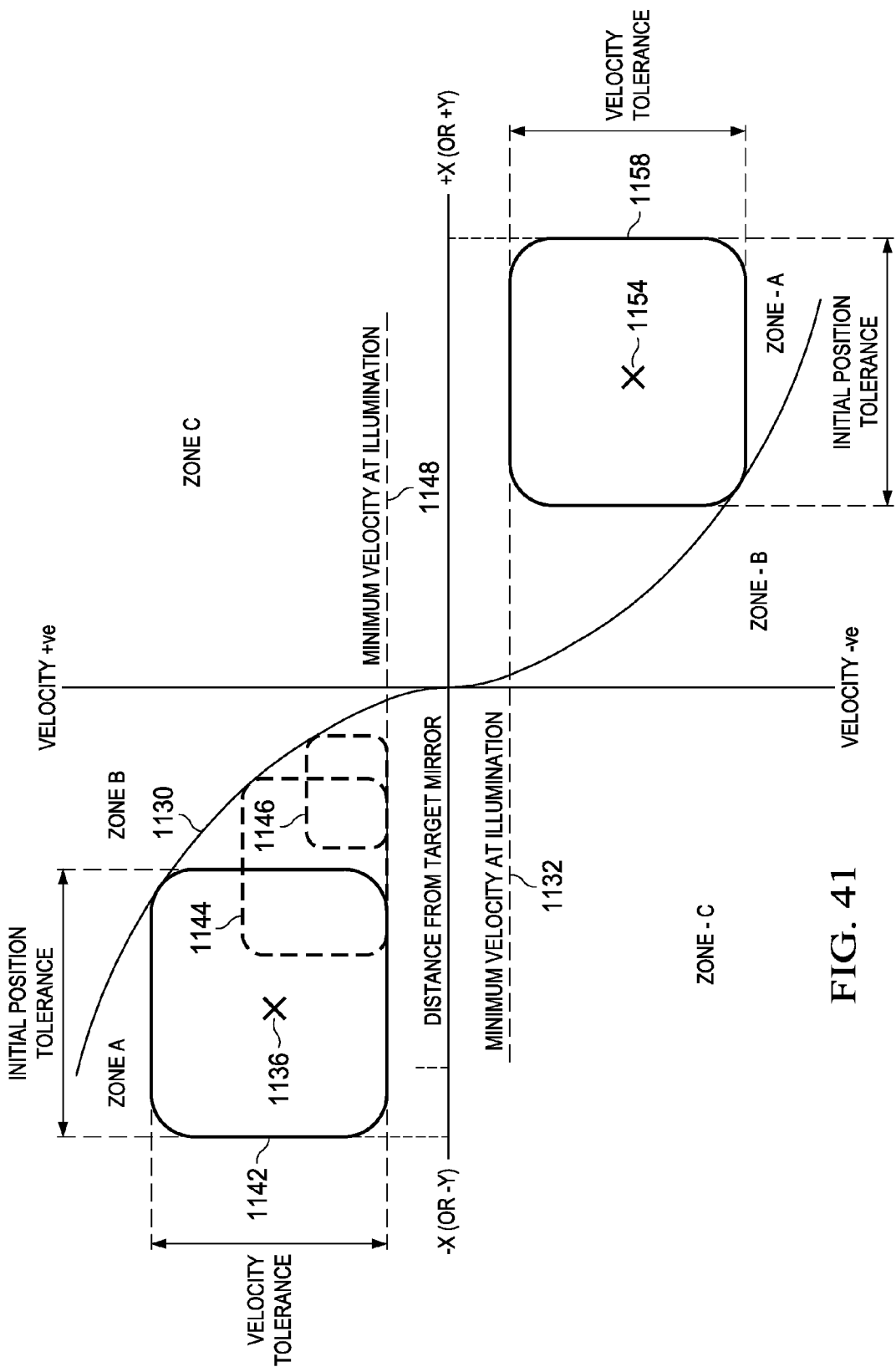
FIG. 41 illustrates another representation of positional and velocity tolerances for beam illumination.

FIG. 41 illustrates the effects of positional tolerance and velocity tolerance generating a zone of uncertainty on the dimensions of hat zone of uncertainty with no allowed overshoot of the beam trajectory and a defined minimum velocity at the moment of illumination. Curve 1130 shows the maximum permitted velocity as a function of distance to the target for maximum deceleration to zero velocity at the target, and curves 1148 and 1132 show the minimum velocity at the illumination point. Nominal target point 1136 is in area 1142 and nominal target point 1154 is in area 1158. Areas 1146 and 1144 indicate tighter design tolerances with more precise calculations, enabling a close approach to the maximum deceleration curve before initial illumination and smaller zones of uncertainty. While the beam spots of FIG. 41 have further to travel than the beam spots in FIG. 40, they retain a significant residual minimum forward velocity at the point of illumination, and hence may converge on the target more rapidly, especially if the setting of the minimum retained velocity permits illumination of the beam earlier in the braking cycle. However, the zone of uncertainty is somewhat increased.

Figure 42:
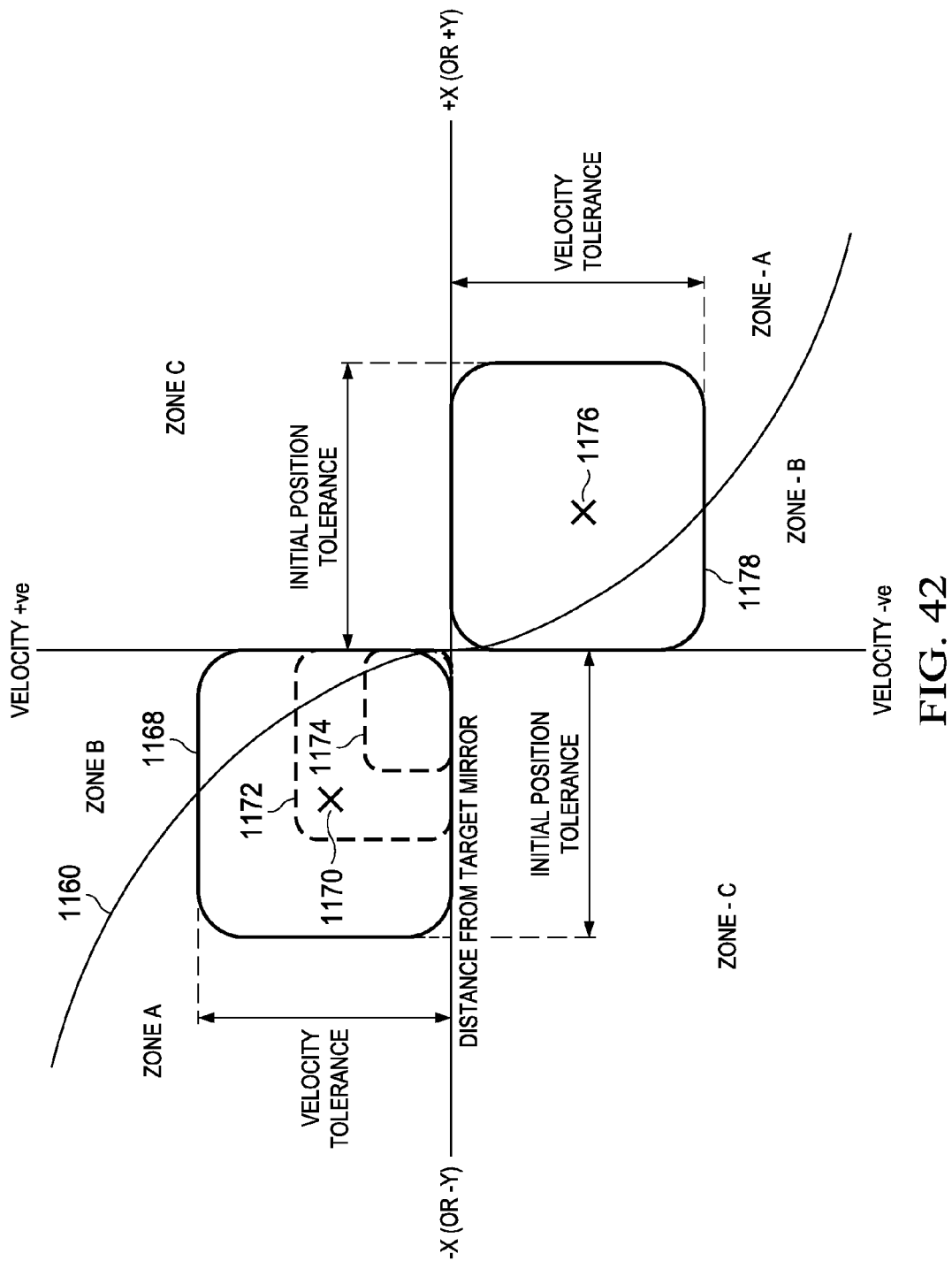
FIG. 42 illustrates an additional representation of positional and velocity tolerances for beam illumination.

FIG. 42 illustrates the effects of positional tolerance and velocity tolerance with overshoot of the beam trajectory but no transgressions out of the zone of uncertainty. Curve 1160 shows the maximum permitted velocity as a function of distance to target to allow maximum rate deceleration to achieve a zero velocity at the target. Nominal target points 1170 and 1176 are centered with no tolerances in landing position and velocity. There are areas 1168 and 1178, and tighter areas 1172 and 1174. The initial illumination may occur closer to the target. However, the distance to the target mirror, while always positive, may be relatively small, and not enough to avoid an overshoot.

The approaches shown in FIGS. 40, 41, and 42 result in the zone of uncertainty around a target mirror being dependent on whether the beam approaches from a negative (−X, −Y) direction or a positive (+X, +Y), direction resulting in four different zones of uncertainty per target mirror (+X and +Y, +X and −Y, −X and +Y, −X and −Y). Alternatively the zone of uncertainty may be a combination of these. In the example illustrated in FIG. 42, this would double the linear dimension of the zone of uncertainty, creating an area four times as large but somewhat simplifying some of the control.

Figure 43:
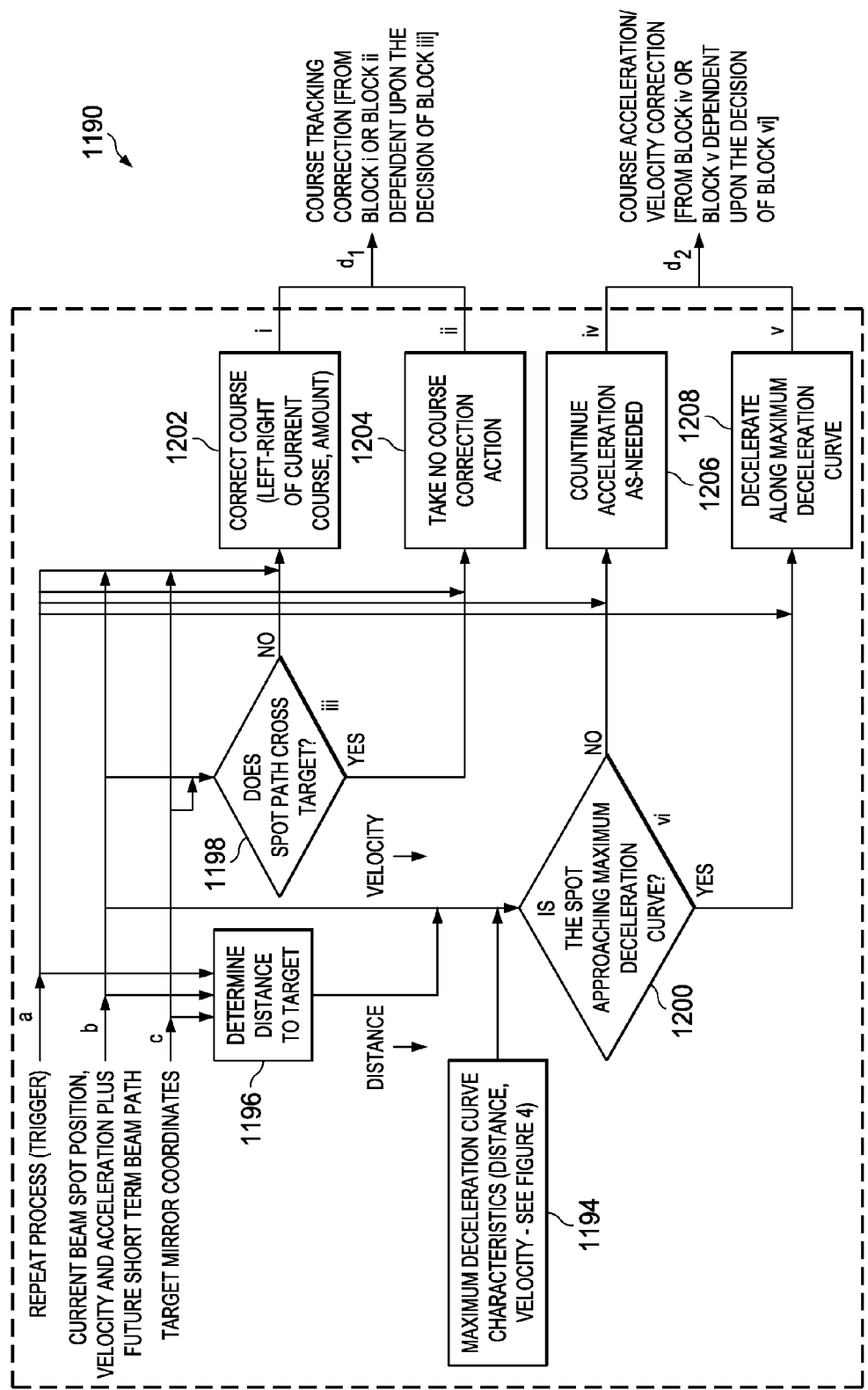
FIG. 43 illustrates a flowchart for an embodiment method of beam course correction.

FIG. 43 illustrates flowchart 1190 with an example of a method of performing course correction. In step 1198, it is determined whether the projected spot path crosses the target. This is based on the current beam spot position, velocity, and acceleration, the future short term beam path, and the target mirror coordinates. If the spot path crosses the target, no course correction action is taken in step 1204. If the spot path does not cross the target, the corrected course is determined in step 1202.

Also, in step 1196, the distance to the target is determined based on the target mirror position and the current beam spot position. Then, in step 1200, it is determined whether the beam spot is approaching the deceleration curve. This is based on the maximum deceleration curve characteristics from block 1194. If the spot approaches the maximum deceleration curve, the deceleration along the maximum deceleration curve is performed in step 1208. If the spot is not approaching the maximum deceleration curve, the spot continues acceleration is needed in step 1206.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A method of controlling a micro-electro-mechanical-system (MEMS) photonic switch, the method comprising:
   applying a voltage to a deflection electrode of an initial mirror of a first mirror array of the MEMS photonic switch;
   illuminating a control beam;
   reflecting the control beam off the initial mirror to form a control beam spot on a second mirror array of the MEMS photonic switch;

detecting an initial location of the control beam spot on the second mirror array to produce an initial optical response; and adjusting the voltage to the deflection electrode of the initial mirror of the first mirror array in accordance with the initial optical response while the control beam spot has a nonzero velocity.

2. The method of claim 1, wherein adjusting the voltage comprises modifying a duration over which the voltage is applied.

3. The method of claim 1, further comprising:
applying an acceleration voltage to an acceleration electrode of the initial mirror; and
removing the acceleration voltage from the acceleration electrode, wherein the voltage is a deceleration voltage, wherein the deflection electrode is a deceleration electrode, and wherein the deceleration voltage offsets a velocity of the initial mirror caused by the acceleration voltage.

4. The method of claim 3, further comprising:
receiving an input switch connection request indicating a location of the initial mirror and a location of a target mirror on the second mirror array;
determining an initial acceleration voltage, an initial acceleration duration, and an initial deceleration voltage in accordance with the location of the initial mirror and the location of the target mirror; and
applying the initial acceleration voltage to the acceleration electrode of the initial mirror for the initial acceleration duration.

5. The method of claim 4, wherein applying the initial acceleration voltage to the acceleration electrode of the initial mirror for the initial acceleration duration adds a first amount of energy to the initial mirror, wherein applying the deceleration voltage to the deceleration electrode of the initial mirror for a deceleration period of time removes a second amount of energy from the initial mirror, and wherein the first amount of energy is greater than the second amount of energy.

6. The method of claim 5, wherein a difference between the first amount of energy and the second amount of energy is greater than or equal to an amount of energy stored in a plurality of gimbal springs of the initial mirror at a destination deflection angle.

7. The method of claim 4, wherein applying the initial acceleration voltage to the acceleration electrode of the initial mirror for the initial acceleration duration adds a first amount of kinetic energy to the initial mirror, wherein applying the deceleration voltage to the deceleration electrode of the initial mirror for a deceleration period of time removes a second amount of kinetic energy from the initial mirror, and wherein the first amount of kinetic energy is approximately equal to the second amount of kinetic energy.

8. The method of claim 7, wherein a difference between the first amount of kinetic energy and the second amount of kinetic energy is greater than or equal to an amount of potential energy stored in a plurality of gimbal springs of the initial mirror at a desired deflection angle.

9. The method of claim 1, wherein the voltage is an acceleration voltage, and wherein the deflection electrode is an acceleration electrode.

10. The method of claim 1, wherein detecting the initial location of the control beam spot comprises detecting whether a group of photodiodes associated with a target mirror on the second mirror array are unevenly illuminated.

11. The method of claim 10, further comprising determining a center of the control beam spot in accordance with responses of photodiodes of the group of photodiodes.

12. The method of claim 1, further comprising arriving at a center of a target mirror on the second mirror array by the control beam, wherein the control beam has a velocity of zero when arriving at the center of the target mirror.

13. The method of claim 1, further comprising detecting effects of a vibration on the MEMS photonic switch comprising:
detecting a displacement of the control beam spot; and
adjusting the initial mirror in accordance with the displacement of the control beam spot.

14. The method of claim 13, wherein detecting a displacement of the control beam comprises detecting a change in a plurality of responses of a plurality of photodiodes associated with a target mirror, wherein the method further comprises determining a displacement distance vector the control beam spot and a velocity of the control beam spot.

15. The method of claim 14, further comprising generating a correction to the control beam spot in accordance with the displacement distance vector and the velocity of the control beam spot.

16. The method of claim 1, further comprising:
selecting a group of mirrors inside a zone of uncertainty of a target mirror on the second mirror array;
locking a plurality of mirrors on the first mirror array, wherein the plurality of mirrors are associated with mirrors of the group of mirrors; and
receiving a plurality of responses from a plurality of photodiodes inside the zone of uncertainty.

17. The method of claim 1, further comprising:
selecting a group of mirrors inside a zone of uncertainty of a target mirror on the second mirror array; and
receiving a plurality of responses from a plurality of photodiodes inside the zone of uncertainty during a first measurement cycle after illuminating the control beam.

18. The method of claim 1, wherein detecting the initial location of the control beam spot comprises:
receiving a plurality of signals from a plurality of photodiodes on the second mirror array; and
determining the initial location of the control beam spot in accordance with the plurality of signals.

19. The method of claim 1, further comprising:
detecting an adjusted location of the control beam spot on the second mirror array;
determining an adjusted beam path in accordance with the adjusted location of the control beam spot;
determining whether the adjusted beam path intercepts a location of a target mirror on the second mirror array;
determining whether the adjusted location of the control beam spot is at the location of the target mirror when the adjusted beam path intercepts the location of the target mirror;
determining whether a velocity of the control beam spot is zero when the adjusted location of the control beam spot is at the location of the target mirror; and
determining a second corrected deceleration voltage when the adjusted beam path does not intercept the location of the target mirror, the adjusted location of the control beam spot is not at the location of the target mirror, or the velocity of the adjusted location of the control beam spot is non-zero.

20. The method of claim 1, further comprising:
determining that the control beam spot is illuminating a group of target photodiodes associated with a target mirror on the second mirror array; and unlocking a group of remote mirrors when the control beam spot is illuminating the target photodiodes.

21. The method of claim 1, wherein illuminating the control beam comprises illuminating the control beam when the control beam spot enters a zone of uncertainty of a target mirror on the second mirror array.

22. The method of claim 1, further comprising:
   detecting a subsequent location of the control beam spot;
   determining an initial velocity of the control beam spot in accordance with the initial location of the control beam spot and the subsequent location of the control beam spot;
   detecting another subsequent location of the control beam spot;
   determining another subsequent velocity of the control beam spot in accordance with the subsequent location of the control beam spot and the another subsequent location of the control beam spot; and
   determining an acceleration of the control beam spot in accordance with the initial velocity of the control beam spot and the another subsequent velocity of the control beam spot, wherein adjusting the voltage comprises setting a voltage applied to the initial mirror in accordance with the another subsequent location of the control beam, the another subsequent velocity of the control beam spot, and the acceleration of the control beam spot.

23. The method of claim 22, further comprising determining a projected beam path in accordance with the another subsequent location of the control beam, the another subsequent velocity of the control beam, the acceleration of the control beam spot, and a location of a target mirror on the second mirror array.

24. The method of claim 23, further comprising determining a correction to the projected beam path, wherein adjusting the voltage applied to the initial mirror comprising adjusting the voltage applied to the initial mirror in accordance with the correction to the projected beam path.

25. The method of claim 22, wherein adjusting the voltage applied to the initial mirror further comprises setting a velocity of the control beam spot below a maximum rate of deceleration to reach zero velocity at zero distance to a target mirror on the second mirror array.

26. The method of claim 22, wherein setting a voltage applied to the initial mirror causes the initial mirror to acceleration orthogonally to the another subsequent velocity of the control beam.

27. A method of controlling a micro-electro-mechanical-system (MEMS) photonic switch comprising a mirror array including a mirror, the method comprising:
   applying an acceleration voltage to an acceleration electrode of the mirror, the acceleration electrode acting on a first edge of the mirror to accelerate the mirror;
   removing the acceleration voltage; and
   after removing the acceleration voltage, applying a deceleration voltage to a deceleration electrode of the mirror, the deceleration electrode acting on a second edge of the mirror opposite the first edge to decelerate the mirror.

28. The method of claim 27, wherein applying the acceleration voltage to the acceleration electrode of the mirror adds a first amount of kinetic energy to the mirror, wherein applying the deceleration voltage to the deceleration electrode of the mirror removes a second amount of kinetic energy from the mirror, and wherein the first amount of kinetic energy is approximately equal to the second amount of kinetic energy.

29. The method of claim 28, wherein a difference between the first amount of kinetic energy and the second amount of kinetic energy is greater than or equal to an amount of potential energy stored in a plurality of gimbal springs of the mirror at a desired deflection angle.

* * * * *